United States Patent [19]
Kasuga

[11] Patent Number: 5,933,212
[45] Date of Patent: Aug. 3, 1999

[54] DELINEATING METHOD EMPLOYING ELECTRON RAY BEAM

[75] Inventor: Takashi Kasuga, Kanagawa, Japan

[73] Assignee: Sony Corporation, Tokyo, Japan

[21] Appl. No.: 08/913,451

[22] PCT Filed: Dec. 27, 1996

[86] PCT No.: PCT/JP96/03893

§ 371 Date: Aug. 27, 1997

§ 102(e) Date: Aug. 27, 1997

[87] PCT Pub. No.: WO97/24751

PCT Pub. Date: Jul. 10, 1997

[30] Foreign Application Priority Data

Dec. 28, 1995 [JP] Japan ................................ 7/353266

[51] Int. Cl.$^6$ .............................. G03B 27/72; A61N 5/00
[52] U.S. Cl. ............................................ 355/20; 250/492.2
[58] Field of Search .............................. 355/20, 67, 77; 250/492.22, 492.23, 492.2, 398; 364/490, 491; 430/30; 358/475, 485; 578/34, 35

[56] References Cited

U.S. PATENT DOCUMENTS

| | | | |
|---|---|---|---|
| 5,008,553 | 4/1991 | Abe | 250/492.2 |
| 5,210,696 | 5/1993 | Yano | 364/488 |
| 5,241,185 | 8/1993 | Meiri et al. | 250/492.2 |
| 5,278,419 | 1/1994 | Takahashi et al. | 250/492.2 |
| 5,424,173 | 6/1995 | Wakabayashi et al. | 430/296 |
| 5,563,419 | 10/1996 | Tamura | 250/492.22 |
| 5,644,138 | 7/1997 | Hamaguchi | 250/492.22 |

FOREIGN PATENT DOCUMENTS

| | | |
|---|---|---|
| 5-160010 | 6/1983 | Japan . |
| 63-150919 | 6/1988 | Japan . |
| 6-61127 | 3/1994 | Japan . |
| 8-227842 | 9/1996 | Japan . |

*Primary Examiner*—Safet Metjahic
*Assistant Examiner*—Hung Henry Nguyen
*Attorney, Agent, or Firm*—Hill & Simpson

[57] ABSTRACT

A proximity effect correction method used in a delineation method employing an electron ray beam, in which the electron ray beam is illuminated on an electron ray sensitive resist material for delineating a pattern on the resist material. The method consists in dividing the pattern for delineation into pre-set unitary domains, and correcting the exposure light volume of an electron ray beam illuminated on each unitary domain in consideration of the accumulated energy ascribable to backward scattering of electrons. The proximity effect correction method includes the steps of bit-map-developing each unitary domain and calculating a pattern areal density in each unitary domain, averaging the pattern areal density in each unitary domain for calculating the averaged pattern area density, calculating the gradient vector of the averaged pattern areal density, and extracting a unitary domain where the magnitude of the calculated gradient vector is more than a pre-set value for identifying the unitary domain exhibiting a high correction error in the proximity effect correction.

7 Claims, 39 Drawing Sheets

RADIUS OF REAR SCATTERING βb (μm)

ORIGINAL FIGURE

REPRESENTATIVE FIGURE

DELINEATING METHOD EMPLOYING ELECTRON RAY BEAM

TECHNICAL FIELD

This invention relates to a delineating method for illuminating an electron ray beam on an electron ray sensitive resist material on a substrate for delineating a pattern on the resist material. More particularly, it relates to a delineating method in which a pattern for delineation is divided into pre-set unitary domains and in which the exposure dose of the electron ray beam to be illuminated on each unitary area is corrected in view of the accumulated energy ascribable to backward scattering of electrons. The invention also relates to a proximity effect correcting method.

BACKGROUND ART

For delineating a pattern of a semiconductor integrated circuit on a resist material formed on a substrate formed by, for example, a silicon semiconductor substrate, an electron ray beam used for delineation is transmitted through the resist material to fall on the substrate. The electron ray is scattered in a broad range within the substrate. That is, the so-called backward scattering in electron ray lithography is produced. Part of the electron ray beams agin falls on the resist material. The result is that the resist material is sensitized over a range significantly wider than an area on which the electron ray beam has entered the resist material. If the delineation pattern is low in density, the light exposure of the resist material ascribable to backward scattering is negligible. However, if the delineation patterns are congested and lie close to one another, light exposure of the resist material ascribable to backward scattering occurs over an extremely wide range. This phenomenon, schematically shown in FIGS. 26A and 26B, is the proximity effect in the electron ray lithography. Up to now, various methods for correcting the proximity effect have been proposed.

The conventional method for correcting the proximity effect and the problems thereof will now be briefly explained.

Before proceeding to description of the method for correcting the proximity effect including that of the present invention using various equations, the variables used therein are first defined. The unitary domain is synonymous with mesh. A delineated figure is synonymous with a pattern to be delineated in the unitary domain, and means a pattern to be delineated using an electron ray beam present in the unitary domain. A pattern density A% means the percentage of the sum total of sub-areas occupied by patterns in the entire area. Meanwhile, a suffix 'v' to a symbol 'Δ' means a vector.

$\eta$: backward scattering coefficient in an EID function (also termed a reflection coefficient)

$\beta_f$: radius of forward scattering in the EID function $\beta_b$: radius of backward scattering in the EID function W: length of a side of a rectangular-shaped delineated figure or length of a side of a square-shaped delineated figure eb(x, y): accumulated energy, ascribable to backward scattering, exerted by a delineated figure on a point (x, y)

$eb_{p,q}(x, y)$: accumulated energy, ascribable to backward scattering, exerted by a delineated figure positioned at a unitary domain (p, q) on a point (x, y)

Eb(x, y): accumulated energy, ascribable to backward scattering, exerted by all delineated figures on a point (x, y)

Eb(i, j): accumulated energy, ascribable to backward scattering, exerted by all delineated figures on a unitary domain (i, j)

$\Delta_v Eb(i, j)$: gradient vector of accumulated energy, ascribable to backward scattering, exerted by all delineated figures on a unitary domain (i, j)

$\Delta_v EB_{x-i,j}$: x-axis component of a gradient vector of accumulated energy, ascribable to backward scattering, exerted by all delineated figures on a unitary domain (i, j)

$\Delta_v EB_{y-i,j}$: y-axis component of a gradient vector of accumulated energy, ascribable to backward scattering, exerted by all delineated figures on a unitary domain (i, j)

$\alpha_{x-i,j}$: x-axis component in a pattern area density in a unitary domain (i, j)

$\alpha_{y-i,j}$: y-axis component in a pattern area density in a unitary domain (i, j)

$\alpha'(i, j)$: an averaged pattern area density in a unitary domain (i, j)

$\Delta_v \alpha(i, j)$: gradient vector of an averaged pattern area density in a unitary domain (i, j)

$\Delta_v \alpha_{x-i,j}$: x-axis component of gradient vector of an averaged pattern area density in a unitary domain (i, j)

$\Delta_v \alpha_{y-i,j}$: y-axis component of gradient vector of an averaged pattern area density in a unitary domain (i, j)

$S_{th}$: threshold value of gradient vector of pattern area density (pre-set value)

$R_{sm}$: averaging range (number of unitary domains used for averaging)

$N_{sm}$: number of times of averaging

D: exposure dose $D_s$: standard exposure dose giving a target size of a delineated pattern in a pre-set pattern density (such as 50%)

$D_{cor}(i, j)$: corrected exposure dose in a unitary domain (i, j)

$D_{cor}(x, y)$: corrected exposure dose at a point (x, y)

$\Delta L_{mesh}$: variation in line width in a unitary domain $\Delta L$: variation in line width for variation in light exposure dose ($\Delta Eb/Ds$) at a pre-set pattern density, such as 50% (in other words, line width variation in a unitary domain)

$\Delta L_{tol}$: tolerance of line width variation in a unitary domain $L_x, L_y$: size of divided pattern in the x-axis direction and in the y-axis direction $Eb\_EIB_n(i,j)$: accumulated energy (based on EID function) of accumulated energy ascribable to backward scattering at the center of a unitary domain (i, j) after N times of iterative calculations $Derr_{-N}(i, j)$: error in exposure dose at the center of the unitary domain (i, j) after N times of iterative calculations $\alpha''err_{-N}(i, j)$: difference between corrected pattern area density after N times of iterative calculations and pattern area density estimated from accumulated energy ascribable to backward scattering derived from the EID function $Eb_{-g}(i, j)$: accumulated energy ascribable to backward scattering at an areal center of gravity in a pattern in a unitary domain (i, j) (total delineated figure)

$Ddiv\_cor(x_{div-c}, y_{div-c})$: corrected exposure dose of an electron ray beam at the center of a divided pattern $(x_{div-c}, y_{div-c})$ (Method for Sequential Calculations by Representative Point Evaluation)

The method for sequential calculations by representative point evaluation, widely employed as a method for correcting the proximity effect, is a exposure dose optimizing method consisting in providing representative points at each corner and at a central point in each side of a figure for delineation and calculating the intensity of light exposure at each representative point using an energy intensity distribution (EID) function for optimizing the exposure dose in each light exposure shot into coincidence with the threshold value of the exposure light energy required for forming a resist pattern. This method is explained in, for example, M. Parikh, J. Appl. Phys, 50 (1979), 4371 or M. Parikh, J. Appl. Phys, 50 (1979), 4378 or M. Parikh, J. Appl. Phys, 50 (1979), 4383.

The calculations for correction can be divided into calculations of the accumulated energy at a representative point $P(x, y)$ for a given figure for delineation and calculations for optimizing the exposure dose. In the calculations for the accumulated energy at the representative point $P(x, y)$ in a given figure for delineation, an accumulated energy $Q(x, y)$ ascribable to backward scattering, brought about by other figures, is calculated using the following equation (1):

$$Q(x, y) = \frac{1}{\pi(1+\eta)} \int_{-\infty}^{\infty} \int_{-\infty}^{\infty} D(x', y') \left[ \frac{1}{\beta_f^2} \exp\left\{ \frac{(x-x')^2 + (y-y')^2}{\beta_f^2} \right\} + \frac{\eta}{\beta_b^2} \exp\left\{ \frac{(x-x')^2 + (y-y')^2}{\beta_b^2} \right\} \right] dx' dy \quad (1)$$

The range of a proximate figure affecting a representative point $P(x, y)$ is at least thrice a backward scattering radius $(\beta_b)$ defined by the EID function of the following equation (2):

$$EID(r) = \frac{1}{\pi(1+\eta)} \left\{ \frac{1}{\beta_f^2} \exp\left(-\frac{r^2}{\beta_f^2}\right) + \frac{\eta}{\beta_b^2} \exp\left(-\frac{r^2}{\beta_b^2}\right) \right\} \quad (2)$$

where $$r = \sqrt{x^2 + y^2}$$

as proposed by T. H. P. Chang, J. Vac. Soi. Technol. 12, 1271 (1983). The range equal to three times the radius of backward scattering $(\beta_b)$ is schematically shown in FIG. 27 by a solid-line circle. The term of D(x', y') on the equation (1) represents a light exposure image (pattern).

Then, the sum of squares of the differences between the accumulated energy $Q(x, y)$ at each representative point $P(x, y)$, as calculated using the equation (1), and the prescribed intensity of the exposure light at each representative point (in most cases, the exposure dose at an edge $E_{th}$) is found for quantitating the magnitude of the proximity effect. The exposure dose at each light exposure shot is adjusted, that is corrected, and the sum total of the squares of the differences is re-evaluated. The exposure dose at each light exposure shot is adjusted, that is corrected, for minimizing the sum total of the squares of the differences.

In keeping with the smaller feature size and higher integration of a semiconductor integrated circuit, the number of figures to be delineated per chip for pattern delineation by an electron ray beam, is increasing drastically. On the other hand, in keeping with the tendency towards development of high resolution electron ray lithography is towards higher acceleration voltage for an electron ray beam, a light exposure device of 30 kV or 50 kV has made its debut. Further, a light exposure device of 100 kV is about to make its debut. If the acceleration voltage is 20 kV, the radius of backward scattering $\beta_b$ is 3 to 5 $\mu$m, whereas, if the acceleration voltage is 50 kV, the radius of backward scattering $\beta_b$ is on the order of 10 $\mu$m. With increased acceleration voltage, the radius of backward scattering $\beta_b$ is increased significantly, as shown by a broken-line circle, such that, with increased number of figures for delineation, the processing time required for calculations for correction in the sequential computing method by the conventional representative point evaluation is prohibitively increased beyond practically tolerable level.

The correction for the proximity effect by the sequential calculating method in square-shaped figures for delineation with each side measuring W $\mu$m, arrayed at an interval of W $\mu$m (see FIGS. 27 and 28). FIG. 28 shows only one of the figures for delineation. These figures may be deemed to be of patterns with a design rule of W $\mu$m. The accumulated energy ebp,q (x, y) ascribable to backward scattering, exerted by a figure lying at a unitary domain (p, q) on a point $P(x, y)$, is first found by the following equation (3)

$$eb_{p,q}(x, y) = \frac{D\eta}{\pi \beta_b^2 (1+\eta)} \int_{x-w/2}^{x+w/2} \exp\left\{ \frac{(X-X')^2}{\beta_b^2} \right\} dx' \int_{y-w/2}^{y+w/2} \exp\left\{ \frac{(y-y')^2}{\beta_b^2} \right\} dy' \quad (3)$$

In the equation (3), (X, Y) is a coordinate of a center point of a square-shaped figure of a length of a side W lying at the unitary domain (p, q). As figures affecting the point $P(x, y)$, at least the figures situated in a range thrice the radius of backward scattering $\beta_b$ need to be considered. If the sum of the influences of the accumulated energy from these figures is taken into account, the accumulated energy Ebi, j(x, y), ascribable to backward scattering in the unitary domain (i, j) can be found from the following equation (4):

$$Eb_{i,j}(x, y) = \sum_{p=0}^{m} \sum_{q=0}^{n} eb_{p,q}(x, y) \quad (4)$$

In keeping pace with the tendency towards smaller feature size of the design rule (W), the number of figures per unit area is evidently increased, so that the processing volume for calculating the accumulated energy by the sequential calculation method by the conventional representative point evaluation is increasing.

For achieving smaller feature size of the design rule (W), it is necessary to increase the resolution of electron ray delineation, for which high acceleration voltage is required. Since this increases the radius of backward scattering $\beta_b$, the number of surrounding figures affecting the accumulated energy is drastically increased, as a result of which the processing volume for calculating the accumulated energy is also drastically increased. This is shown schematically in FIG. 29, wherein the x-axis stands for the radius of backward scattering $\beta_b$, and the y-axis stands for the number of surrounding figures influencing the accumulated energy at the point (x, y). The respective curves denote the design rule (W). Since the number of figures of the entire chip is also increased, the total processing volume of the accumulated energy is the number of the surrounding figures influencing the accumulated energy at the point (x, y) multiplied by the total number of figures in the entire chip. Thus, the processing volume of calculations for finding the optimum exposure dose in the sequential calculation method by the representative point evaluation is prohibitive, such that, in developing the next-generation ultra-LSI, the method for sequential calculations by the representative point evaluation is not thought to be favorable.

(Representative Figure Method)

In keeping with the tendency towards the higher density and smaller feature size of the delineation pattern and higher acceleration voltage of the electron ray beam, a proximity effect correction method has been proposed, in which the calculations for correction are simplified and the time necessary for calculations for correction are drastically shortened for eking out the defect of the method for sequential calculations by the representative point evaluation in the calculation time in correcting the proximity effect. In pattern delineation using a high acceleration voltage, the range of figures exposed by backward scattering is as wide as approximately 10 µm or more. It is known that, within a range of the radius of approximately 10 µm, the exposure dose ascribable to backward scattering is rendered uniform based on the pattern areal density in the unitary domain, without regard to the figure. A variety of simplified high-speed proximity effect correction methods based on this feature have been proposed. One of these methods is the proximity effect correction method known as representative figure method.

With the representative figure method, shown in FIG. 30, a pattern to be delineated is divided into unitary domains (meshes) of a pre-set size. One or more figures in a unitary domain is replaced by and approximated to a rectangular figure having an area equal to the total area of the figures in the domain and positioned at an areal center of gravity and calculations for proximity effect correction are executed based on, for example, the sequential calculations by the representative point evaluation.

(Areal Density Mapping Method)

On the other hand, an areal density mapping method (also termed a bit-mapping method) consisting in developing the unitary domain (mesh) into a bit map, calculating the pattern areal density of a pattern (figure for delineation) in the unitary domain and averaging the pattern areal density of neighboring unitary domains, has been proposed and its effect has been verified. The areal density mapping method is now explained by taking a small-sized pattern (line width of 0.2 µm) arranged on a boundary between a 50% pattern density area (shown on the left side of FIG. 31) and a 0% pattern density area (shown on the right side of FIG. 31) as a model pattern. Assuming that the patterning is performed on the resist material on a silicon semiconductor substrate with an acceleration voltage of 50 kV, the radius of forward scattering $\beta_f$, the radius of backward scattering $\beta_b$, and the reflection coefficient η are set to 0.05 µm, 10.0 µm and to 0.78, respectively. The unitary domain is a square area delimited by a broken line in FIG. 31, with each side of the square measuring 6.4 µm.

FIG. 32 shows the result of calculations of changes in pattern line width in case of not performing correction for the proximity effect. For calculating the accumulated energy, the above-mentioned EID function of the equation (2) comprised of the double Gaussian function is used. The exposure dose in an area with a pattern density of 50% was used as the standard exposure dose. Therefore, in an area with a pattern density of 50%, the pattern line width is the design line width (0.2 µm). On the other hand, in an area with a pattern density of approximately 0%, the accumulated energy Eb ascribable to backward scattering is small, so that the pattern line width becomes significantly narrow. In this manner, the pattern line width is changed depending on the ambient pattern density. Moreover, with the high acceleration voltage of 50 kV, the pattern line width is significantly changed in a region of 10 µm on both sides of a boundary area in which the pattern density is changed, thus inhibiting practical utilization.

The following is an example of carrying out corrections for the proximity effect by the areal density mapping method. FIG. 33 shows the flow of calculations of the areal density mapping method.

[step-10]

In the areal density mapping method, delineation pattern data (EB pattern data) is read. The delineation pattern data is then split into pre-set unitary domains. Each unitary domain (mesh) is then developed into a bit map of a certain grid size. The presence or absence of the figure for delineation in each grid is described by '1' or '0', respectively.

[step-20]

Then, using this bit map, a pattern areal density per unitary domain (mesh: W µm) ($\alpha(i, j)$ is calculated. The resulting pattern areal density $\alpha(i, j)$ is shown in FIG. 34.

[step-30]

The calculated pattern areal density $\alpha(i, j)$ is averaged or smoothed. For averaging, the following equation (5):

$$\alpha'(i, j) = \frac{1}{R_{sm} \times R_{sm}} \sum_{k=-m}^{m} \sum_{l=-m}^{m} \alpha(i+k, j+l) \tag{5}$$

where $$m = \frac{R_{sm} - 1}{2}$$

is used.

That is, the operation of simple averaging of the pattern areal density in unitary domains (i+k, j+l) in the vicinity of the unitary domain under consideration (i, j) is repeated plural times. The resulting averaged areal density $\alpha'(i, j)$ is shown in FIG. 35. Alternatively, a weighted average value is found, on the basis of the magnitude of the effect of backward scattering on the unitary domain (i,j) under consideration, by the following equations 6-1 and 6-2:

$$\alpha'(i, j) = \sum_{k=-m}^{m} \sum_{l=-m}^{m} a(i+k, j+l)\alpha(i+k, j+l) \tag{6-1}$$

where $$m = \frac{3\beta_b}{W}$$

where $$a(i+k, j+l) = \tag{6-2}$$
$$\frac{C\eta}{\pi\beta_b^2(1+\eta)} \int_{-w/2}^{w/2} \exp\left[\frac{(kW-x')^2}{\beta_b^2}\right] dx' \times \int_{-w/2}^{w/2} \exp\left[\frac{(lW-y')^2}{\beta_b^2}\right] dy'$$

where C is a constant.

By this averaging, it becomes possible to reflect the reciprocal proximity effect due to a wide range of backward scattering on the correction of the exposure dose.

[step-40]

The corrected exposure dose at each unitary domain $D_{cor}(i, j)$ is calculated based on the averaged pattern areal density $\alpha'(i, j)$ (see FIG. 36). The corrected exposure dose at each unitary domain $D_{cor}(i, j)$ can be calculated from the following equation (7):

$$D_{cor}(i, j) = Ds \cdot (1+\eta)/\{1+2\alpha'(i, j) \cdot \eta\} \tag{7}$$

where $D_{cor}(i, j)$ is a standard exposure dose and, for example, is the optimum exposure light energy in an area of 50% pattern density (such as exposure dose which gives 1:1 resolution of a large-area line and space pattern). The corrected exposure dose $D_{cor}$ of each rectangular-shaped light exposure shot is allocated to each unitary domain and actual pattern delineation is carried out by an electron ray beam (EB). The calculations of the pattern areal density, averaging (smoothing) and calculations of the corrected exposure dose are all arithmetic calculations which can be executed in an extremely short time.

The equation (7) is derived as follows: If the acceleration voltage of the electron ray beam is as high as 50 kV, the radius of backward scattering βb is as large as approximately 10 μm, such that the accumulated energy ascribable to backward scattering can be deemed to be constant. If the delineation ratio is deemed to be 100%, the accumulated energy $Ef_{100}$ ascribable to forward scattering and the accumulated energy $Eb_{100}$ ascribable to backward scattering for the exposure dose D can be expressed by the following equations 8-1 and 8-2:

$$Ef_{100}=D/(1+\eta) \tag{8-1}$$

$$Eb_{100}=\eta \cdot D/(1+\eta) \tag{8-2}$$

If the acceleration voltage of the electron ray beam is as high as 50 kV, the distribution of the accumulated energy ascribable to backward scattering is smoothed, without regard to pattern areal density, within the radius of backward scattering $\beta_b$, such that the accumulated energy Eb ascribable to backward scattering is proportionate to the pattern areal density α(0<α<1). Therefore, the accumulated energy ascribable to backward scattering Eb can be found by the following equation (9):

$$Eb=\alpha \cdot Eb_{100}=\alpha \cdot \eta \cdot D/(1+\eta) \tag{9}$$

If, for a pattern areal density α, the pattern edge exposure light intensity which gives the design size of a pattern is $E_{th}(\alpha)$, $E_{th}(\alpha)$ can be found from the following equation (10):

$$E_{th}(\alpha)=E_{th}(0)+\alpha \cdot \eta \cdot D/(1+\eta) \tag{10}$$

where $E_{th}(0)$ is the pattern edge exposure light intensity which gives the pattern design size for only the forward scattering (α=0). If the slicing level for $E_{th}(0)$, that is, for only the forward scattering, is $I_{th}$ (where $0<I_{th}<1$), the equation (10) can be rewritten to the following equation (11):

$$\begin{aligned}E_{th}(\alpha) &= I_{th} \cdot D/(1+\eta) + \alpha \cdot \eta \cdot D/(1+\eta) \\ &= (I_{th}+\alpha \cdot \eta)D/(1+\eta)\end{aligned} \tag{11}$$

If the standard pattern areal density is $\alpha s$ and the standard exposure dose is $D_{cor}(i, j)$, the equation (12), equivalent to the equation (11), may be given as:

$$E_{th}(\alpha_s)=(I_{th}+\alpha s \cdot \eta)D_s/(1+\eta) \tag{12}$$

Since the accumulated energy ascribable to backward scattering is varied with the pattern areal density α, the pattern edge exposure light intensity is varied under the same exposure dose, as a result of which the size of a pattern formed on the resist material is changed. For avoiding this phenomenon, it suffices to correct the exposure dose D so that, under all values of the pattern areal density α, the pattern edge exposure light intensity $E_{th}(\alpha)$ which will give the design pattern size will become constant. That is, it suffices to set the right side of the equation (11) so as to be equal to the right side of the equation (12) and to find the corrected exposure dose $D_{cor}(\alpha)$. The result is shown by the following equation (13):

$$D_{cor}(\alpha)=D_s \cdot (I_{th}+\alpha_s \cdot \eta)/(I_{th}+\alpha \cdot \eta) \tag{13}$$

If $I_{th}=0.5$, $\alpha_s=0.5$ (equivalent to light exposure with the line/space of 1:1, with the pattern density of 50%) and α'(i,j) is substituted for α, the equation (7) can be derived from the equation (13). Meanwhile, it suffices if the values of $I_{th}$ or $\alpha_s$ are suitably set depending on the light exposure device employed or the pattern formed on the resist material, with the contents (coefficients) of the equation (7) being correspondingly changed.

An illustrative case of correction of the exposure dose in case of correcting the proximity effect by the areal density mapping method is shown in FIGS. 37 and 38 for the cases in which the length of a side of a unitary domain (W) (mesh size) is 2.56 μm and no averaging has been performed, and in which the averaging range (Rsm) 3×3 is averaged simply with the number of times of averaging ($N_{sm}$) being 9. The rectangular-shaped exposure light shot is assumed to be coincident with the shape of the unitary domain. FIG. 37, showing the correction of the proximity effect by the areal density mapping method, shows changes in pattern line width in case averaging has been done and averaging has not been done, while FIG. 38 shows the corrected exposure dose $D_{cor}(x)$, pattern areal density α(x), averaged pattern areal density α'(x) and the accumulated energy Eb(x) ascribable to backward scattering. It is seen from FIG. 37 that, in an area with a sufficiently uniform pattern areal density (x<−15 μm and x>15 μm), the proximity effect can be corrected theoretically completely.

However, with the areal density mapping method, the accumulated energy Eb(x) ascribable to the backward scattering Eb(x) is substantially similar to the averaged pattern areal density α'(x), in a boundary area where the averaged pattern areal density α'(x), as shown in FIG. 38, such that the corrected exposure dose $D_{cor}(x)$, calculated based on the averaged pattern areal density α'(x), roughly reflects the reciprocal proximity effect. Therefore, in the boundary area, the proximity effect is corrected fairly satisfactorily. However, since the corrected exposure dose $D_{cor}$ has a stepped process with changes in the pattern areal density, it is basically not possible to avoid non-corrected remnant portions in the corrected exposure dose $D_{cor}$ in the unitary domain of the boundary area. The result is serrated non-corrected remnant portions in the boundary area and serrated shape of the pattern line width transitions, as shown in FIG. 37.

In addition, if the pattern density on the high density side is high, the serrated non-corrected remnant portions becomes outstanding, such that, in a pattern neighboring to an area with 100% pattern density, the non-corrected remnant portions of the corrected exposure dose $D_{cor}$ becomes non-negligibly high, as shown in FIG. 39. In addition, not only the pattern line width shows a serrated process in each unitary domain, but also the pattern line width is narrower than the target value, and hence the corrected exposure dose in each unitary domain on the boundary area is shifted at all times to insufficient exposure dose side, as shown in FIG. 39. Specifically, the corrected exposure dose at the center of the unitary domain (mesh) is deviated from an optimum value. In FIG. 39, '100%–0%', '50%–0%' and '10%–0%' mean that an area with 100% pattern density and an area with 0% pattern density have been formed, an area with 50% pattern density and an area with 0% pattern density have been formed and an area with 10% pattern density and an area with 0% pattern density have been formed, respectively.

Thus, with the areal density mapping method, as one of the conventional proximity effect correcting method, residual proximity effect correction, that cannot basically be corrected, is generated in a boundary area where the pattern areal density is changed acutely, thus producing significant changes in the pattern line width. Thus, for achieving accurate proximity effect correction, it is necessary to automatically extract the unitary domains where the pattern areal density is changed acutely. In delineating a pattern, such as a pattern of a memory device, shown for example in FIG. 2, it may be supposed easily that the pattern areal density is changed acutely at a terminal portion of the cell array, such that, if the areal density mapping method is applied to this area, non-corrected remnant portions are generated therein. It is thus possible to artificially effect accurate proximity effect correction only in this area. However, in case of a complex pattern, as in the case of a logic type device or a peripheral circuit of a memory device, it is extremely difficult to artificially locate and extract a unitary domain where pattern areal density is acutely changed to give rise to uncorrected portions.

If, by a variety of proximity effect corrections, an appropriate corrected exposure dose is given each unitary domain, only a sole exposure dose can be set in each unitary domain with the conventional method for proximity effect correction. Therefore, in an area where the pattern areal density is changed acutely such that the accumulated energy Eb ascribable to backward scattering is changed acutely, uncorrected proximity effect portions in the delineated figure is basically produced. In particular, in a recent high-speed electron ray light exposure device, a variable rectangular-shaped large-diameter light beam with a diameter of 5 $\mu$m at the maximum, is used for achieving a high through-put. As a matter of course, simply a sole light exposure area (light exposure shot) is given a sole rectangular beam in such light exposure device. Thus, in a large-diameter beam illuminating the boundary area, non-corrected remnant portions are inevitably produced in a beam. That is, there is imposed with the areal density mapping method a limitation on the correction accuracy in the proximity effect correction in the area subjected to acute change in the pattern areal density, although practical computing speed can thereby be achieved, such that it is difficult to effect high precision pattern delineation for the next-generation ultra-LSI with a design rule of, for example, 0.2 $\mu$m or less. Therefore, in a unitary domain where the pattern areal density is acutely changed such that the accumulated energy ascribable to backward scattering is changed acutely, it is necessary to divide the pattern in a unitary domain appropriately for correcting the exposure dose in terms of the divided pattern as a unit. However, if the pattern division in a unitary domain is performed inadvertently to an extent which is more than is necessary, the data for delineation by the electron ray beam is increased in volume, which is not desirable in view of data handling and delineation time duration.

DISCLOSURE OF THE INVENTION

It is an object of the present invention to provide a proximity effect correction method in a delineating method employing an electron ray beam whereby a unitary domain in which non-corrected remnant proximity effect portions, that cannot as a principle be corrected, are liable to be produced, that is a unitary domain in which the pattern areal density is changed acutely.

It is another object of the present invention to provide a proximity effect correction method whereby the corrected exposure dose at the center of a unitary domain with acutely changed pattern areal density can be optimized.

It is still another object of the present invention to provide a proximity effect correction method whereby a pattern of a unitary domain is suitably divided in such a unitary domain in which the pattern areal density is acutely changed and the accumulated energy ascribable to backward scattering is acutely changed in order to perform exposure dose correction in terms of the divided pattern as a unit.

It is yet another object of the present invention to provide a proximity effect correction method whereby the corrected exposure dose can be afforded to the divided pattern easily and promptly.

In a technique of electron ray lithography consisting in illuminating an electron ray beam on an electron ray sensitive resist material on a substrate for delineating a pattern on the resist material, there is provided a method for correcting the proximity effect consisting in dividing the pattern for delineation into pre-set unitary domains, and correcting the exposure light volume of an electron ray beam illuminated on each unitary domain in consideration of the accumulated energy ascribable to backward scattering of electrons. The correcting method includes bit-map-developing each unitary domain and calculating a pattern areal density in each unitary domain, averaging the pattern areal density in each unitary domain for calculating the averaged pattern area density, calculating the gradient vector of the averaged pattern areal density, and extracting a unitary domain where the magnitude of the calculated gradient vector is more than a pre-set value for identifying the unitary domain exhibiting a high correction error in the proximity effect correction.

In the proximity effect correcting method, with the tolerance for line width variations in a unitary domain of $\eta$, the line width variation ratio in a unitary domain of $\Delta L$ and the length of a side in a square-shaped unitary domain of W, the pre-set value Sth preferably is $$S_{th} = \{\Delta L_{tol}/(\Delta L \cdot W)\}\{(1+\eta)/\eta\}.$$

In a technique of electron ray lithography consisting in illuminating an electron ray beam on an electron ray sensitive resist material on a substrate for delineating a pattern on the resist material, there is provided a method for correcting the proximity effect consisting in dividing the pattern for delineation into pre-set unitary domains, and correcting the exposure light volume of an electron ray beam illuminated on each unitary domain in consideration of the accumulated energy ascribable to backward scattering of electrons. The correcting method includes the steps of bit-map-developing each unitary domain and calculating a pattern areal density in each unitary domain, averaging the pattern areal density in each unitary domain for calculating the averaged pattern area density, calculating, in each unitary domain, the accumulated energy ascribable to backward scattering based on an EID function and the averaged pattern areal density, finding, for each unitary domain, the difference between the accumulated energy as calculated and the averaged pattern areal density, if the sum of square values of the differences in each unitary domain, as found at step (D), is not less than the prescribed value, correcting the pattern areal density and calculating the accumulated energy based on the corrected pattern areal density, calculating the accumulated energy ascribable to the backward scattering based on the EID function and the corrected pattern areal density, finding, in each unitary domain, the difference between the accumulated energy as calculated and the accumulated energy as found, repeating the directly previous three steps if the sum of the squared values of the differences in each unitary domain as found is not less than the above prescribed value and correcting the exposure dose of the electron ray beam in each unitary domain based on the corrected pattern areal density as obtained by the last repetition of the calculating step.

In the proximity effect correcting method, next to the step of averaging the pattern areal density in each unitary domain for calculating the averaged pattern areal density, a step of calculating the gradient vector of the averaged pattern area density and a step of extracting a unitary domain for which the calculated gradient vector is larger in magnitude than a pre-set value for identifying a unitary domain with large correction error of the proximity effect are carried out for extracting a unitary domain where the magnitude of the gradient vector as calculated exceeds a pre-set value for determining the unitary area with a large correction error of the proximity effect. The correction of the exposure dose of the electron ray beam in the unitary area is carried out for a unitary area with a large correction error of the proximity effect.

In a technique of electron ray lithography consisting in illuminating an electron ray beam on an electron ray sensitive resist material on a substrate for delineating a pattern on the resist material, there is also provided a method for correcting the proximity effect consisting in dividing the pattern for delineation into pre-set unitary domains, and correcting the exposure light volume of an electron ray beam illuminated on each unitary domain in consideration of the accumulated energy ascribable to backward scattering of electrons. The correcting method includes the steps of bit-map-developing each unitary domain and calculating a pattern areal density in each unitary domain, averaging the pattern areal density in each unitary domain for calculating the averaged pattern area density, calculating the gradient vector of the averaged pattern areal density, extracting a unitary domain where the magnitude of the calculated gradient vector is more than a pre-set value for identifying the unitary domain exhibiting a high correction error in the proximity effect correction, dividing a pattern in a unitary domain extracted in the above extracting step along the direction of a component of the gradient vector for obtaining divided patterns, and correcting the exposure dose of the electron ray beam for each of the divided patterns in consideration of the accumulated energy ascribable to the backward scattering of electrons.

The above proximity effect correction method further includes, next to the step of averaging the pattern areal density in each unitary domain for calculating the averaged pattern areal density, the steps of calculating, in each unitary domain, the accumulated energy ascribable to backward scattering based on the averaged pattern areal density obtained by the step of calculating the accumulated energy ascribable to the backward scattering based on the EID function and the averaged pattern areal density, finding, in each unitary domain, the difference between the calculated accumulated energy and the accumulated energy calculated based on the averaged pattern areal density, correcting, if the sum of squares of the differences in the unitary domains is larger than a prescribed value, the pattern areal density, calculating the accumulated energy based on the corrected pattern areal density, and calculating the accumulated energy ascribable to the backward scattering based on the EID function and the corrected pattern areal density.

The above correction method further includes the steps of finding, in each unitary domain, the difference between the accumulated energy calculated based on the averaged pattern areal density obtained by the step of finding the EID function and the averaged pattern areal density and the accumulated energy obtained based on the corrected pattern areal density, correcting the pattern areal density if the sum of squared differences in the unitary domain exceeds the prescribed value, calculating the accumulated energy based on the corrected pattern areal density, calculating the accumulated energy ascribable to the backward scattering based on the EID function and the corrected pattern areal density, finding the difference between the accumulated energy calculated based on the averaged pattern areal density obtained by the step of calculating the EID function and the averaged pattern areal density and the accumulated energy obtained based on the corrected pattern areal density, repeating the above steps, and correcting the exposure dose of the electron ray beam in the unitary domain based on the pattern areal density obtained by the last repetition of the step of correcting the pattern areal density and calculating the accumulated energy based on the corrected pattern areal density.

In this case, with the tolerance for line width variations in a unitary domain of $\Delta L_{tol}$, the line width variation ratio in a unitary domain of $\Delta L$, backward scattering coefficient $\eta$, and with the magnitudes along the x-axis and along the y-axis of the gradient vector of the corrected pattern areal density as obtained by the final repetition f the step (c1) of $|\Delta v \alpha x''|$ and $|\Delta v \alpha y''|$, respectively, the magnitude Lx along the x-axis and the magnitude Ly along the y-axis of the divided pattern preferably satisfy both the relation $$Lx \geq \Delta L_{tol}'(1+\eta)/(\eta \cdot \Delta L \cdot |\Delta_v \alpha_x''|)$$

and the relation $$Ly \geq \Delta L_{tol}'(1+\eta)/(\eta \cdot \Delta L \cdot |\Delta_v \alpha_y''|)$$

In the proximity effect correction method, in correcting the exposure dose of the electron ray beam with respect to the divided pattern, the corrected exposure dose may be calculated based on an accumulated energy, ascribable to the backward scattering, at a pre-set position in a unitary domain, a standard exposure dose affording a target dimension of a pattern for delineation at a pre-set pattern density, a backward scattering coefficient, and a product of the distance from the pre-set position in the unitary domain to the pre-set position of the divided pattern and the magnitude of the gradient vector of the pattern areal density obtained based n the corrected pattern areal density obtained by last repetition.

In this case, with the center of a unitary domain (i, j) extracted at the step (D) as the origin of coordinates, with the pre-set position as an areal center of gravity (X-$_g$, Y-$_g$ and with the pre-set position of the divided pattern as the center of the divided pattern ($x_{div\_c}$, $y_{div\_c}$), a correction value Ddiv_cor($x_{div\_c}$, $y_{div\_c}$) of the exposure dose of the electron ray beam with respect to the divided pattern is calculated by $$Ddiv\_cor(x_{div\_c}, y_{div\_c}) = D_s[(1+\eta)-2\eta\{|\Delta_v\alpha_{x\_i,j}''|\cdot(x_{div\_c}-X\_g)+|\Delta_v\alpha_{y\_i,j}''|\cdot(y_{div\_c}-Y\_g)\}]-2(1+\eta)Eb\_g(i,j)$$

where $\eta$ is the backward scattering coefficient;

$|\Delta_v\alpha_{x\_i,j}''|$ is the magnitude of an x-axis component of a gradient vector of a pattern areal density obtained based on the corrected pattern areal density obtained by last repetition of the step of calculating the accumulated energy obtained based on the pattern areal density corrected in the unitary domain where the magnitude of the gradient vector exceeds a pre-set value;

$|\Delta_y \alpha_{y\_i,\,j}''|$ is the magnitude of a y-axis component of a gradient vector of a pattern areal density obtained based on the corrected pattern areal density obtained by last repetition of the step of calculating the accumulated energy obtained based on the pattern areal density corrected in the unitary domain where the magnitude of the gradient vector exceeds a pre-set value, $D_s$ is a standard exposure dose affording a target size of a pattern for delineation in a pre-set pattern density and $Eb_{\_g}(i,\,j)$ is an accumulated energy ascribable to backward scattering at an areal center of gravity ($X_{\_g}$, $Y_{\_g}$) of a pattern in a unitary domain where the magnitude of the gradient vector is not less than a pre-set value.

The relation between the above-described proximity effect correction method according to the present invention and the conventional proximity effect correction method is shown in the flow diagram of FIG. 1.

With the proximity effect correction method according to the present invention, the unitary domain with significant proximity effect correction error can be automatically determined by calculating the gradient vector of the averaged pattern areal density.

Also, with the proximity effect correction method according to the present invention, the sum of squared differences between the accumulated energy calculated based on the corrected pattern areal density and the accumulated energy ascribable to backward scattering, calculated based on the corrected pattern areal density, is evaluated, for correcting the pattern areal density with high precision, as a result of which the corrected exposure dose at a pre-set position such as at the center of the unitary domain or at an areal center of gravity may be obtained, while the variation in the pattern line width can be made smaller than with the conventional method.

Moreover, with the proximity effect correction method according to the present invention, since the pattern in a unitary domain having larger proximity correction error can be divided into appropriate sizes, there is no risk of the delineation data by the electron ray beam or inconveniences in data handling or delineation time.

In addition, with the proximity effect correction method according to the present invention, the accumulated energy ascribable to the backward scattering is deemed to undergo substantially linear transitions in a unitary domain, the light exposure correction plane based on the gradient vector of the pattern areal density can be presumed to exist, such that there is no necessity of finding the corrected exposure dose for the divided pattern by iterative calculations or matrix calculations requiring large processing volume, thus realizing high-speed high-precision correction of the proximity effect.

BEST MODE FOR CARRYING OUT THE INVENTION

Figure 1:
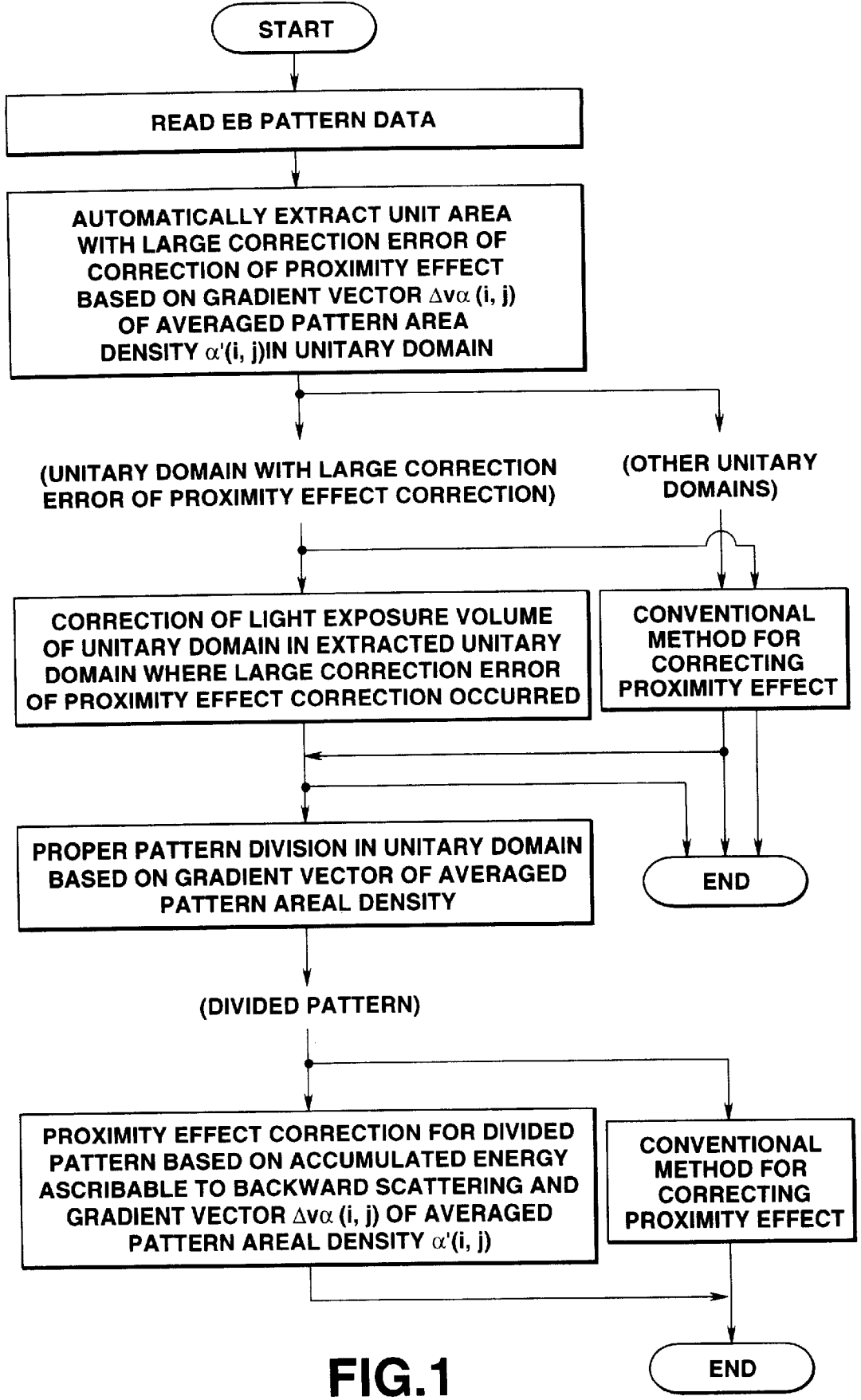
FIG. 1 is a flowchart showing the relation respective embodiments of the present invention.

Referring to the drawings, preferred embodiments of the present invention will be explained in detail.

In the following embodiments, a pattern shown in FIG. 2, comprised of a fine line pattern of fine lines (with a line width of 0.2 $\mu$m) extending from an area with a pattern density of approximately 100% to an area of a pattern density of approximately 0%, is taken as a model pattern. The shape of the unitary domain is a square, with the length of a side of the unitary domain (W) (mesh size) being 5.12 $\mu$m. The radius of the forward scattering $\beta_f$, radius of the backward scattering $\beta_b$ and the reflection coefficient $\eta$ in the EID function are 0.05 $\mu$m, 10.0 $\mu$m and 0.78, respectively. The width of the area A with the pattern density of 100% and the width of the area B along the x-axis direction are 51.2 $\mu$m, while the distance from the upperside of the area A to the lower side of the area B (along the y-axis) is 46.8 $\mu$m.

Figure 2:
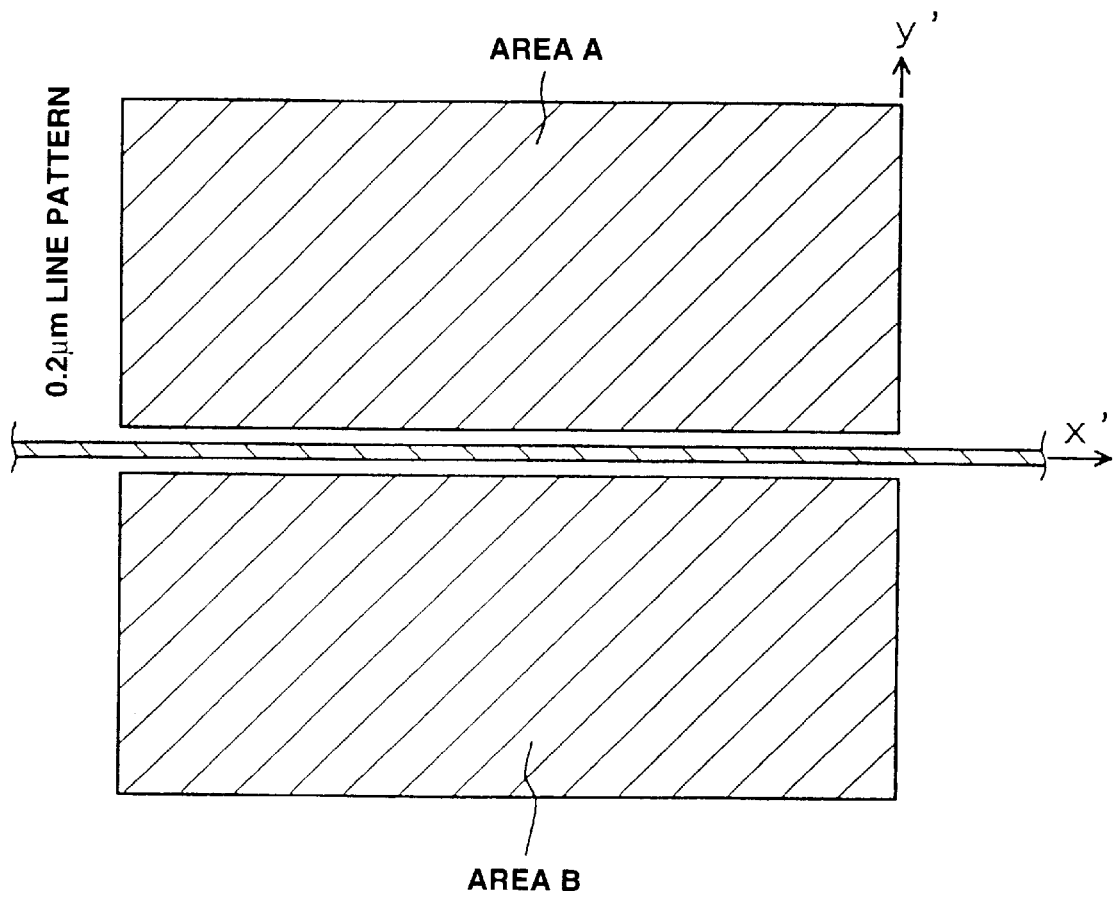
FIG. 2 shows a pattern employed in the method of the present invention.
Figure 3:
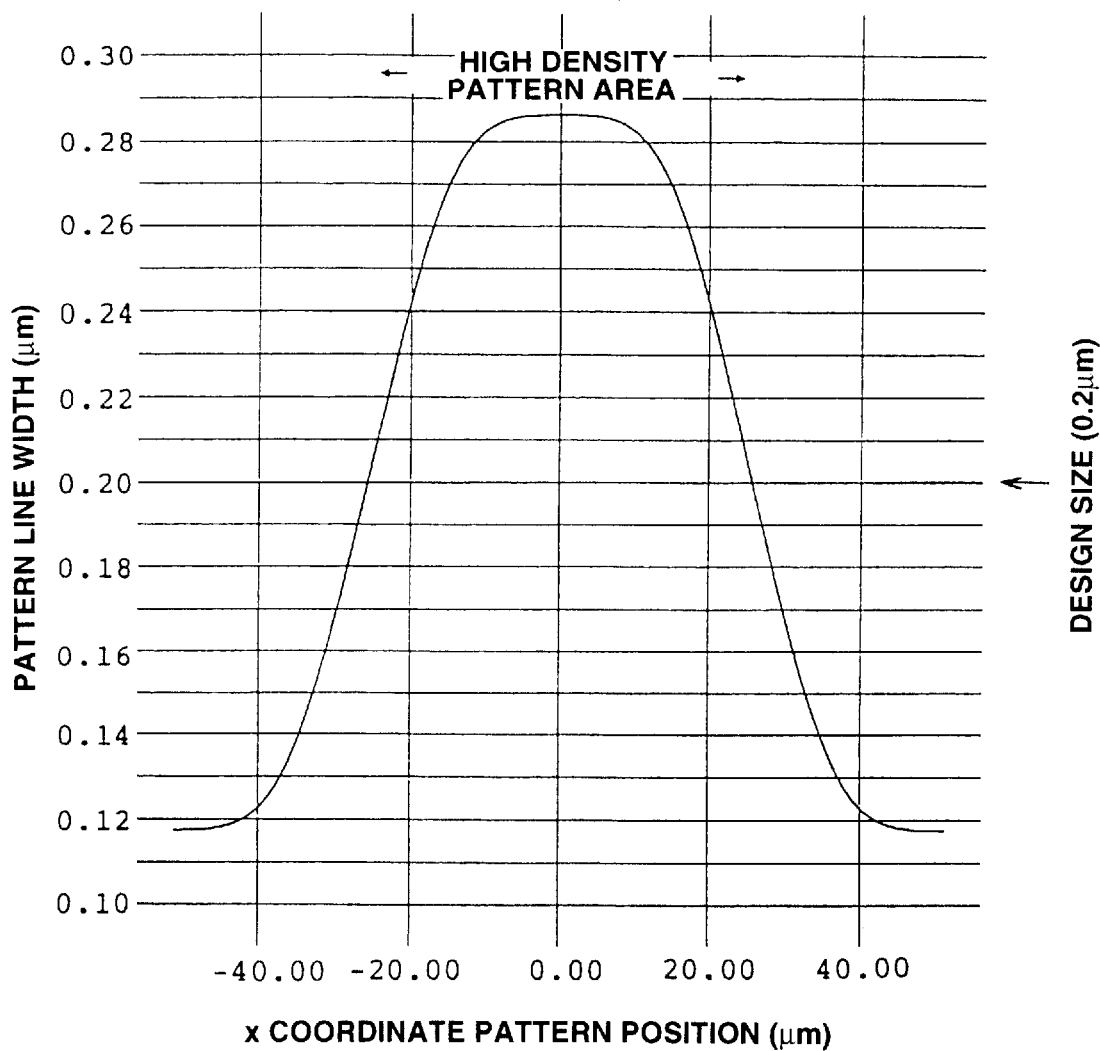
FIG. 3 shows the pattern line width transitions of fine line patterns (with a line width of 0.2 μm) in case no proximity effect correction has been done in the pattern shown in FIG. 2.

The results of calculations of the pattern line width transitions of fine line patterns (line width of 0.2 $\mu$m) in case of not performing proximity effect corrections in the pattern are shown in FIG. 2. Due to the proximity effect, significant pattern line width variations are produced between the area with the pattern density if 100% (high density pattern area) and the area with the pattern density of 0% (other areas). It is also seen that the proximity effect operates over a broad range of ±15 $\mu$m from the boundary area at which the pattern density undergoes variations.

The method for correcting the proximity effect according to the present invention resides in a proximity effect correcting method in a technique of electron ray lithography of radiating an electron ray beam on an electron ray photoresist material in a semiconductor substrate for delineating a pattern on the resist material, which method consists in dividing the pattern for delineation into plural unitary domains and correcting the exposure dose of the electron ray beam to be illuminated on each unitary domain in view of the accumulated energy ascribable to the backward scattering of the electrons. Specifically, the present method is a method of automatically extracting a unitary domain with a larger correction error of proximity effect correction based on the gradient vector distribution $\Delta_v \alpha (\Delta_v \alpha_{x-i, j}, \Delta_v \alpha_{y-i, j})$ at an averaged pattern areal density $\alpha'(i, j)$.

Figure 4:
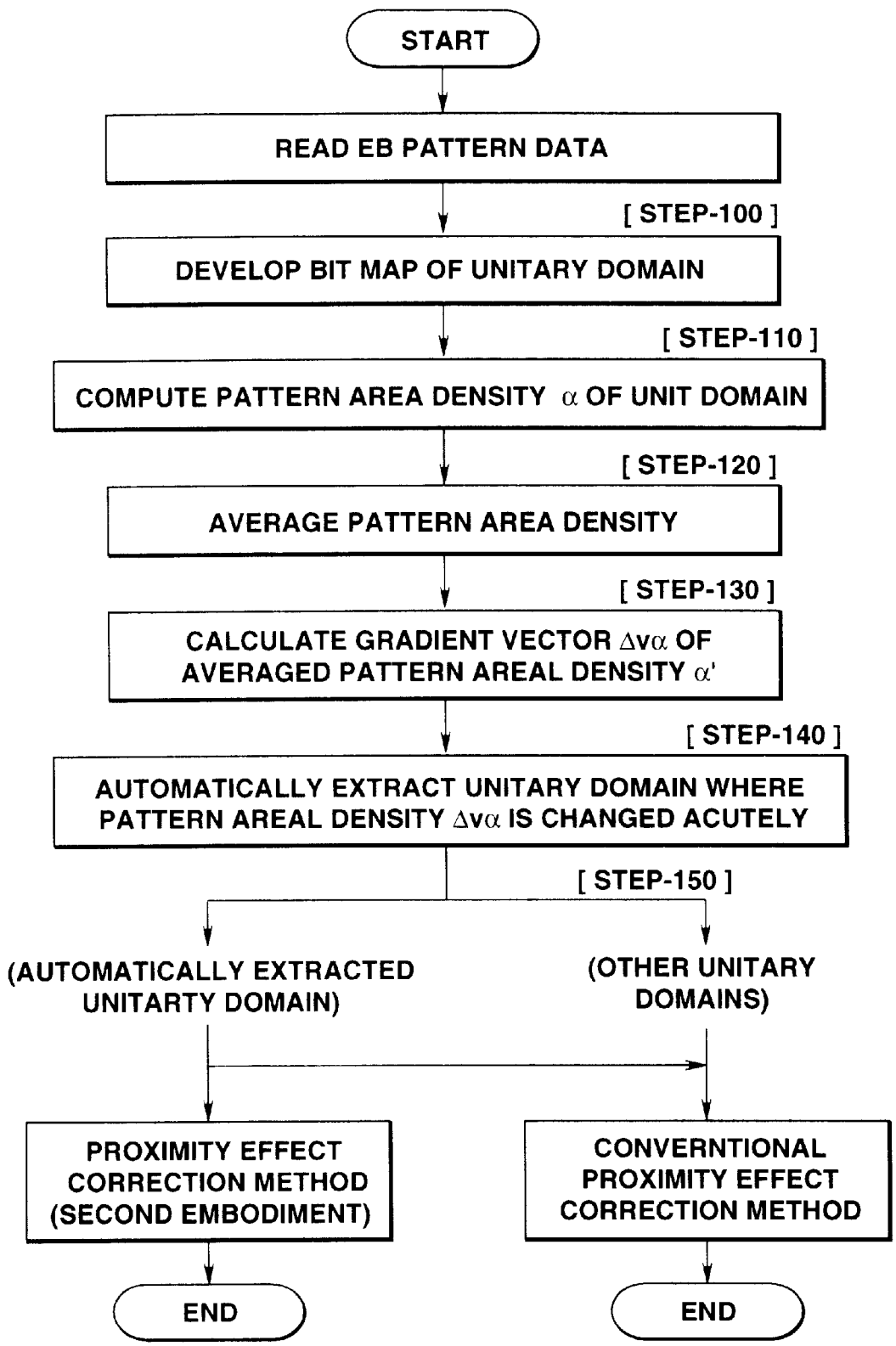
FIG. 4 is a flowchart for illustrating the proximity effect correcting method according to the present invention.

The method for correcting the proximity effect according to the present invention is explained with reference to a flowchart of FIG. 4. This proximity effect correcting method is comprised of the following steps:

[step-100] (bit map development of a unitary domain)

The step of reading a delineation pattern data (EB pattern data), dividing the delineation pattern data into pre-set unitary domains and bit-map-developing each unitary domain (mesh).

[step-110] (calculations of the pattern areal density of each unitary pattern)

The step of calculating a pattern areal density $\alpha$ in each unitary domain.

[step-120] (averaging of the pattern areal density)

The step of averaging the pattern areal density $\alpha$ in each unitary domain to find the averaged pattern areal density $\alpha'$.

[step-130] (calculations of the gradient vector of pattern areal density)

The step of calculating the gradient vector $\Delta_v \alpha$ of the averaged pattern areal density $\alpha'$.

[step-140] (automatic extraction of a unitary domain where the pattern areal density is changed acutely)

The step of extracting a unitary domain where the magnitude of the calculated gradient vector $\Delta_v \alpha$ is not less than a pre-set value $S_{th}$ for determining the unitary domain with large correction error of the proximity effect correction.

[step-150]

The proximity effect correction method according to the present invention s carried out for the thus determined unitary domain with the large correction error of the proximity effect correction. Alternatively, the conventional proximity effect correction method such as the sequential calculating method by representative point evaluation is carried out. For other unitary domains, the conventional proximity effect correction methods, such as representative figure method or areal density mapping method, are carried out.

Figure 5:
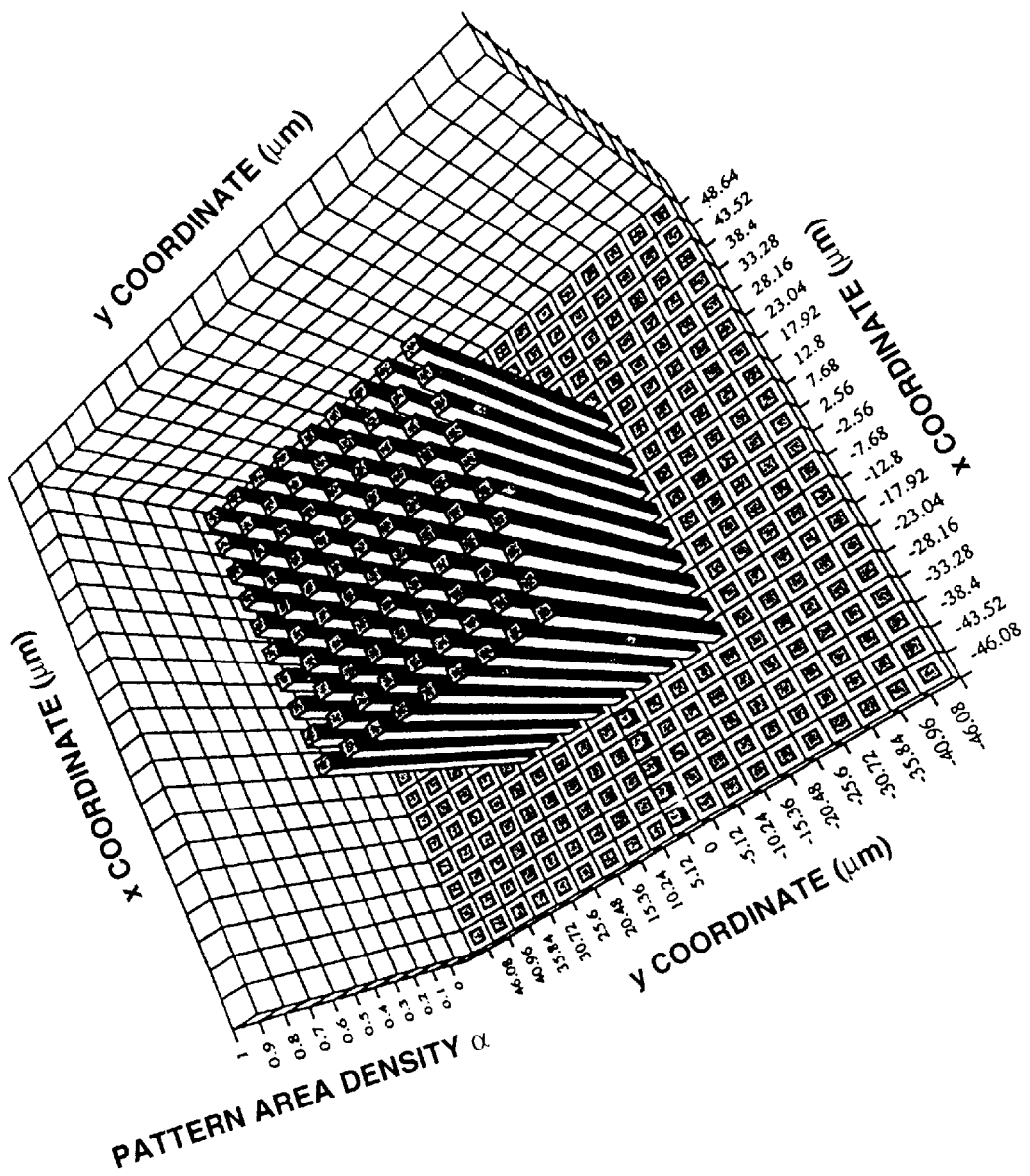
FIG. 5 illustrates the results of calculations of the unitary domain based pattern areal density.
Figure 6:
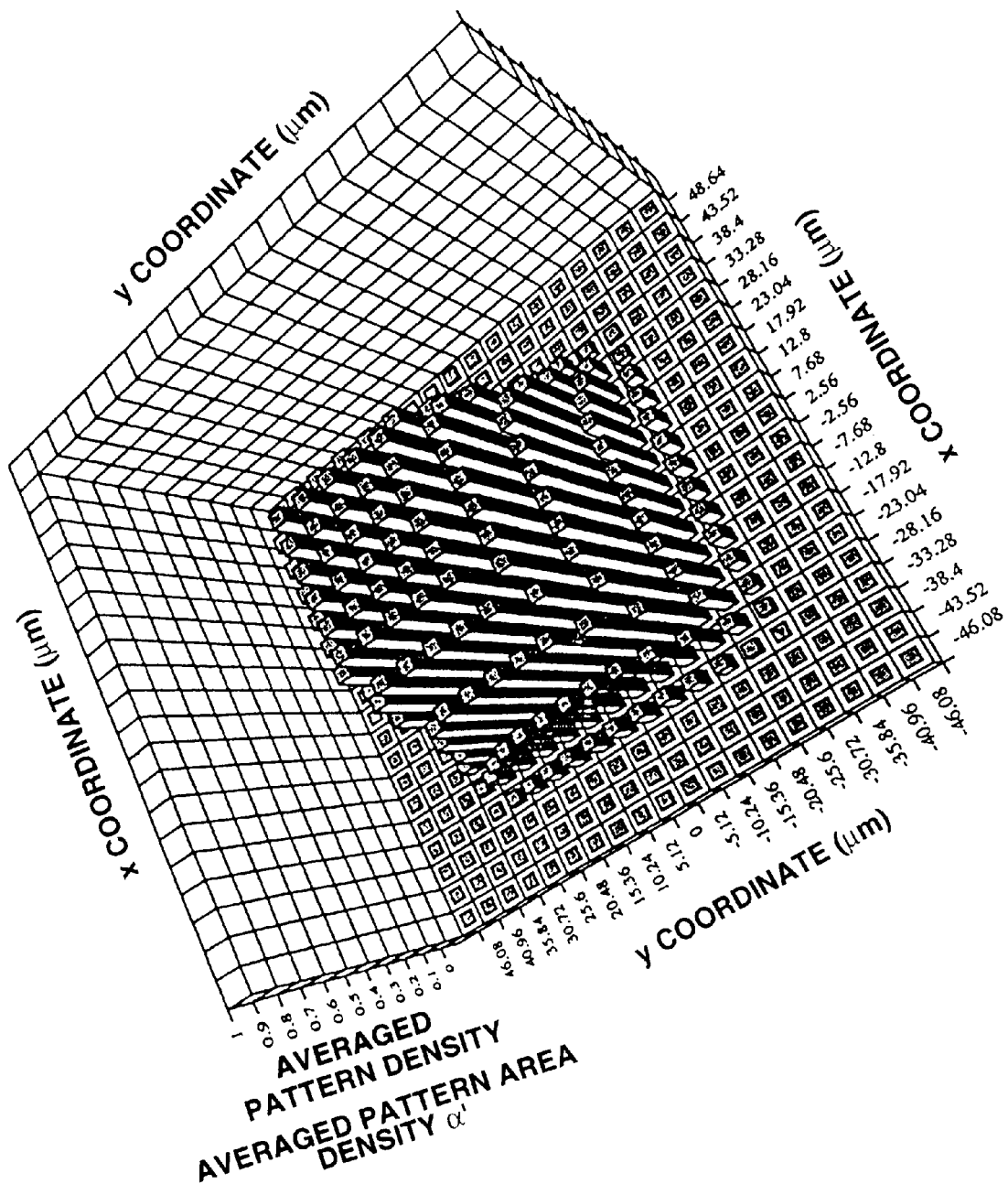
FIG. 6 shows the results of calculations of the averaged unitary domain based pattern areal density.

Since the algorithm of the conventional areal density mapping method (the steps [step-10] to [step-30] and step [step-100]) may be directly used as the steps [step-110] and [step-120], detailed description therefor is omitted, and the steps [step-130] and [step-140] are explained in detail. The results of calculations of the pattern areal density $\alpha$ for each unitary domain (mesh) are shown in FIG. 5. The results of calculations of the averaged pattern areal density $\alpha'$ for each unitary domain (mesh) are shown in FIG. 6.

[step-130] (calculations of the gradient vector f the pattern areal density)

Next to the step-120, the gradient vector $\Delta_v \alpha$ of the averaged pattern areal density $\alpha'$ is calculated. That is, the gradient vector $\Delta_v\alpha(\Delta_v\alpha_{x-i,j}, \Delta_v\alpha_{y-i,j})$ of the averaged pattern areal density $\alpha'(i, j)$ in each unitary domain is calculated by the equation (14-1) and (14-2). Specifically, if the averaged pattern areal density in a unitary domain (i, j) is given by $\alpha'(i, j)=(\alpha x'(i, j), \alpha y'(i, j))$, the gradient vector $\Delta_y\alpha(\Delta_v\alpha_{x-i,j}, \Delta_v\alpha_{y-i,j})$ of the pattern areal density $\alpha'(i, j)$ can be found by the median difference method. The method of finding the gradient vector $\Delta_v\alpha$ is not limited to this specified method. Meanwhile, W is the length of a side of the unitary domain (mesh size) and corresponds to the differential operator for the pattern areal density.

$$\Delta_v\alpha_{x-i,j}=\{\alpha_x'(i+1, j)-\alpha_x'(i-1, j)\}/2W \quad (14\text{-}1)$$

$$\Delta_v\alpha_{y-i,j}=\{\alpha_y'(i, j+1)-\alpha_y'(i, j-1)\}/2W \quad (14\text{-}2)$$

[step-140] (automatic extraction of a unitary domain where pattern areal density is changed acutely)

In a high acceleration voltage, the relation shown by the equation (15):

$$Eb(i, j)\approx\alpha'(i, j)\cdot D\cdot\eta/(1+\eta) \quad (15)$$

where D is the exposure dose, holds between the accumulated energy Eb(i, j) ascribable to backward scattering of all delineated figures in the unitary domain (i, j) and the averaged pattern areal density $\alpha'(i, j)$.

It is therefore assumed that the relation of the equation (15) roughly holds even in the boundary domain where the pattern areal density is varied acutely. Therefore, if the gradient vector of the accumulated energy ascribable to backward scattering is $\Delta_v Eb(i, j)=(\Delta_v Eb_{x-i,j})$, the gradient vector $\Delta_v Eb(i, j)$ of the accumulated energy may be found by the following equation (16-1) and (16-2):

$$\Delta_v Eb_{x-i,j}\approx\Delta_v\alpha_{x-i,j}\cdot D\cdot\eta/(1+\eta) \quad (16\text{-}1)$$

$$\Delta_v Eb_{y-i,j}\approx\Delta_v\alpha_{y-i,j}\cdot D\cdot\eta/(1+\eta) \quad (16\text{-}2)$$

At step-140, a unitary domain where the averaged pattern areal density $\alpha'$ is acutely changed is extracted, based on the calculated gradient vector $\Delta_v\alpha$, for determining the unitary domain with large correction error of the proximity effect correction. Stated differently, a unitary domain where the magnitude of the calculated gradient vector $\Delta_v\alpha$ exceeds the pre-set value $S_{th}$ is extracted for determining the unitary domain with large correction error of the proximity effect correction.

That is, the magnitude of the gradient vector $|\Delta_v\alpha(i, j)|$ (see the following equation (17) of the gradient vector $\Delta_v\alpha(i, j)$ of the averaged pattern areal density $\alpha'(i, j)$ or $|\Delta_v\alpha_{x-i,j}|$ and $|\Delta_v\alpha_{y-i,j}|$ is calculated in each unitary domain:

$$|\Delta_v\alpha(i, j)|=\{(\Delta_v\alpha_{x-i,j})^2+(\Delta_v\alpha_{y-i,j})^2\}^{1/2} \quad (17)$$

Figure 7:
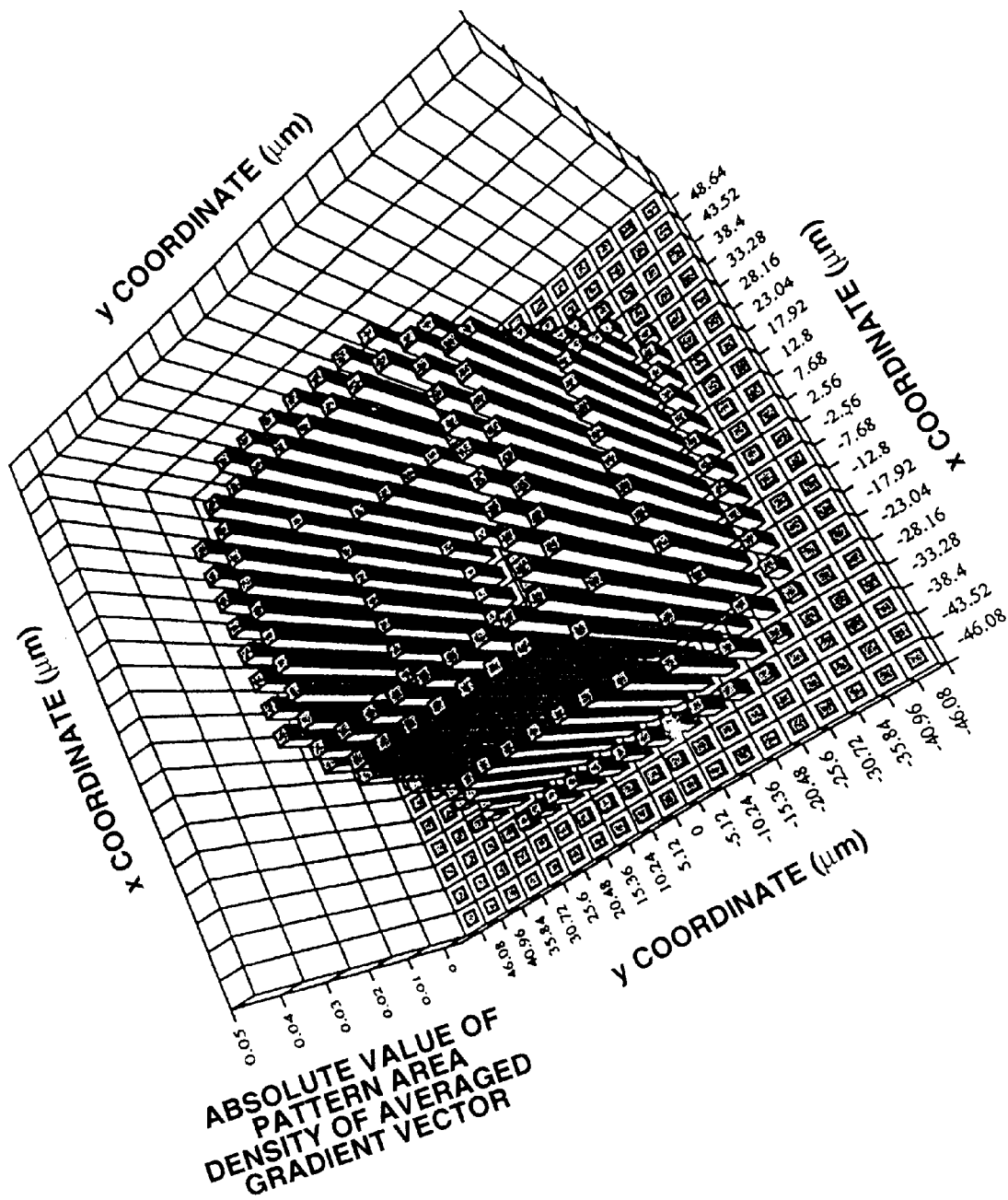
FIG. 7 shows the distribution of absolute values of the gradient vector of the averaged pattern areal density for the pattern shown in FIG. 2.

The distribution of absolute values of the gradient vector of the pattern areal density, corresponding to the averaged pattern areal density for the pattern shown in FIG. 2, is shown in FIG. 7. It can be predicted from FIG. 7 that, in high peak portions, the distribution of the accumulated energy ascribable to backward scattering is changed acutely.

Such a unitary domain (mesh) in which the magnitude $|\Delta_v\alpha(i, j)|$ of the gradient vector of the pattern areal density is not less than the pre-set threshold value (threshold value $S_{th}$) is automatically extracted. Alternatively, such a unitary domain (mesh) in which the value of $|\Delta_v\alpha x\_(i, j)|$ and/or $|\Delta_v y\_\alpha(i, j)|$ exceeds a pre-set threshold value (threshold value $S_{th-x}$ and threshold value $S_{th-y}$).

This enables automatic extraction of a unitary domain in which the variation in the accumulated energy Eb ascribable to the backward scattering caused by abrupt changes in the pattern areal density (unitary domain in which the non-corrected remnant portions of the proximity effect become outstanding). The presence or absence of each unitary domain (mesh) is represented by s(i, j). That is, s(i, j) is determined by the following equations (18-1) and (18-2):

$$s(i, j)=1 \text{ for } |\Delta_v\alpha(i, j)|\geq S_{th} \quad (18\text{-}1)$$

$$s(i, j)=0 \text{ for } |\Delta_v\alpha(i, j)|<S_{th} \quad (18\text{-}2)$$

The threshold value $S_{th}$ (or $S_{th-x}$ and $S_{th-y}$) represent a value as a criterion for non-corrected remnant portion of the proximity effect which may be determined experimentally or empirically. However, it may also be determined by the following method:

If the magnitude of the gradient vector of the pattern areal density of the unitary domain (i, j) under consideration is $|\Delta_v\alpha(i, j)|$, the variation in the exposure dose in the x-axis direction and that in the y-axis direction, ascribable to the backward scattering at both ends in the unitary domain, that is $|\Delta_v\alpha Eb_{x-i,j}|\cdot W$ and $|\Delta_v\alpha Eb_{y-i,j}|\cdot W$, can be expressed by the following equations (19-1) and (19-2):

$$|\Delta_v Eb_{x-i,j}|\cdot W\approx|\Delta_v\alpha_{x-i,j}|\cdot W\cdot Ds\cdot\eta/(1+\eta) \quad (19\text{-}1)$$

$$|\Delta_v Eb_{y-i,j}|\cdot W\approx|\Delta_v\alpha y_{-i,j}|\cdot W\cdot Ds\cdot\eta/(1+\eta) \quad (19\text{-}2)$$

The rate of line width variation (the rate of line width variation in a unitary domain) relative to the rate of variation of the exposure light volume for pattern density of 50% with respect to the rate of variation in the exposure light volume for a pattern density of 50% ($|\Delta Eb|/Ds$) is $\Delta L$. The value of $\Delta L$ can be found experimentally or by simulation. The amount of line width variation at each end of a unitary domain $\Delta L_{mesh}$ ($\Delta L_{mesh-x}$, $\Delta L_{mesh-y}$) can be found, based on the above equations (19-1) and (19-2), from the following equations (20-1), (20-2):

$$\Delta L_{mesh\_x} \approx \Delta L\cdot(|\Delta_v Eb_{x\_i,j}|/D_s)\cdot W \quad (20\text{-}1)$$
$$\approx \Delta L\cdot|\Delta_v\alpha_{x\_i,j}|\cdot W\cdot\eta/(1+\eta)$$

$$\Delta L_{mesh\_y} \approx \Delta L\cdot(|\Delta_v Eb_{y\_i,j}|/D_s)\cdot W \quad (20\text{-}2)$$
$$\approx \Delta L\cdot|\Delta_v\alpha_{y\_i,j}|\cdot W\cdot\eta/(1+\eta)$$

If $\Delta L_{tol}$ ($\Delta L_{tol-x}$, $\Delta L_{tol-y}$) denote the tolerances for the line width variation in a unitary domain, since it suffices if the maximum value of the line width variation $\Delta L_{mesh}$ is not more than $\Delta L_{tol}$, the equations (20-1) and (20-2) can be rewritten to the following equations (21-1) and (21-2):

$$\Delta L_{tol-x}\geq\Delta L\cdot|\Delta_v\alpha_{x-i,j}|\cdot W\cdot\eta/(1+\eta) \quad (21\text{-}1)$$

$$\Delta L_{tol-y}\geq\Delta L\cdot|\Delta_v\alpha_{y-i,j}|\cdot W\cdot\eta/(1+\eta) \quad (21\text{-}2)$$

If the above equations (21-1) and (21-2) are modified to a generic form, the following equations (22-1), (22-2) are obtained:

$$\Delta L_{tol-x}\cdot(1+\eta)/(\Delta L\cdot W\cdot\eta)\geq|\Delta_v\alpha_{x-i,j}| \quad (22\text{-}1)$$

$$\Delta L_{tol-y}\cdot(1+\eta)/(\Delta L\cdot W\cdot\eta)\geq|\Delta_v\alpha_{y-i,j}| \quad (22\text{-}2)$$

Therefore, it suffices if the threshold value $S_{th}$ ($S_{th-x}$, $S_{th-y}$) is determined, based on the equations (22-1) and (22-2), in accordance with the following equations (23-1) and (23-2):

$$S_{th-x}=|\Delta_v\alpha_{x-i,j}|=\Delta L_{tol-x}\cdot(1+\eta)/(\Delta L\cdot W\cdot\eta) \quad (23\text{-}1)$$

$$S_{th-y}=|\Delta_v\alpha_{y-i,j}|=\Delta L_{tol-y}\cdot(1+\eta)/(\Delta L\cdot W\cdot\eta) \quad (23\text{-}2)$$

Since $\Delta L_{tol\_x}$ and $\Delta L_{tol\_y}$ can be set at the same value ($\Delta L_{tol}$), the equations (23-1) and (23-2) can generally be expressed by the following equation (24):

$$S_{th} = \{\Delta L_{tol}/(\Delta L \cdot W)\} \cdot \{(1+\eta)/\eta\} \quad (24)$$

Figure 8:
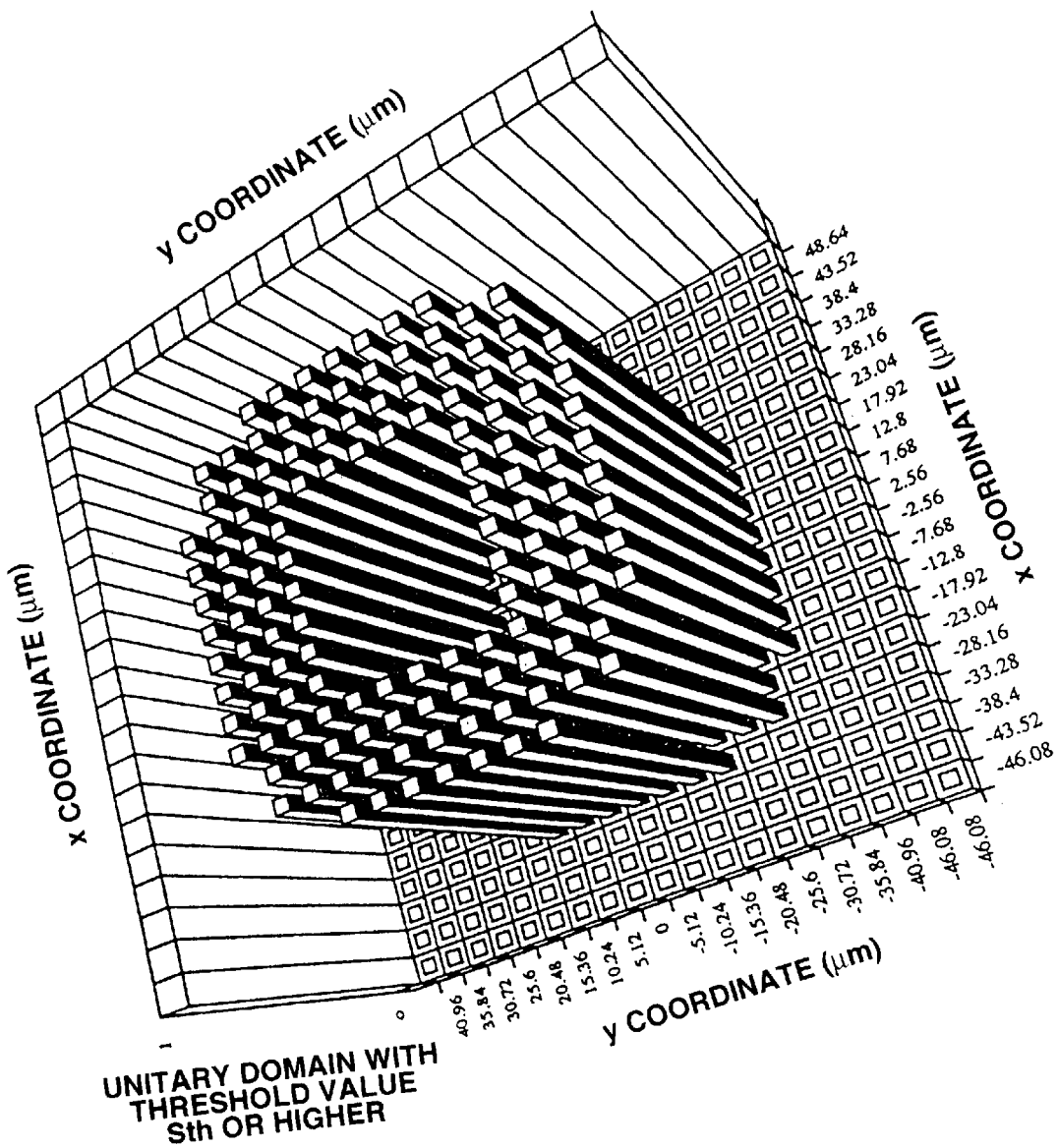
FIG. 8 shows the results of threshold value processing of the gradient vector of the pattern areal density shown in FIG. 7 for extracting the unitary domain where the pattern areal density is changed acutely.

The gradient vector of the pattern areal density shown in FIG. 7 was processed with threshold processing and such unitary domains (meshes) in which the calculated magnitude of the gradient vector is not less than the pre-set value $S_{th}$, that is in which the pattern areal density is changed acutely, The results are shown in FIG. 8.

The proximity effect correcting method of higher precision, such as the proximity effect correcting method now explained or the sequential calculation method by representative point evaluation, is applied to the unitary domains, automatically extracted b y the above-described method, where the pattern areal density is changed acutely. For other unitary domains, simplified proximity effect correction methods, such as the conventional area density mapping method, may be applied directly. That is, the correction equation shown by the following equation (25):

$$D_{cor}(i, j) = D_s \cdot (1+\eta)/\{1+2\alpha'(i, j)\cdot\eta\} \quad (25)$$

may be used for obtaining the exposure dose $D_{cor}(i, j)$ corrected for the proximity effect.

Then, for a unitary domain extracted by the above-mentioned method, having a larger correction error of the proximity effect correction, that is a unitary domain with s(i, j)=1, the corrected exposure dose is optimized.

Figure 37:
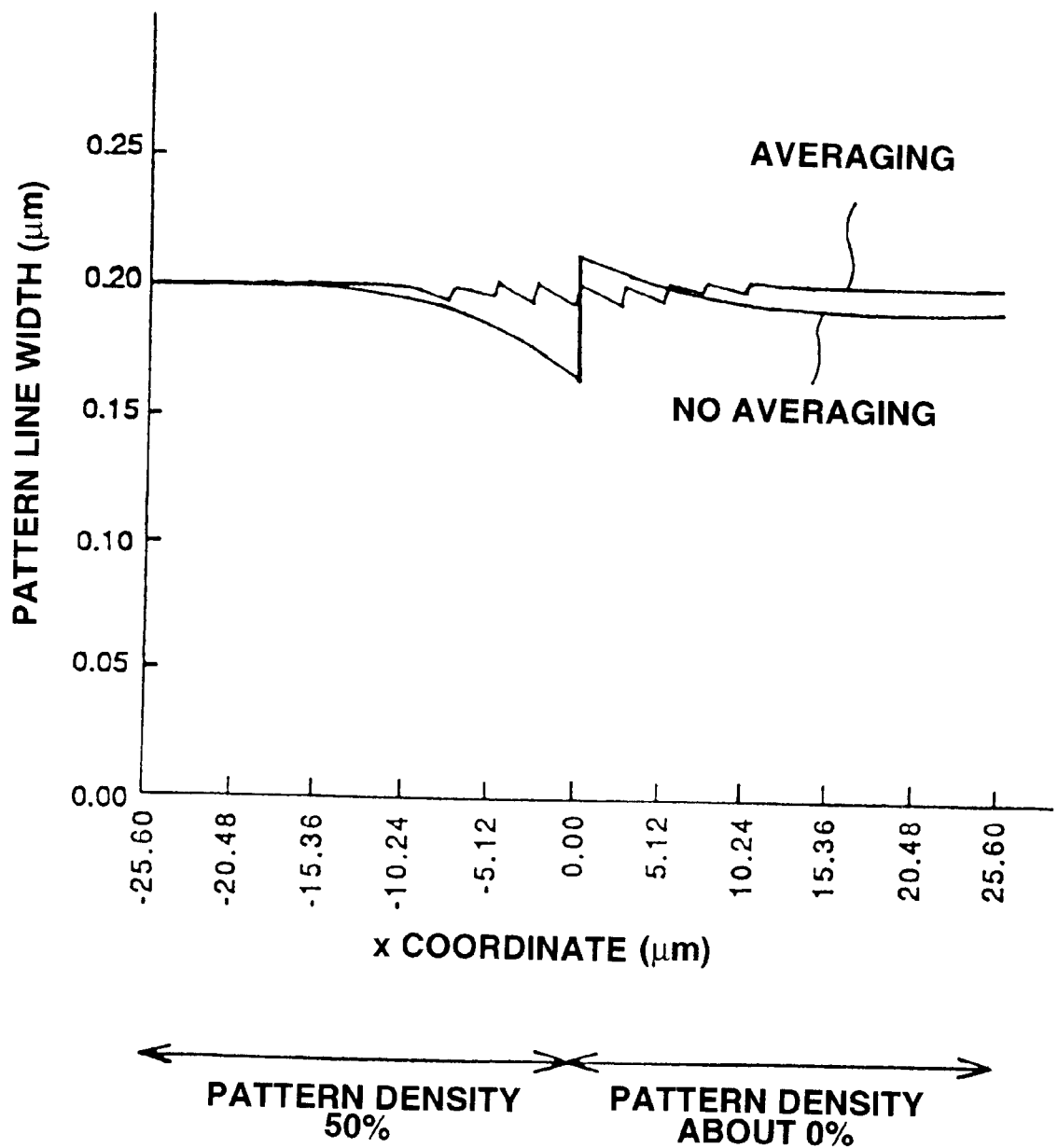
FIG. 37 shows the pattern line width transitions in a model pattern shown in FIG. 31 in case the proximity effect has been corrected by the conventional areal density mapping method.
Figure 38:
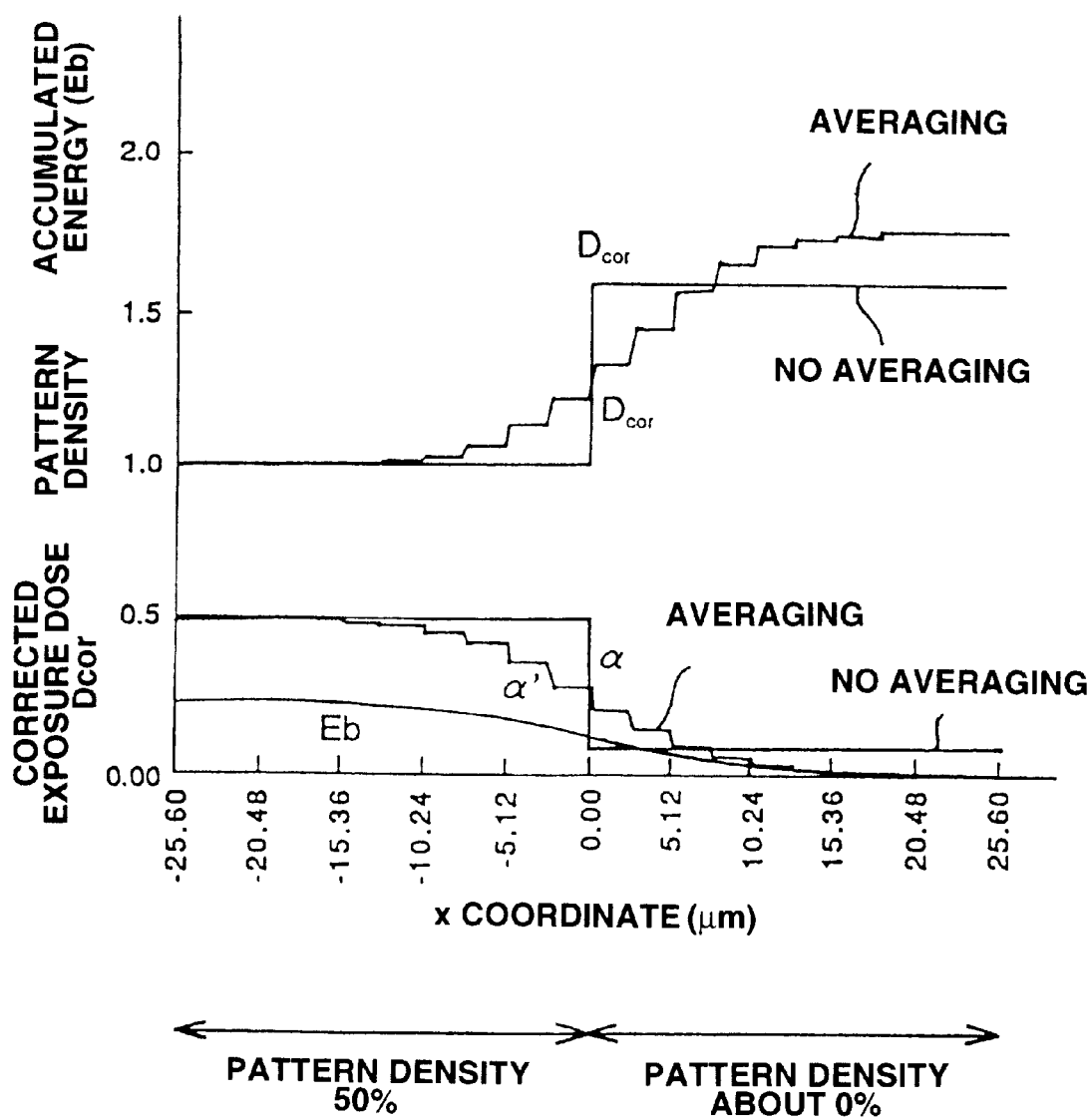
FIG. 38 shows the results of the proximity effect correction by the conventional areal density mapping method.
Figure 39:
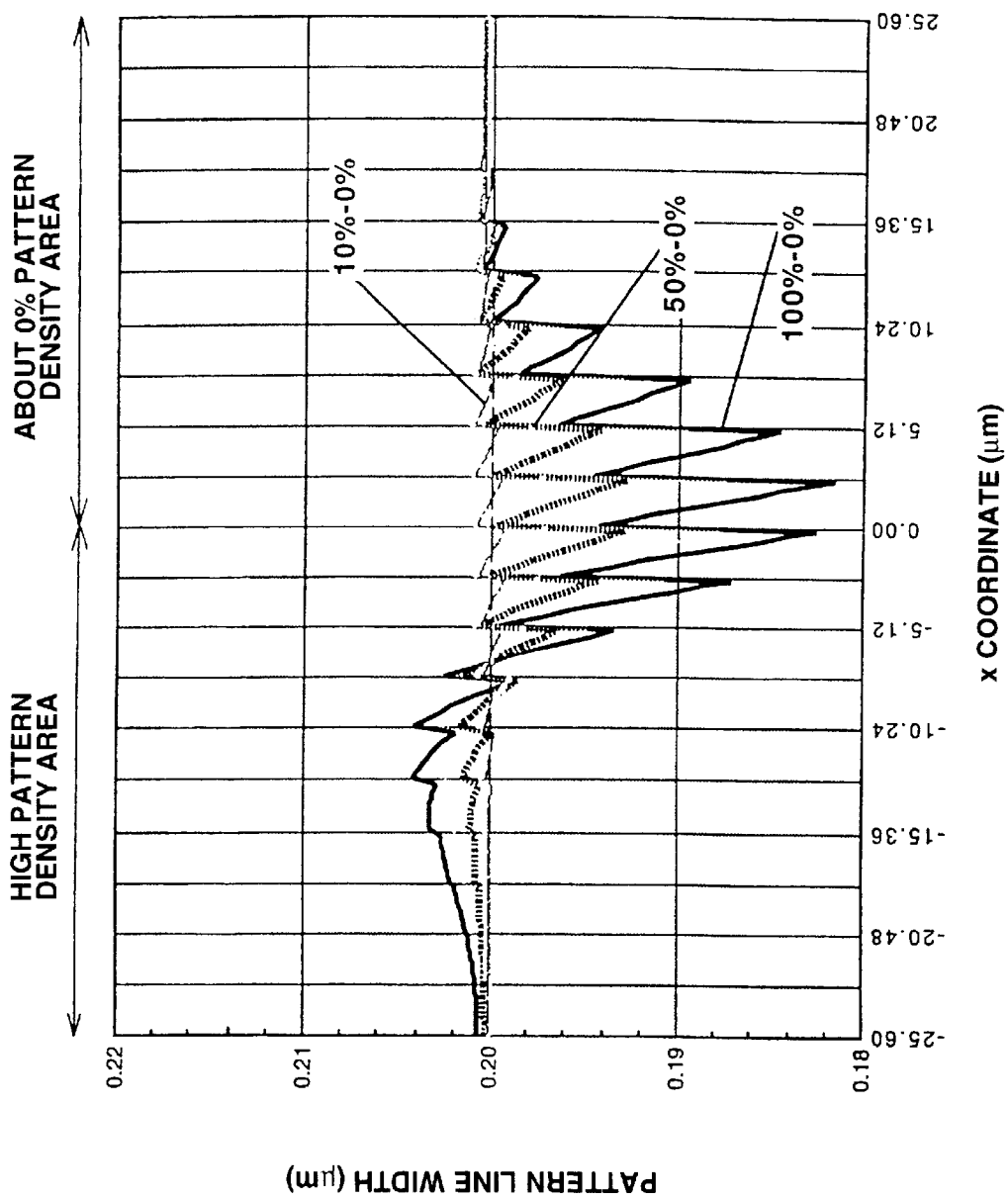
FIG. 39 shows the serrated non-corrected remnant portions produced in the boundary area with the conventional areal density mapping method.

As for the corrected exposure dose, calculated by the areal density mapping method, the calculations for correction per se lack in self-consistency in the boundary area where the pattern areal density is varied acutely. That is, since the corrected exposure dose $D_{cor}$ has stepped transitions in terms of the pattern areal density, non-corrected remnant portions are produced basically unavoidably in unitary domains in the boundary area. Thus, in the boundary area, serrated non-corrected remnant portions are generated, as shown in FIGS. 37 and 39, so that the pattern line width is changed. Moreover, the corrected exposure dose at the center of the unitary domain is deviated from an appropriate value.

Figure 9:
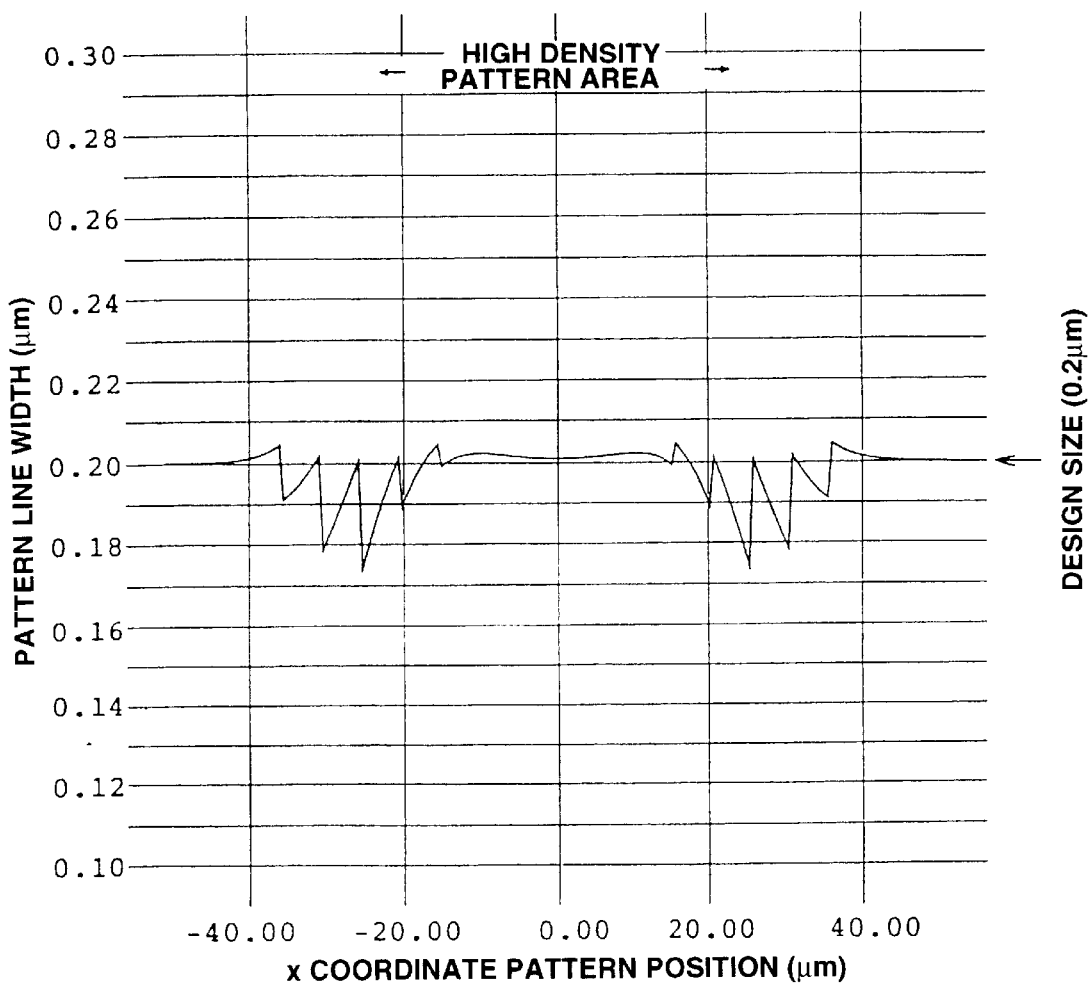
FIG. 9 shows pattern line width transitions of a fine line pattern (line width, 0.2 μm) in the pattern shown in FIG. 2 in case of using the conventional areal density mapping method.
Figure 10:
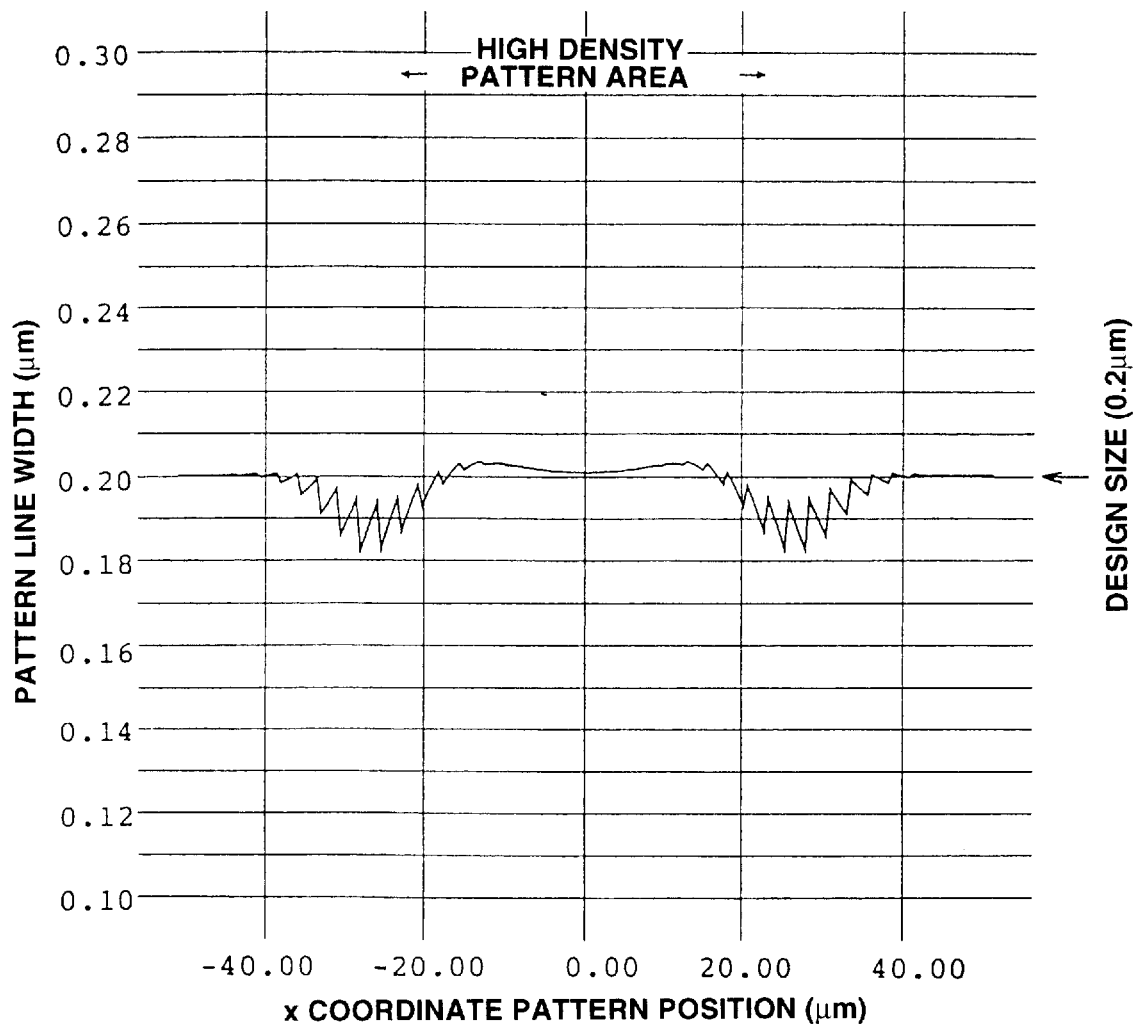
FIG. 10 shows pattern line width transitions of a fine line pattern (line width, 0.2 μm) in case the length of a side of a unitary domain (mesh size) is changed from 5.12 μm to 2.56 μm.

FIG. 9 shows changes in the pattern line width of a fine line pattern (line with of 0.2 $\mu$m) in the pattern shown in FIG. 2 in case of using the conventional areal density mapping method. For averaging, an optimum condition which minimizes the line width variation is selected (averaging range Rsm: 3×3, number of times of averaging operations Nsm, three). Since not only the line with is changed in a serrated fashion in each unitary domain, but also the line width is narrower than the target value, it is seen that the corrected light volume in each unitary domain in the boundary area is shifted at all times towards the insufficient exposure dose side. That is, the corrected exposure dose at the center of the unitary domain (mesh) is deviated from am appropriate value. If the length of a side of a unitary domain (W) (mesh size) is changed from 5.12 $\mu$m to 2.56 $\mu$m, errors in the corrected exposure dose at the center of the unitary domain in the boundary area is inevitably produced (see FIG. 10).

Figure 11:
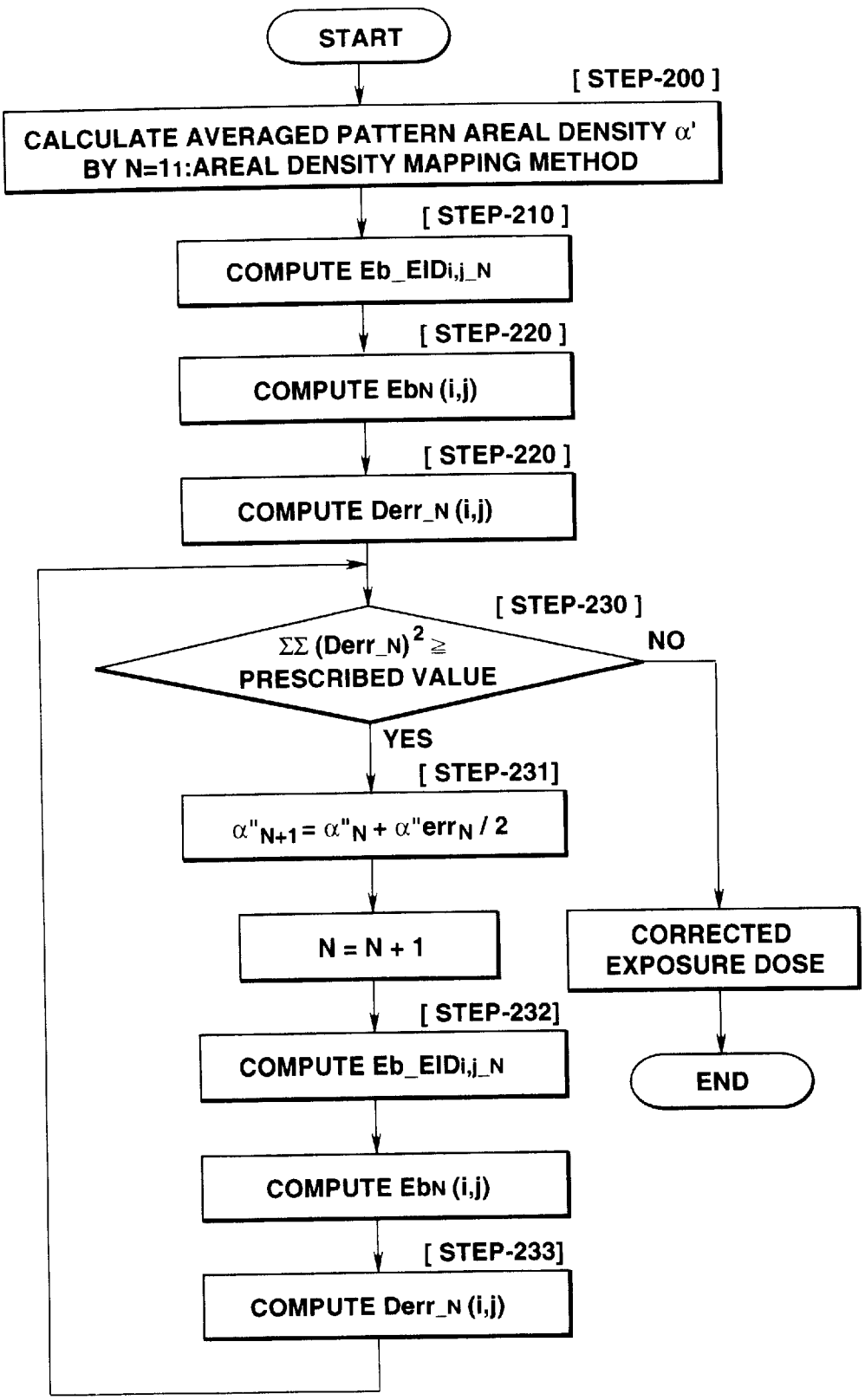
FIG. 11 is a flowchart for illustrating a modification of the proximity effect correction method according to the present invention.

For the unitary domain, extracted by the above-described automatic extraction method for extracting the unitary domain where the pattern areal density undergoes acute changes, the corrected exposure dose is optimized, using the corrected exposure dose, calculated by the areal density mapping method, as an initial value. Referring to the flow-chart of FIG. 11, the process of optimizing the corrected exposure light volume is now explained.

[step-200]

As in the above-mentioned step [step-100], delineation pattern data (EB pattern data) is read. The delineation pattern data is then divided in terms of pre-set unitary domains as units and each such unitary domain is bit-map developed to calculate the pattern areal density as in step [step-110]. Then, as in the step [step-120], the pattern areal density in each unitary domain is averaged and averaged pattern areal density $\alpha'$n, where N=1, is calculated. Then, as in step [step-130], the gradient vector of the averaged pattern areal density is calculated. Then, as in the step [step-140], such a unitary domain in which the magnitude of the calculated gradient vector exceeds the pre-set value ($S_{th}$) is extracted, for determining the unitary domain having a large correction error of the proximity effect correction.

[step-210]

Then, in each unitary domain, that is at such a unitary domain having large correction error of the proximity effect correction determined by the step [step-200], the accumulated energy ascribable to the backward scattering is calculated based on the EID function. That is, with the initial value (N=1), the accumulated energy $Eb\_EID_{i,j\_N}$ ascribable to backward scattering is calculated based on the EID function at the center ($X\_c$, $Y\_c$) of the unitary domain (i, j) where the pattern areal density is changed acutely (or at the areal center of gravity $X\_g$, $Y\_g$). Meanwhile, if each of the surrounding unitary domains (p, q) influencing the unitary domain (i, j) is deemed to be a square (with a side W and with a center coordinate of Xp, Yp, having a exposure dose corresponding to the pattern areal density, the accumulated energy $Eb\_EID_{i,j\_N}$ can be found from the following equations (26), (27-1) and (27-2). In the equation (26), DN denotes the exposure dose, with N=1. In the equation (27-1), the accumulated energy $Eb\_EID_{i,j\_N}$ ascribable to backward scattering in the center of gravity ($X\_c$, $Y\_c$) of the unitary domain (i, j) is calculated based on the EID function. However, if the accumulated energy $Eb\_EID_{i,\ j\_N}$ ascribable to the backward scattering, at the areal center of gravity ($X\_g$, $Y\_g$), is calculated based on the EID function, it suffices to substitute $X\_g$, $Y\_g$ for $X\_c$, $Y\_c$ in the equation (27-1). The right side of the equation (27-1), except the term of $D_N$, is constant even if N is changed. Therefore, it suffices to calculate the value of the right side of the equation (27-1) only once.

$$D_N(i, j) = D_s \cdot (1+\eta)/\{(1+2\alpha'_N(i, j)\cdot\eta\} \quad (26)$$

$$eb_{p,q}(X_{-c}, Y_{-c}) = D_N \frac{\eta\alpha'(i, j)}{\pi\beta_b(1+\eta)} \times \int_{X_{p-w/2}}^{X_{p+w/2}} \times \int_{Y_{p-w/2}}^{Y_{p+w/2}} \frac{(Y_{-c}-y')}{\beta_b^2} dy' \quad (27\text{-}1)$$

$$Eb\_EID_{i,jN}(X_{-c}, Y_{-c}) = \sum_{p=0}^{m}\sum_{q=0}^{n} eb_{p,q}(X_{-c}, Y_{-c}) \quad (27\text{-}2)$$

[step-220]

The accumulated energy is calculated in accordance with the following equation (28):

$$EbN(i, j) = \alpha'N(i, j) \cdot Ds \cdot \eta/\{1+2\alpha'N(i, j)\cdot\eta\} \quad (28)$$

The error in light exposure Derr_N(i, j) at the center of the unitary domain (i, j) or at the areal center of gravity is found by the following equation (29), where N=1. The error in light exposure Derr_N, found by the equation (28), is a difference between the accumulated energy Eb_EIDi,j_N as found by the EID function (see the equations 26, 27-1 and 27-2) and EbN(i, j) as calculated from the equation (28).

$$Derr\_N(i, j) = Eb\_EIDi, j\_N(i, j) - EbN(i, j) \quad (29)$$
$$= Eb\_EIDi, j\_N(i, j) -$$
$$\alpha'N(i, j) \cdot Ds \cdot \eta / \{1 + 2\alpha'N(i, j) \cdot \eta\}$$

[step-230]

If the sum Σ of squares of the differences Derr_N in the respective unitary domains as found at step [step-220] or ΣΣ[Derr_N(i, j)]2, where N=1, is not less than a prescribed value, the following processing is executed. If the square sum is less than the prescribed value, the step [step-240] as later explained is executed. The prescribed value can be previously set by experiments or simulation.

[step-231]

The pattern areal density $\alpha'1$ or $\alpha''N$ is corrected and the accumulated energy is calculated based on the corrected pattern areal density. That is, if the value is not less than a prescribed value, $\alpha'1(i, j)$ or $\alpha''N(i, j)$, where N=2, 3, 4, ..., is corrected to obtain $\alpha''N+1(i, j)$. Meanwhile, $\alpha'$ means an averaged pattern areal density. For demarcating the corrected pattern areal density from the averaged pattern areal density, the corrected pattern areal density is denoted by $\alpha''$. It is noted that the magnitude of $\alpha'err\_1$ or $\alpha''err\_N$ is essentially arbitrary and may be selected so that the equation (29) will be converged.

$$\alpha''2(i, j) = \alpha'1(i, j) + \alpha'err\_1(i, j)/2$$

or $$\alpha''N+1(i, j) = \alpha''N(i, j) + \alpha''err\_N(i, j)/2 \quad (30\text{-}1)$$

where $$\alpha'err\_1(i, j) \quad (30\text{-}2)$$
$$= \alpha'1(i, j) -$$
$$Eb\_EIDi, j\_1(i, j)/$$
$$[\eta \cdot \{Ds - 2Eb\_EIDi, j\_1(i, j)\}]$$

or $$\alpha'err\_N(i, j)$$
$$= \alpha''N(i, j) -$$
$$Eb\_EIDi, j\_N(i, j)/$$
$$[\eta \cdot \{Ds - 2Eb\_EIDi, j\_N(i, j)\}]$$

Then, N is incremented, and the accumulated energy is calculated in accordance with the following equation (31) based on the corrected pattern areal density $\alpha''$. Meanwhile, $\alpha''N(i, j)$ in the equation (31) is equal to $\alpha''2(i, j)$ or $\alpha''N+1(i, j)$ in the equation (30-1).

$$EbN(i, j) = \alpha''N(i, j) \cdot Ds \cdot \eta/(1 + 2\alpha''N(i, j) \cdot \eta) \quad (31)$$

[step-232]

Based on the accumulated energy ascribable to backward scattering, the following equation (32):

$$D_N(i, j) = D_s \cdot (1+\eta)/\{1 + 2\alpha''N(i, j) \cdot \eta\} \quad (32)$$

is calculated based on the EID function and the corrected pattern areal density, from the above equation (27-1) and (27-2).

[step-233]

The error in the exposure dose Derr_N(i, j) at the center or areal center of gravity of the unitary domain I9, j) is found based on the following equation (33):

$$Derr\_N(i, j) = Eb\_EIDi, j\_N(i, j) - EbN(i, j) \quad (33)$$
$$= Eb\_EIDi, j\_N(i, j) -$$
$$\alpha''N(i, j) \cdot Ds \cdot \eta / \{1 + 2\alpha''N(i, j) \cdot \eta\}$$

[step-234]

If the sum Σ of the squares of the differences Derr_N(i, j) in each unitary domain as found by the step [step-233], or ΣΣ[Derr_N(i, j)]2, is not less than a prescribed value, processing reverts to step [step-231]. If the sum Σ is less than the prescribed value, the following step [step-240] is executed.

Figure 12:
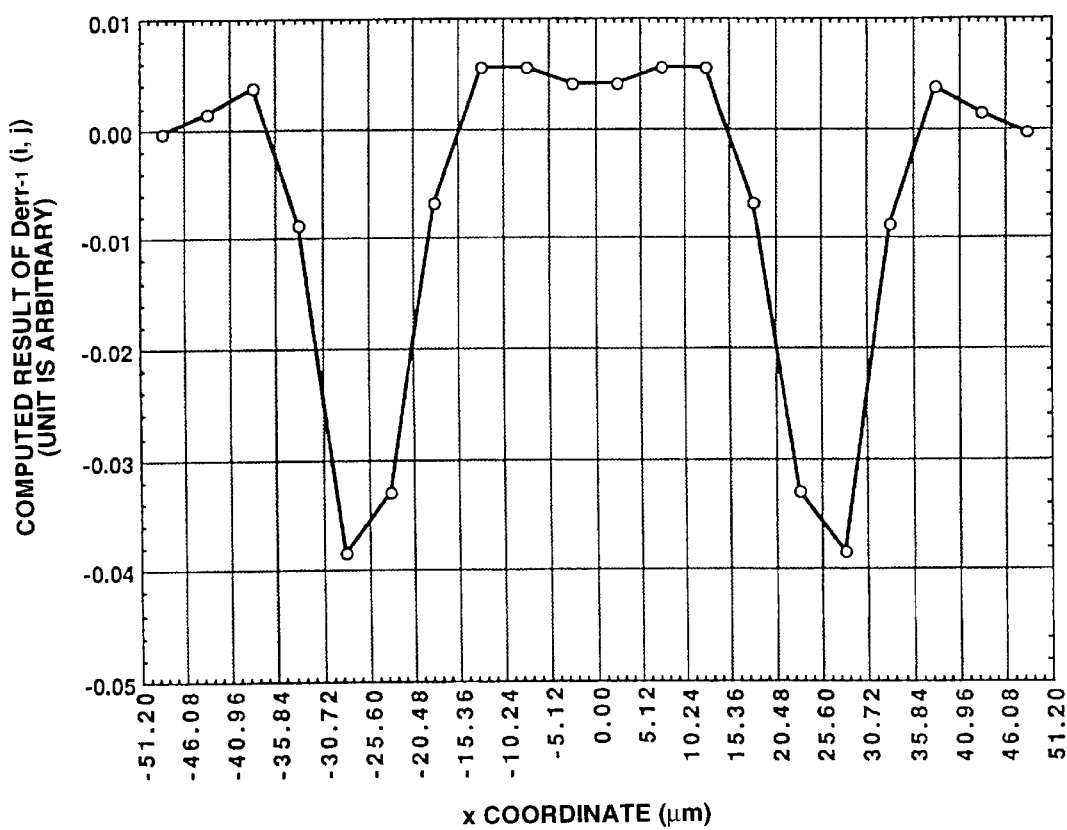
FIG. 12 shows the results of calculations results of calculations of $Derr_{\_N}(i,\,j)$ of the equation (28) for N=1 (initial condition: conventional method).

By repeating the steps [step-231] to [step-234] usually four to five times (that is, N=5 to 6), an optimum pattern areal density $\alpha''N(i, j)$ at the center or at the areal center of gravity in each unitary domain is set to determine an optimum corrected exposure dose. If a magnitude of the unitary domain (mesh size, W) larger than a pre-set value is set for the radius of backward scattering $\beta_b$, convergence can occur easily. The results of calculations of Σ[Derr_N(i, j)] of the equation (29) for N=1 (initial condition: conventional method) are shown in FIG. 12. It is seen that, with the conventional method, the light exposure is insufficient in the vicinity of the boundary area.

[step-240]

The corrected exposure dose of the electron ray beam in the unitary domain (i, j) is corrected, based on the corrected pattern areal density $\alpha''N(i, j)$ obtained by repetition of the last step [step-231], in accordance with the following equation (34):

$$D_{cor}(i, j) = Ds \cdot (1+\eta)/\{1 + 2\alpha''N(i, j) \cdot \eta\} \quad (34)$$

Alternatively, the corrected exposure dose of the electron ray beam in the unitary domain may also be calculated, based on the corrected pattern areal density $\alpha''N(i, j)$ obtained by repetition of the last step [step-231], the above equation (32) and the equations (27-1) and (27-2), in accordance with the following equation (35):

$$D_{cor}(i, j) = (1+\eta)\{Ds - Eb\_EIDi, j\_N(i, j)\} \quad (35)$$

Figure 13:
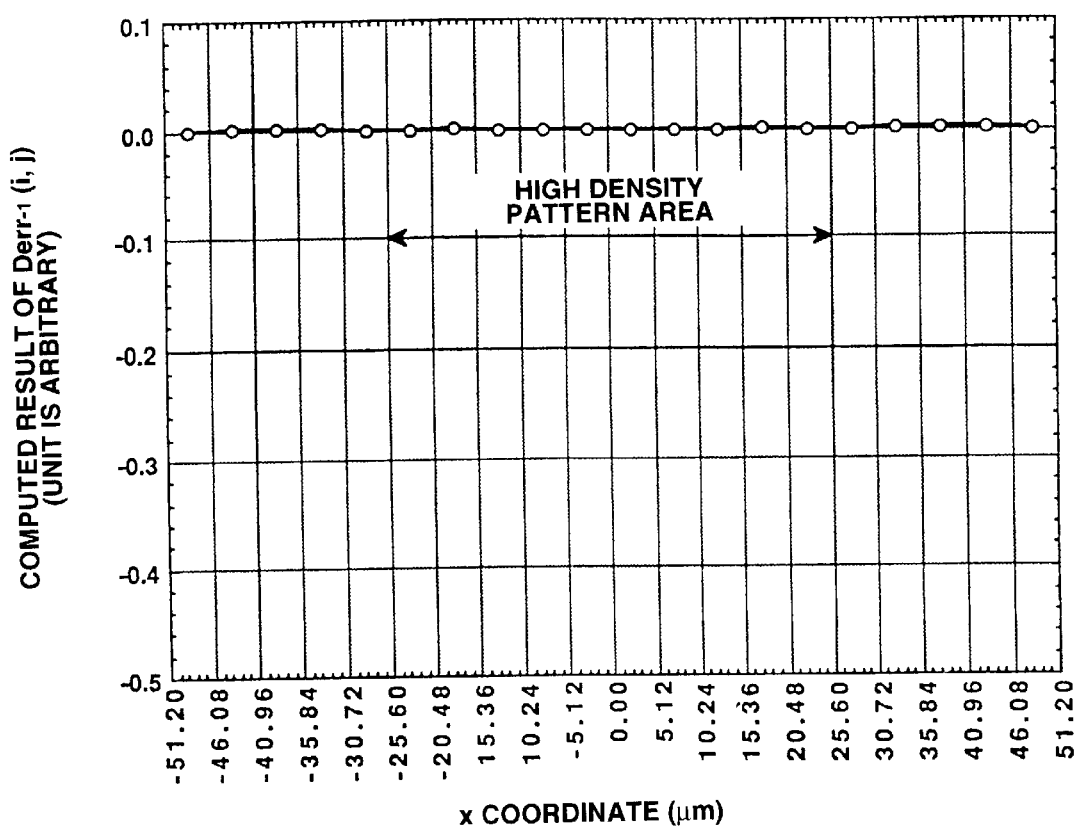
FIG. 13 shows the results of calculations of $Derr_{\_N}(i,\,j)$ of the equation (32) in case the corrected exposure dose has been optimized with a unitary domain in the boundary area as a unit.
Figure 14:
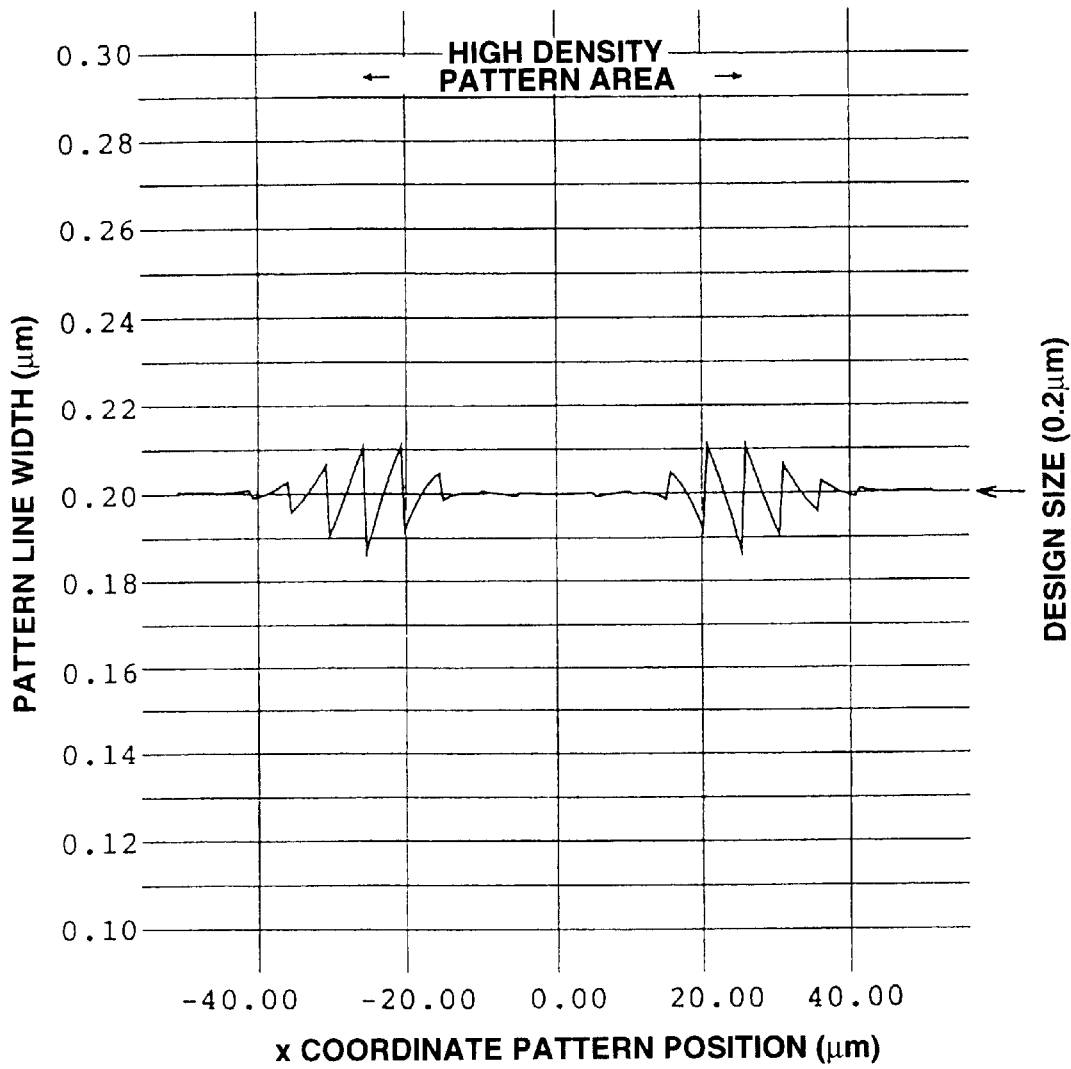
FIG. 14 shows the pattern line width of a fine line pattern (line width of 0.2 μm).
Figure 15:
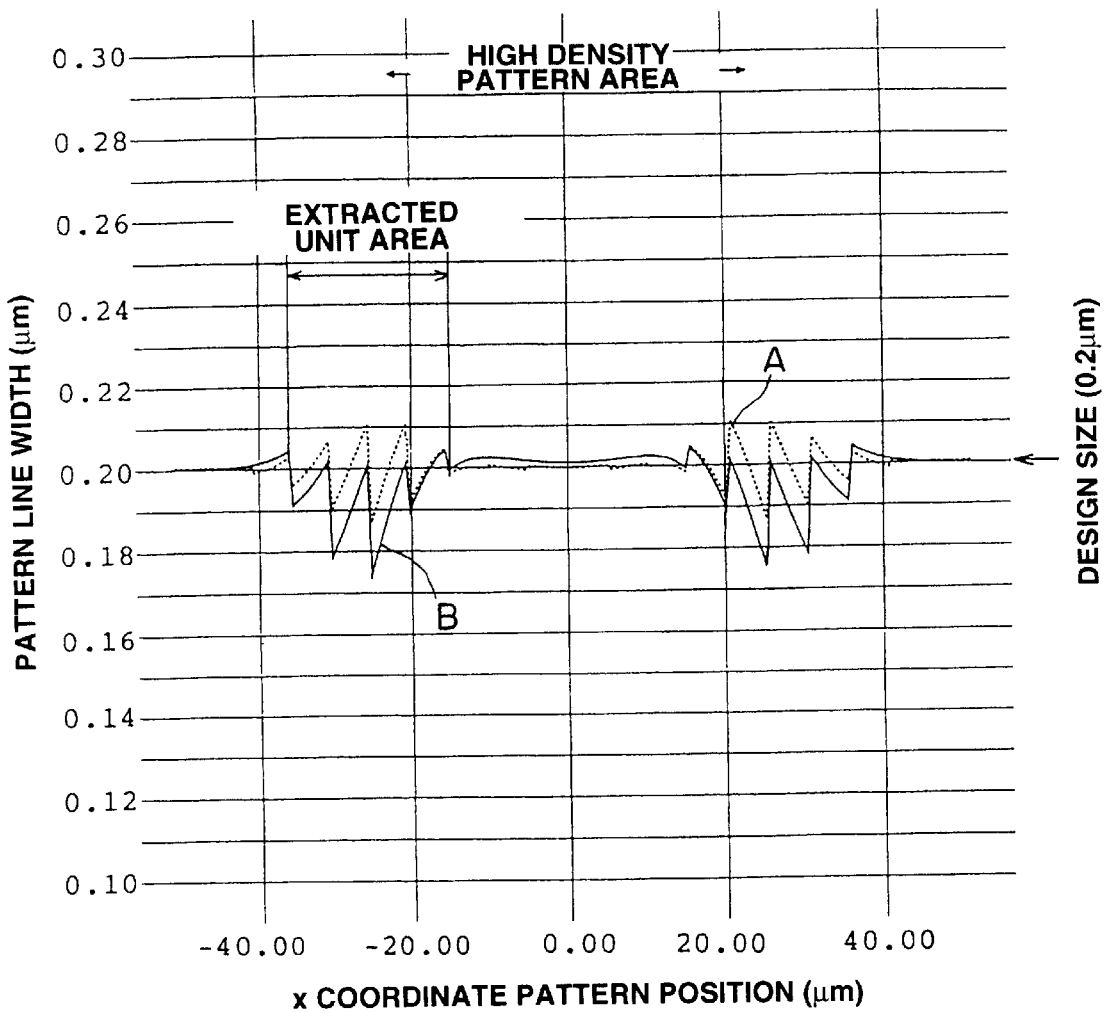
FIG. 15 shows the results of comparison of pattern line width transitions of the fine line pattern (line width of 0.2 μm) between the conventional method and the inventive method.

The results of calculations of Derr_N(i, j) of the equation (33) in case the corrected exposure dose in each unitary domain has been optimized at each unitary domain in the boundary area are shown in FIG. 13. The pattern line width transitions of fine line pattern (line width of 0.2 μm) are shown in FIG. 14. The serrated pattern line width transitions occur on both upper and lower sides of a design line width of 0.2 μm as center, and the pattern line width at the center of each unitary domain is equal to the design size. Thus it is seen that the corrected exposure dose has been optimized at the center of each unitary domain. The results of comparison with the conventional method with respect to the pattern line width transitions are shown in FIG. 15. As may be seen from the pattern line width transitions shown at A in FIG. 15, the proximity effect correction method according to the method of the present invention is subjected to uncorrected serrated remnant portions of the proximity effect. However, the amount of the pattern line width transitions from the design size of 0.2 μm is smaller than with the conventional method shown at B in FIG. 15.

Next, the method for correcting the proximity effect for raising the accuracy of proximity effect correction is now explained.

Figure 16:
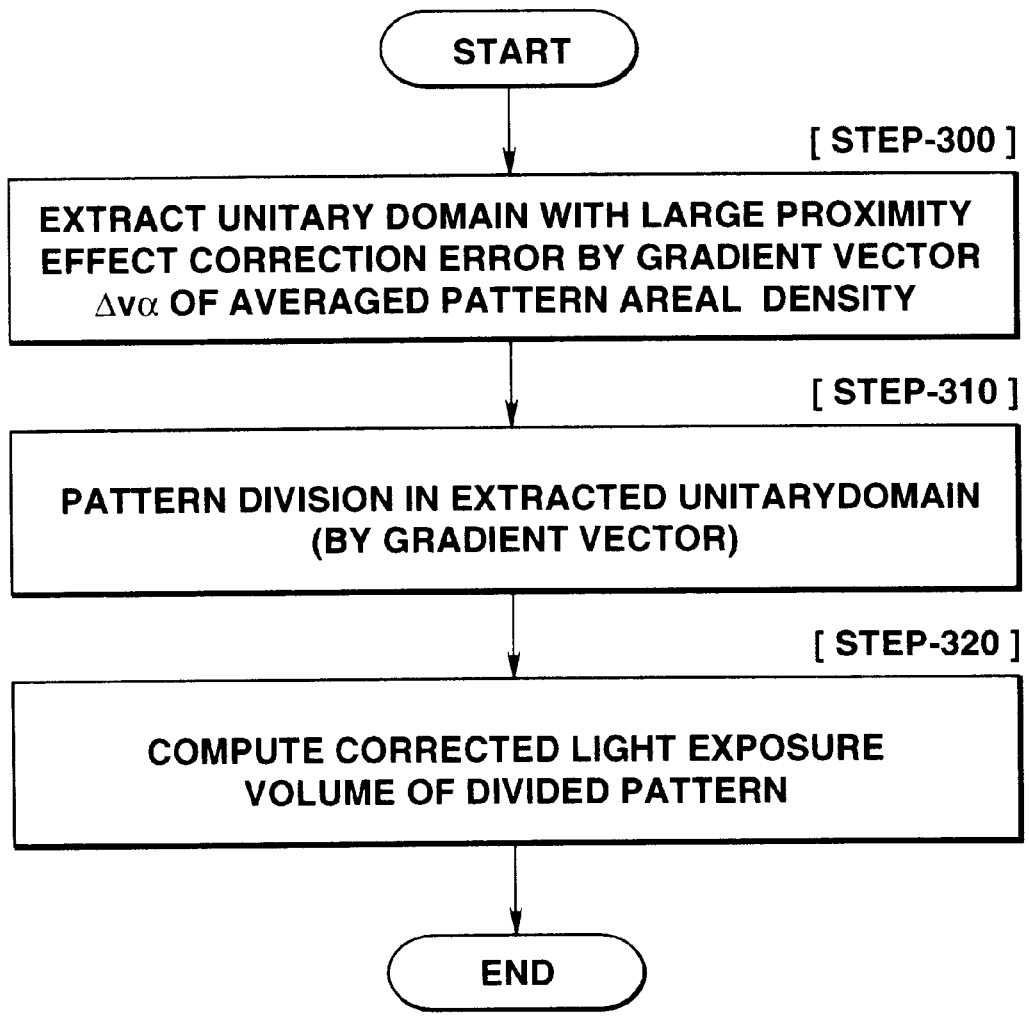
FIG. 16 is a flowchart for illustrating a modification of the proximity effect correction method according to the present invention.

With the proximity effect correcting method, a pattern in a unitary domain is split into appropriate division patterns based on the gradient vector of the averaged pattern areal density. That is, with the present method, pattern splitting is carried out efficiently only on the pattern having acute changes in the pattern areal density in the longitudinal direction, using the above-mentioned gradient vector of the pattern areal density, in consideration of the directivity of the gradient of the accumulated energy ascribable to backward scattering, and subsequently the exposure dose is corrected to high precision. Reference is now had to the flowchart of FIG. 16 for explaining the method for correcting the proximity effect with a view to improving the precision in the corrections of the proximity effect.

[step-300]

Figure 17:
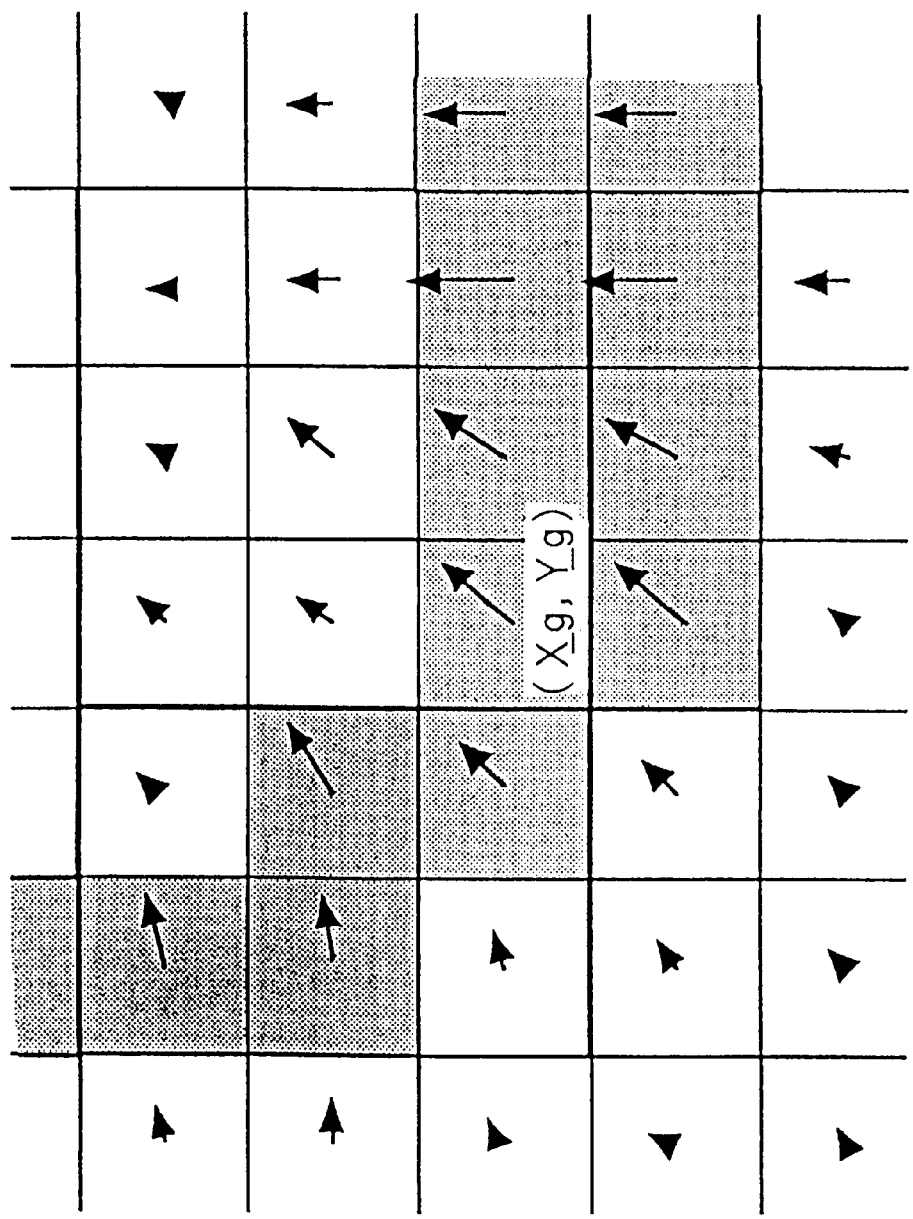
FIG. 17 schematically shows the gradient vector of the averaged pattern areal density.

First, the delineation pattern data (EB pattern data) is read. The delineation pattern data is then split into pre-set unitary domains, each of which is developed into a bit map for calculating the pattern areal density α in each unitary domain. The pattern areal density α in each unitary domain is then averaged to find the averaged pattern areal density α'. The gradient vector $\Delta_v \alpha$ of the averaged pattern areal density α' is then found. Then, based on the calculated gradient vector $\Delta_v \alpha$, the unitary domain where the averaged pattern areal density is changed acutely is extracted, that is, a unitary domain where the magnitude of the calculated gradient vector $\Delta_v \alpha$ is not less than a pre-set value $S_{th}$, is extracted, for determining a unitary domain having large proximity effect correction error. The above-described processing can be performed as in the above-mentioned method and hence is not explained in detail. The gradient vector of the averaged pattern areal density is schematically shown in FIG. 17. The unitary domains shown in gray denote those domains where the averaged pattern areal density is changed acutely.

[step-310]

Figure 18A:
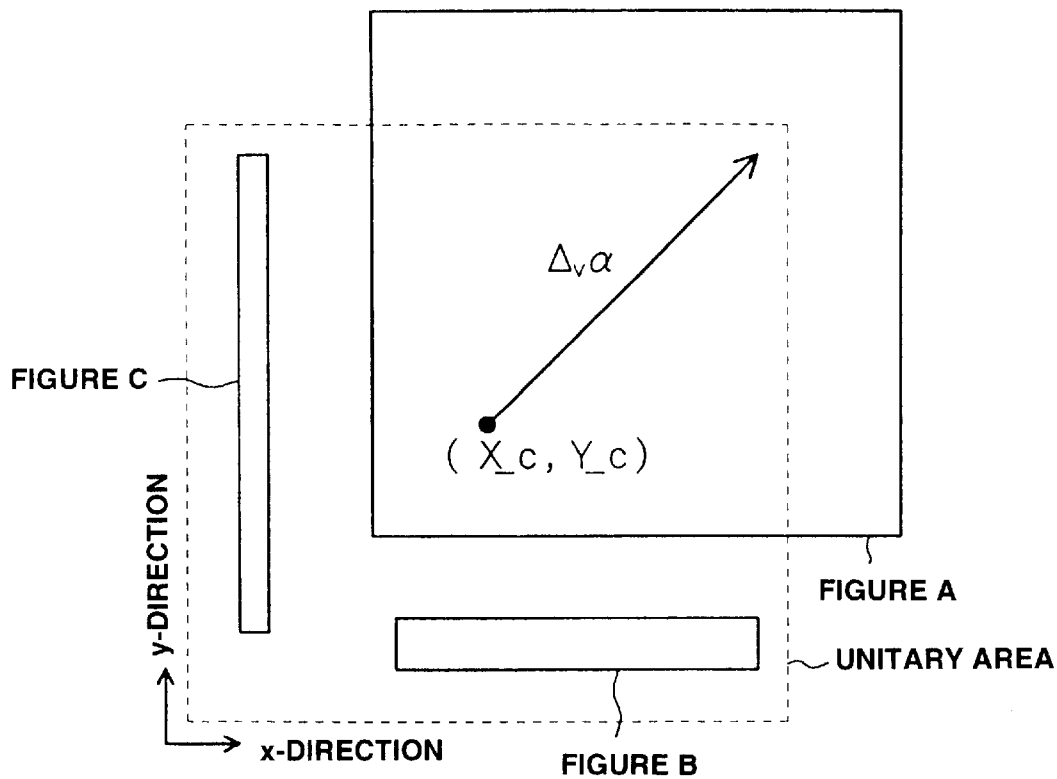
FIG. 18 illustrates the method of dividing a pattern.
Figure 18B:
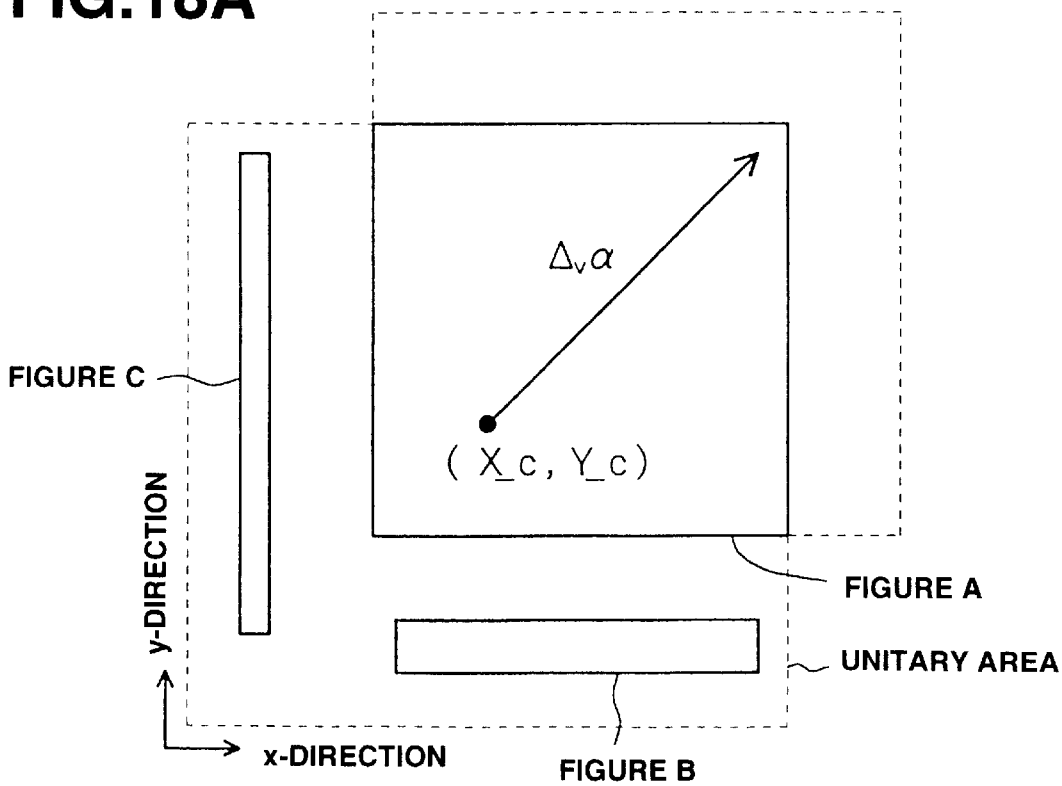

One of the unitary domains extracted at the step [step-300] is shown in FIG. 18A. In this unitary domain (mesh) are contained three figures A, B and C, with the figure A lying astride the neighboring unitary domain (mesh). It is assumed that, as shown in FIG. 18A, the gradient vector of the pattern areal density is in a 45° rightward rising direction.

For processing only the portion lying in the unitary domain of the figure astride the neighboring unitary domain (mesh), that is the figure A, the figure (figure A) is resolved at the boundary of the unitary domain. The portion of the figure thus resolved and not contained in the unitary domain is processed during processing of the neighboring unitary domain.

Figure 19A:
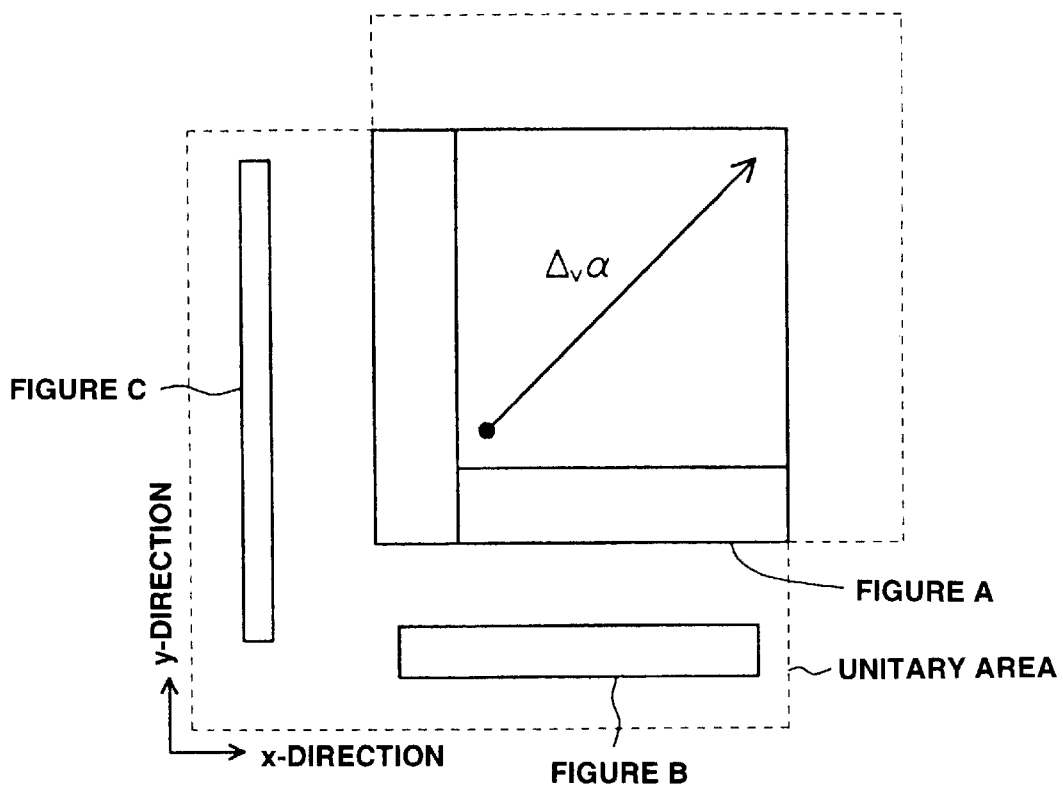
FIG. 19 is a view similar to FIG. 18 and illustrates the method of dividing a pattern dividing method.
Figure 19B:
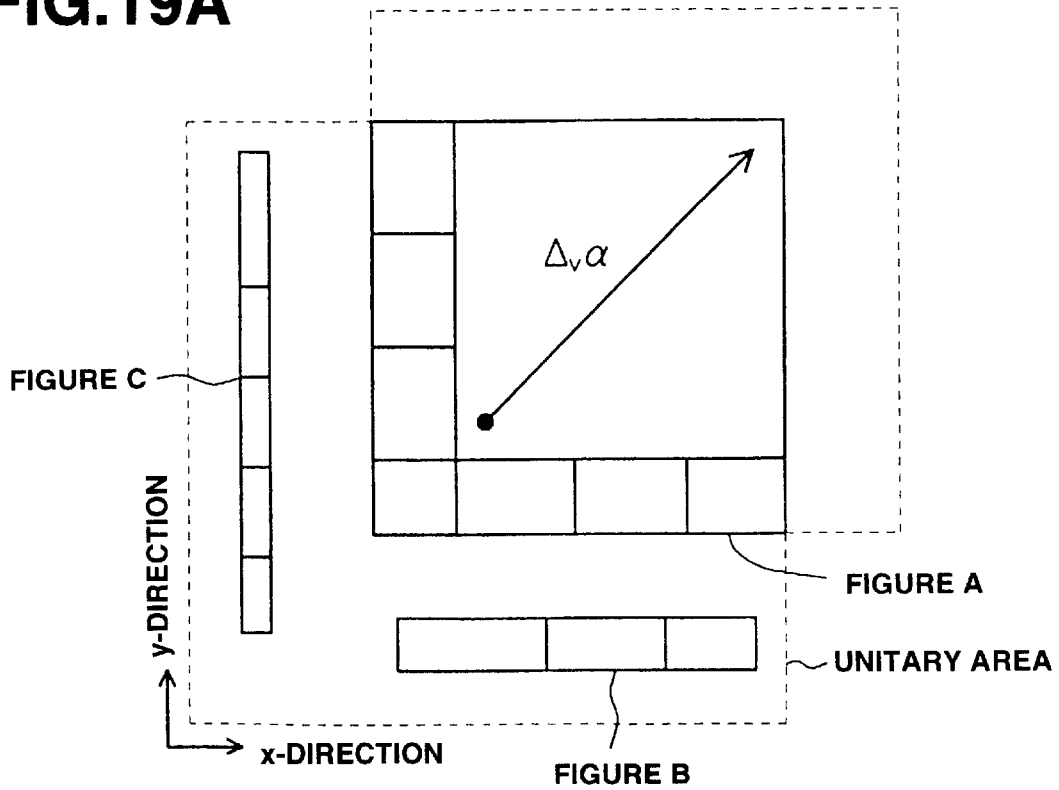

The pattern in the extracted unitary domain is then split along the directions of the components of the gradient vector (see FIGS. 19A and 19B). That is, the large figure (figure A) is split along sides parallel to the components of the gradient vector. The figures B and C are split in a similar manner. The lengths along the x- and y-axes of the divided patterns may be determined by the following methods:

The ratio of line width fluctuations for the pattern density of 50% (ratio of line width variation in the unitary domain) is assumed to be ΔL, while the tolerance of the line width fluctuations in the unitary domain is $\Delta L_{tol}$. The relation between the allowable sizes Lx, Ly of the divided pattern and $\Delta L_{tol}$ and ΔL is as shown in the following equations (36-1) and (36-2). The sizes along the x- and y-axes of the gradient vector of the averaged pattern areal density are assumed to be $|\Delta_v \alpha x|$ and $|\Delta_v \alpha y|$, respectively.

$$\Delta L_{tot} \geq \Delta L \cdot (|\Delta_v Ebx|/Ds) \cdot Lx \qquad (36\text{-}1)$$
$$= \Delta L \cdot |\Delta_v \alpha x| \cdot Lx \cdot \eta/(1+\eta)$$

$$\Delta L_{tot} \geq \Delta L \cdot (|\Delta_v Eby|/Ds) \cdot Ly \qquad (36\text{-}2)$$
$$= \Delta L \cdot |\Delta_v \alpha y| \cdot Ly \cdot \eta/(1+\eta)$$

Thus, if the pattern of the unitary domain is split for satisfying the tolerable sizes Lx, Ly of the divided pattern, as shown in the equations (37-1) and (37-2), the desired line width precision may be realized:

$$Lx \geq \Delta L_{tol}(1+\eta)/(\eta \cdot \Delta L \cdot |\Delta_v \alpha x|) \qquad (37\text{-}1)$$

$$Ly \geq \Delta L_{tol}(1+\eta)/(\eta \cdot \Delta L \cdot |\Delta_v \alpha y|) \qquad (37\text{-}2)$$

Meanwhile, if the unitary domain with large proximity effect correction is automatically extracted based on the gradient vector of the averaged pattern areal density in the above-mentioned unitary domain, and the light exposure in this unitary domain is corrected, the desired line width precision may be realized by splitting the pattern in the unitary domain for satisfying both the allowable sizes of the divided patterns, based on the gradient vector $\Delta_v \alpha''(i, j) = (\Delta_v \alpha x'' \Delta_v \alpha y'')$, in accordance with the equations (38-1), (38-2):

$$Lx \geq \Delta L_{tol}(1+\eta)/(\eta \cdot \Delta L \cdot |\Delta_v \alpha x''|) \qquad (38\text{-}1)$$

$$Ly \geq \Delta L_{tol}(1+\eta)/(\eta \cdot \Delta L \cdot |\Delta_v \alpha y''|) \qquad (38\text{-}2)$$

[step-320]

Figure 20:
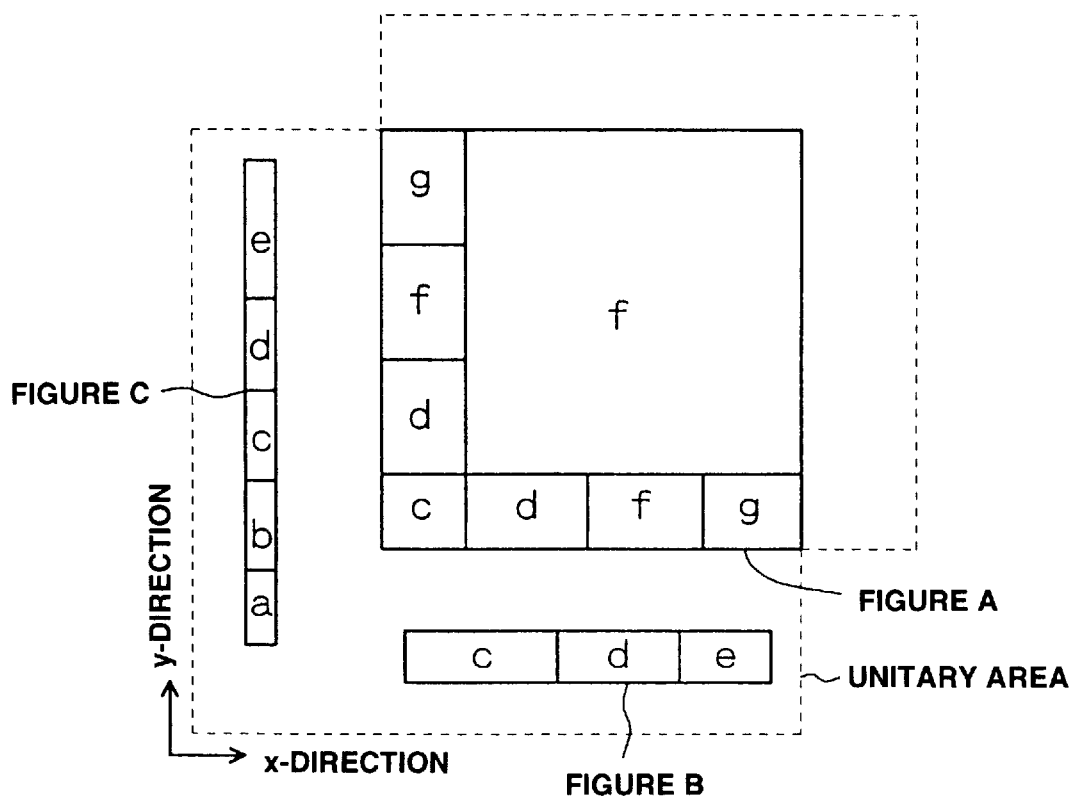
FIG. 20 schematically shows the exposure dose of an electron ray beam for each divided pattern.

The exposure dose of the electron ray beam is then corrected in consideration of the accumulated energy ascribable to the backward scattering of the electrons (see FIG. 20). This enables high-precision exposure dose correction even in a boundary area where the pattern areal density is changed acutely. Although the corrected exposure dose can also be obtained by the proximity effect correction method by the sequential calculation method by the conventional representative point evaluation, it is desirable to find the corrected exposure dose by the high-precision proximity effect correction method as later explained. In FIG. 20, the corrected exposure dose of the divided pattern 'f' is equivalent to the corrected exposure dose obtained from the equation (34) at the areal center of gravity (X_g, Y_g) by the above-described proximity effect correction method. In the divided patterns 'e', 'd', 'c', 'b' and 'a', the effect of the accumulated energy ascribable to the backward scattering becomes sequentially smaller, so that the corrected exposure dose becomes sequentially larger than the corrected exposure dose in the divided pattern indicated at "f". On the contrary, in the divided pattern 'g', the effect of the accumulated energy ascribable to the backward scattering becomes sequentially larger, so that the corrected exposure dose becomes sequentially smaller than the corrected exposure dose in the divided pattern indicated at "f". Thus it suffices to find the optimum corrected exposure dose at the divided pattern an to delineate each divided pattern with an electron ray beam. In FIG. 20, since the patterns in the unitary domain is split into 16 figures, it suffices to perform 16 light exposure operations. In the conventional proximity effect correction method, the same corrected exposure dose is used for delineation for each non-split pattern in each unitary domain.

Figure 21A:
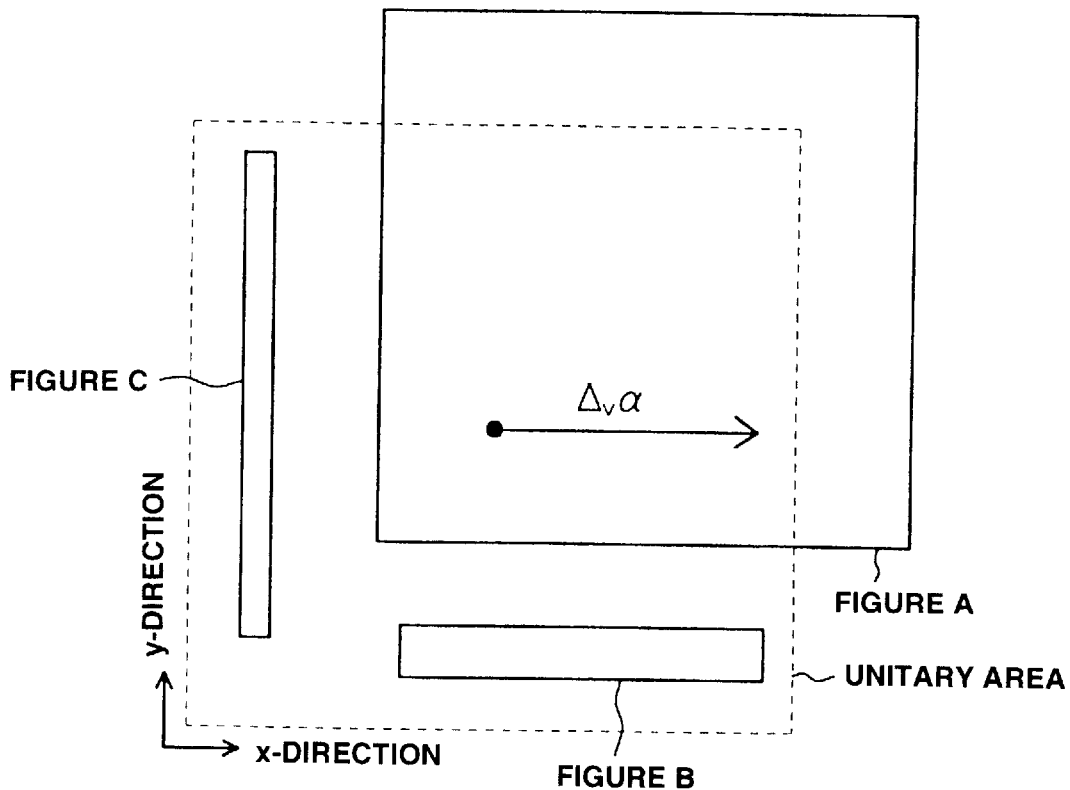
FIG. 21 illustrates the method for dividing a pattern for a case in which the gradient vector of the pattern areal density differs from that of FIG. 18.
Figure 21B:
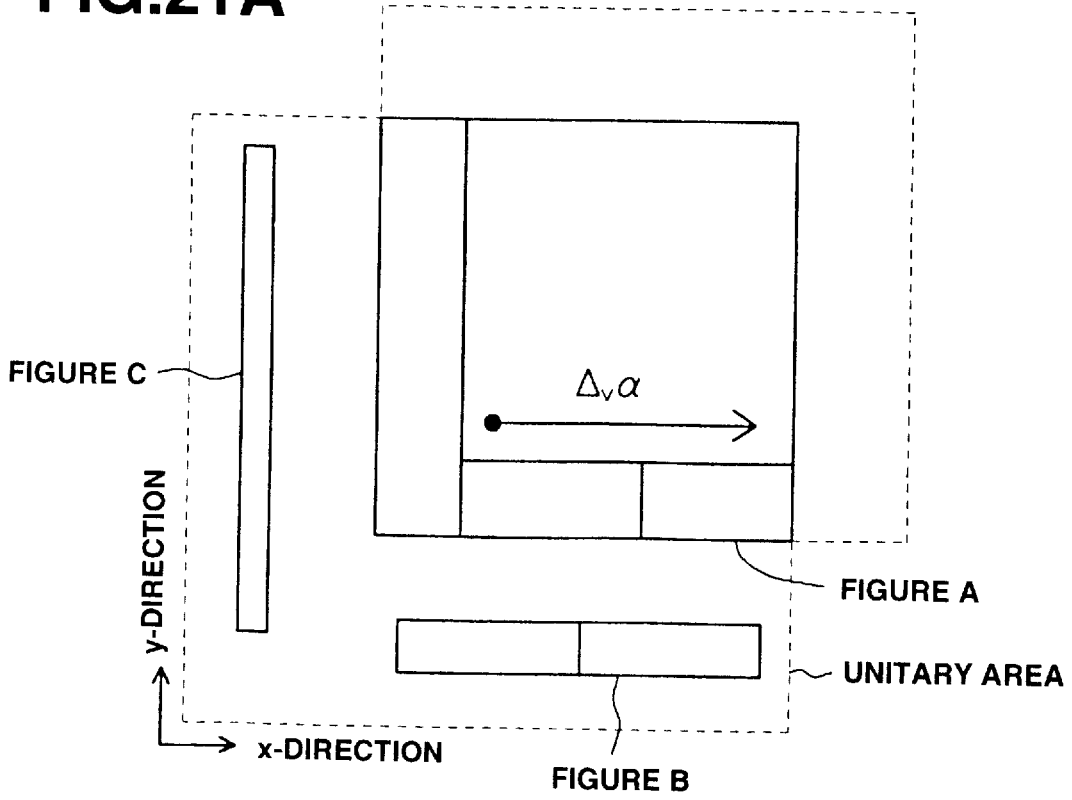
Figure 22:
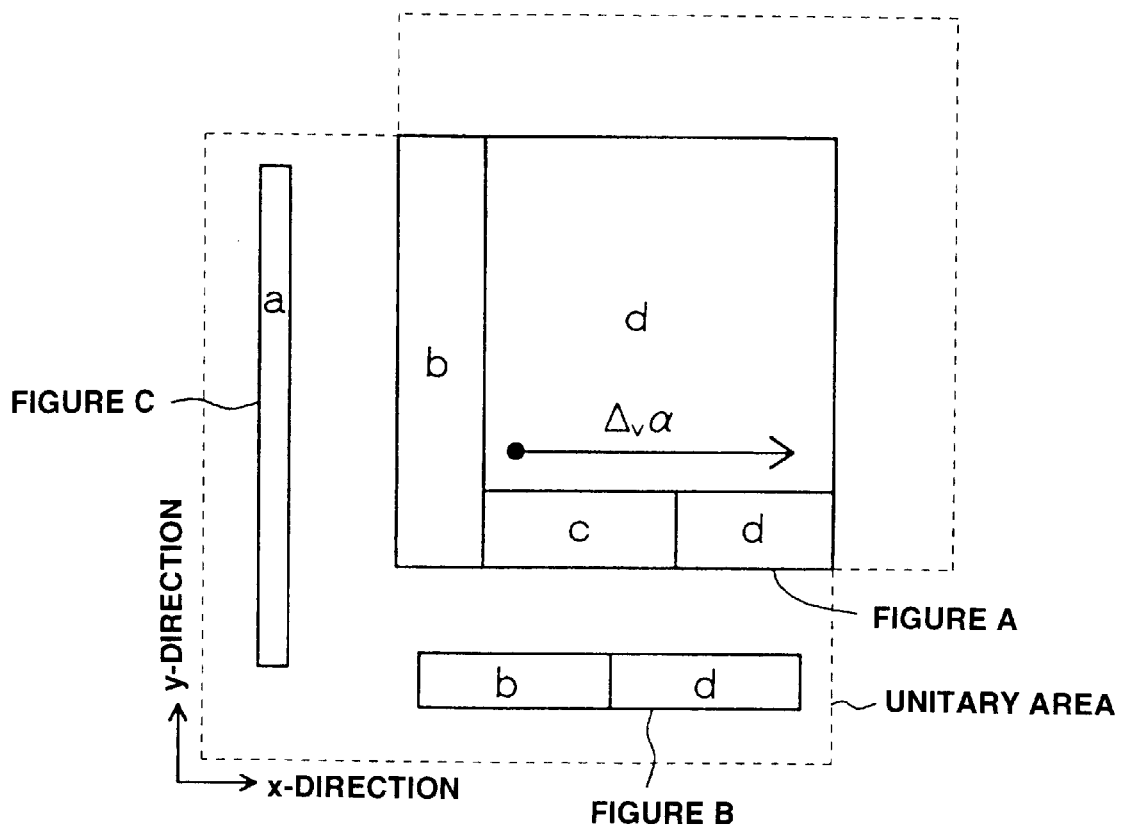
FIG. 22 schematically shows the corrected exposure dose of the electron ray beam for each divided pattern in the state shown in FIG. 21.

Meanwhile, if, in the same pattern as shown in FIG. 18A, the gradient vector of the pattern areal density is oriented only in the X-axis direction (see FIG. 21A), basically it suffices if the pattern in the extracted unitary domain is split along the direction of a component of the gradient vector (herein the x-axis component) such that it becomes possible to suppress the number of times of splitting of the unitary domain to a necessary minimum value. The ultimate state of correction of the exposure dose of the electron ray beam for each divided pattern is shown schematically in FIG. 22, in which the corrected exposure dose shown at 'd' is equivalent to the corrected exposure dose obtained by the equation (34) in the areal center of gravity (X_g, Y_g) by the above-described proximity effect correction method. Since the effect of the accumulated energy ascribable to the backward scattering becomes sequentially smaller, the exposure dose becomes sequentially larger than the corrected exposure dose in the divided pattern shown at 'd'.

If the unitary domain (mesh) where the above-mentioned pattern areal density is changed acutely is extracted, and the proximity effect correction is performed on the divided patterns in the extracted unitary domains by, for example, the sequential calculation method by the conventional representative point evaluation, high-precision proximity effect correction can be achieved even in this unitary domain. However, the conventional sequential calculation method by the conventional representative point evaluation is in need of repeated calculations or matrix calculations of a significant processing volume.

In the proximity effect correction method, now explained, high-speed high-precision proximity effect correction is achieved by assuming a exposure dose correction plane derived from the gradient vector of the pattern areal density, based on the fact that the accumulated energy ascribable to backward scattering can be deemed to be linearly changed in the unitary domain (mesh).

The flow of the present proximity effect correction method is hereinafter explained.

[step-400]

First, the delineation pattern data (EB pattern data) is read. The delineation pattern data is then split into pre-set unitary domains, each of which is developed into a bit map for calculating the pattern areal density a in each unitary domain.

[step-410]

The pattern areal density a in each unitary domain is then averaged to find the averaged pattern areal density α'.

[step-420]

The gradient vector $\Delta_v \alpha$ of the averaged pattern areal density α' is then found.

[step-430]

Then, based on the calculated gradient vector $\Delta_v \alpha$, the unitary domain where the averaged pattern areal density is changed acutely is extracted, that is, a unitary domain where the magnitude of the calculated gradient vector $\Delta_v \alpha$ is not less than a pre-set value $S_{th}$, is extracted, for determining a unitary domain having large proximity effect correction error.

[step-440]

The corrected exposure dose in the extracted unitary domain is optimized.

[step-450]

The pattern in the extracted unitary domain is split to produce divided patterns.

The above steps [step-400] to [step-450] can be carried out in the same way as in the automatic extraction method of extracting the unitary domain with large proximity effect correction error based on the gradient vector of the averaged pattern areal density in the unitary domain. The step [step-440] can be carried out in the same way as in light exposure correction for each unitary domain with large proximity effect correction error. The corrected light exposure is now optimized in the areal center of gravity point (X_g, Y_g) of the unitary domain. Alternatively, the corrected light exposure may also be optimized by the sequential calculation method by representative point evaluation. The step [step-450] may be carried out in the same way as in slitting the pattern in unitary domain based on the gradient vector of the average pattern areal density. Therefore, the detailed explanation for these steps is omitted.

[step-460]

Figure 23:
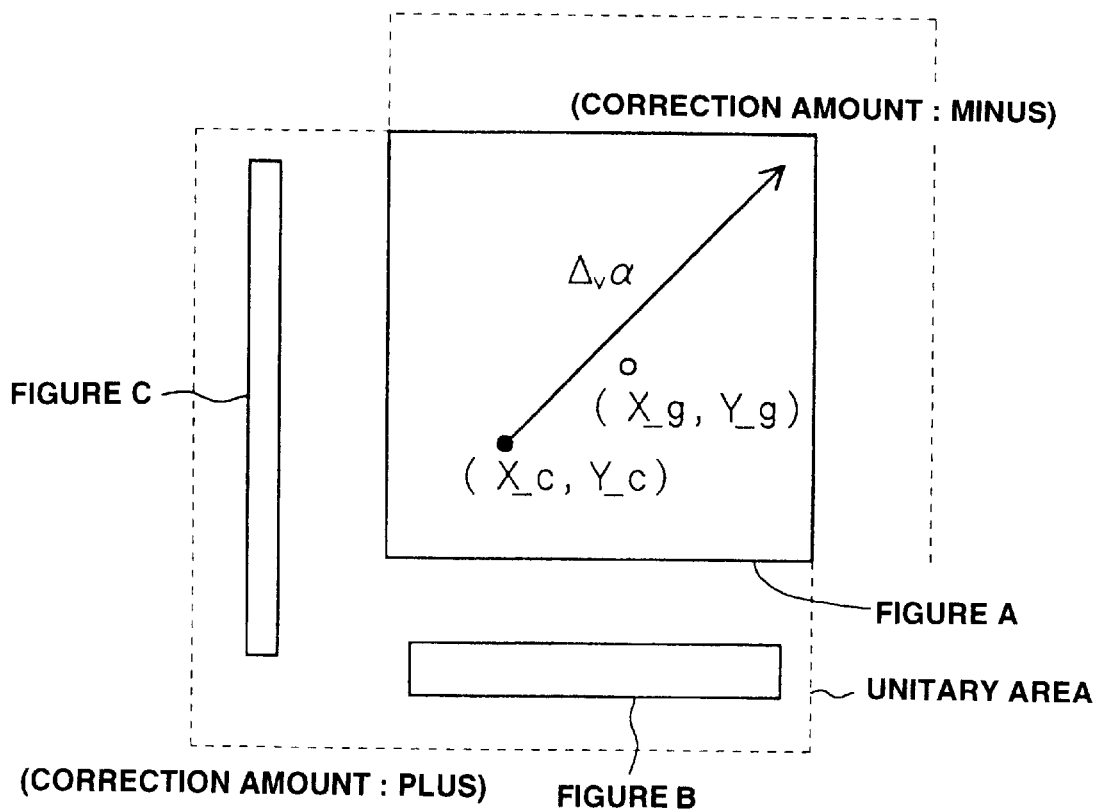
FIG. 23 illustrates a further modification of the proximity effect correction method according to the present invention.

In this step, a corrected equation for light exposure (plane-approximation) in an extracted unitary domain is calculated. The center of a given unitary domain (i, j) is taken at an origin. The coordinate of an areal center of gravity of a pattern in this unitary domain is assumed to be G((X_g, Y_g) (see FIG. 23). In the step [step-440], the final value of the accumulated energy in the areal center of gravity (X_g, Y_g) of the unitary domain (i, j), ascribable to backward scattering, is assumed to be Eb_g(i, j) which stands for the accumulated energy based on the equations (27-1) and (27-2), obtained on last repetition of the above step [step-440]. If the corrected exposure dose at the areal center of gravity (X_g, Y_g) of the unitary domain (i, j) is D_g_i, j (X_g, Y_g), the relation of the equation (39) holds within a unitary domain. Ds/2 is equivalent to pattern edge strength, while D_g_i, j (X_g, Y_g) is equivalent to the exposure dose ascribable to forward scattering, with ½ thereof being equivalent to the pattern edge strength. The above equation (35) can be obtained by modifying the Equation (39):

$$Eb\_g(i, j) + D\_g\_i, j(X\_g, Y\_g)/\{2(1+\eta)\} = Ds/2 \tag{39}$$

If the gradient vector of the accumulated energy ascribable to the forward scattering, as found from the averaged pattern areal density A'(I, j), that is $\Delta_v Eb(i, j) = (\Delta_v Ebx\_i, j, \Delta_v Eby\_i, j)$, is used, the accumulated energy ascribable to backward scattering, that is Eb_i, j (xdiv_c, ydiv_c) at the center of the divided pattern in the unitary domain (i, j) (xdiv_c, ydiv_c) can be expressed by the following equation (40):

$$\begin{aligned}Eb\_i, j(xdiv\_c, ydiv\_c) =\ & |\Delta_v Ebx\_i, j| \cdot (xdiv\_c - X\_g) + \\ & |\Delta_v Eby\_i, j| \cdot (ydiv\_cs - Y\_g) + \\ & Eb\_g(i, j)\end{aligned} \tag{40}$$

where the coordinate of the point (xdiv_c, ydiv_c) has the center of the unitary domain (i, j) as an origin. The first and second terms of the equation (40) may be multiplied with weighting constants, if so desired.

The relation of the equations (16-1) and (16-2) exists between the gradient vector of the averaged pattern areal density $(\Delta_v \alpha x\_i, j, \Delta_v \alpha y\_i, j)$ and the gradient vector of the accumulated energy $(\Delta_v Ebx\_i, j, \Delta_v Eby\_i, j)$, the following equation (41):

$$\begin{aligned}Eb\_i, j(xdiv\_c, ydiv\_c) \approx\ & (xdiv\_c - X\_g) \cdot |\Delta_v \alpha x\_i, j| \cdot \\ & Ds \cdot \eta/(1+\eta) + (ydiv\_c - Y\_g) \cdot \\ & |\Delta_v \alpha y\_i, j| \cdot Ds \cdot \eta/(1+\eta) + Eb\_g(i, j)\end{aligned} \tag{41}$$

may be obtained by modifying the corrected exposure light volume at an areal center of gravity (X_g, Y_g) in the unitary domain (i, j).

As for the corrected exposure dose $Ddiv_{cor}(xdiv\_c, ydiv\_c)$ at the center of the divided pattern in the unitary domain (i, j), the relation of the following equation (42):

$$Eb\_i, j(xdiv\_c, ydiv\_c) + \qquad (42)$$
$$Ddiv_{cor}(xdiv\_c, ydiv\_c)/\{2(1+\eta)\} = Ds/2$$

should hold anywhere in the unitary domain.
The following equation (43):

$$Ddiv_{cor}(xdiv\_c, ydiv\_c) \approx Ds[(1+\eta) - \qquad (43)$$
$$2\eta\{|\Delta vsax\_i, j| \cdot (xdiv\_c - X\_g) +$$
$$|\Delta vay\_i, j| \cdot (ydiv\_c - Y\_g)\}] -$$
$$2(1+\eta)Eb\_g(i, j)$$

Figure 24:
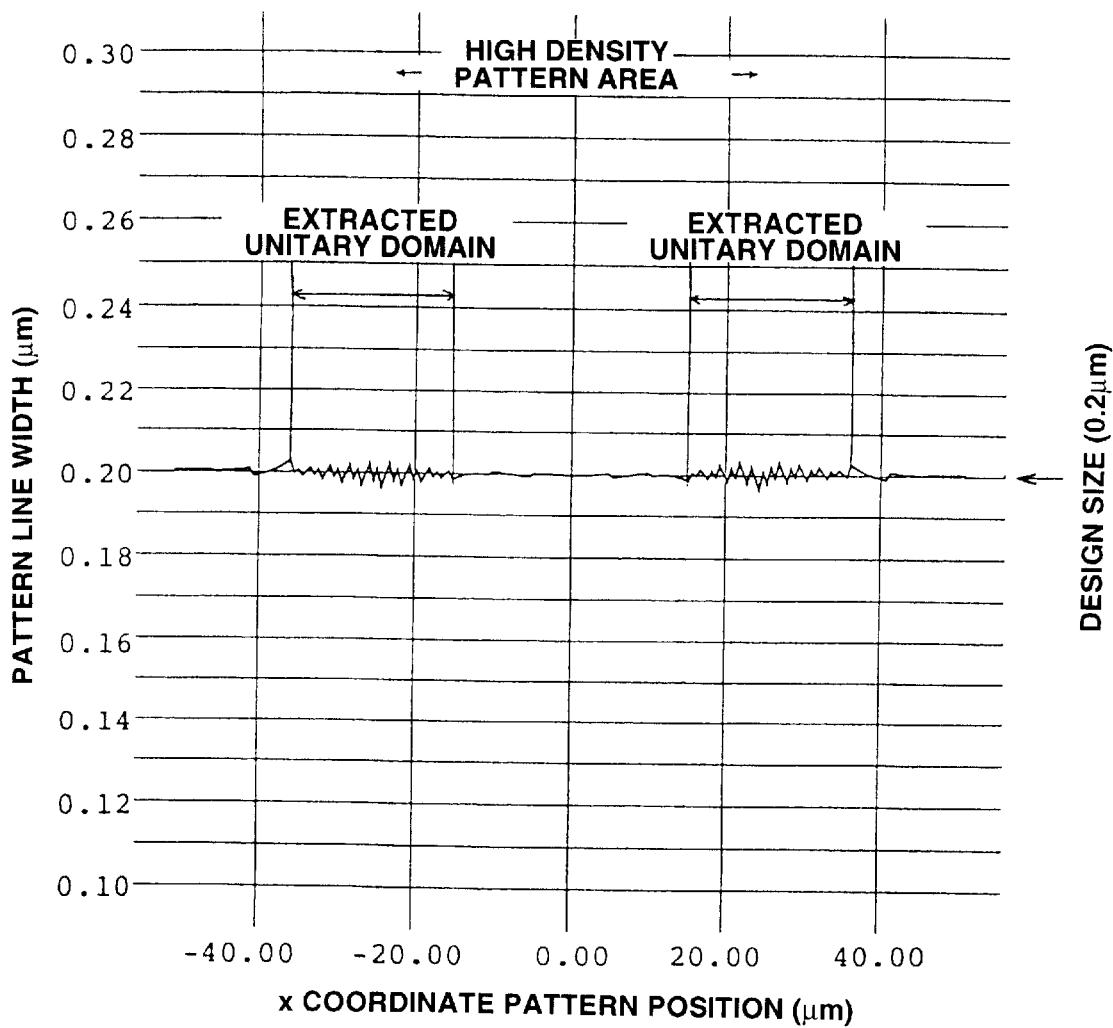
FIG. 24 illustrates a pattern line width transitions of a fine line pattern (line width of 0.2 μm) of the pattern of FIG. 2 with the aid of the proximity effect correction method shown in FIG. 23.

Strictly, $Eb\_g(i, j)$ depends on $Ddiv_{cor}(xdiv\_c, ydiv\_c)$. However, because of the plane-approximation centered about the areal center of gravity ($X\_g$, $Y\_g$), the local corrected exposure dose in the unitary domain (mesh) cancels itself as a whole and becomes approximately equal to zero. Therefore, the effect of $Ddiv_{cor}(x, y)$ on the local corrected exposure dose $Eb\_g(i, j)$ in the unitary domain becomes substantially negligible, so that changes in the influence of the proximity effect on the ambient unitary domains as a result of correction of the exposure dose in the unitary domain is also negligible. FIG. 24 shows changes in pattern line width of fine line patterns (line width of 0.2 $\mu$m) when the inventive method is applied to the pattern of FIG. 2. The values of Lx, Ly of the divided pattern is set to 1.28 $\mu$m. The electron ray beams is set to a value equal to the size of each divided pattern.

Figure 25:
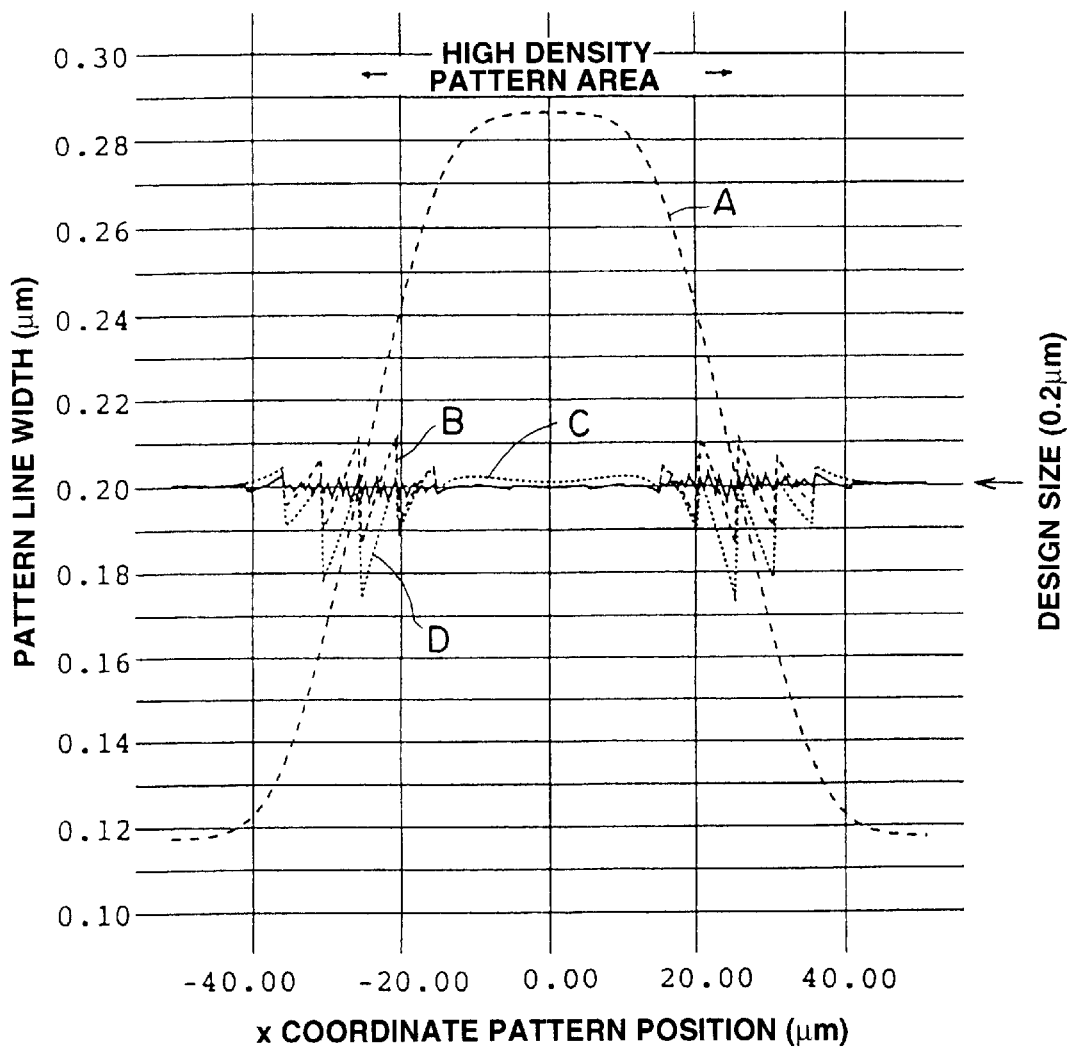
FIG. 25 shows a pattern line width transitions of a fine line pattern (line width of 0.2 μm) of the pattern of FIG. 2 without proximity effect correction, with the aid of the conventional areal density mapping method and with the aid of the inventive proximity effect correction method.
Figure 26A:
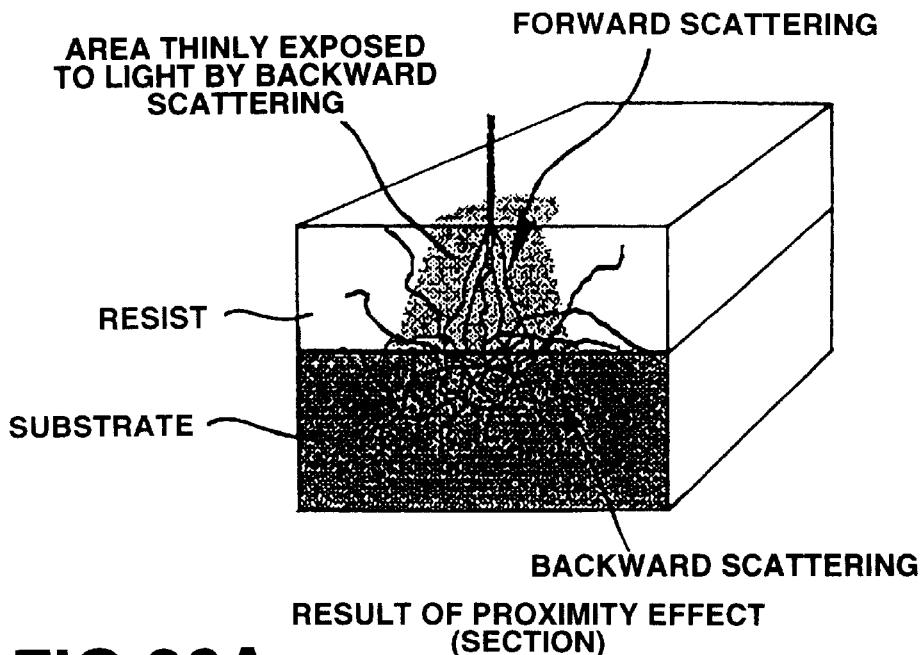
FIG. 26 schematically shows the proximity effect in electron ray lithography.
Figure 26B:
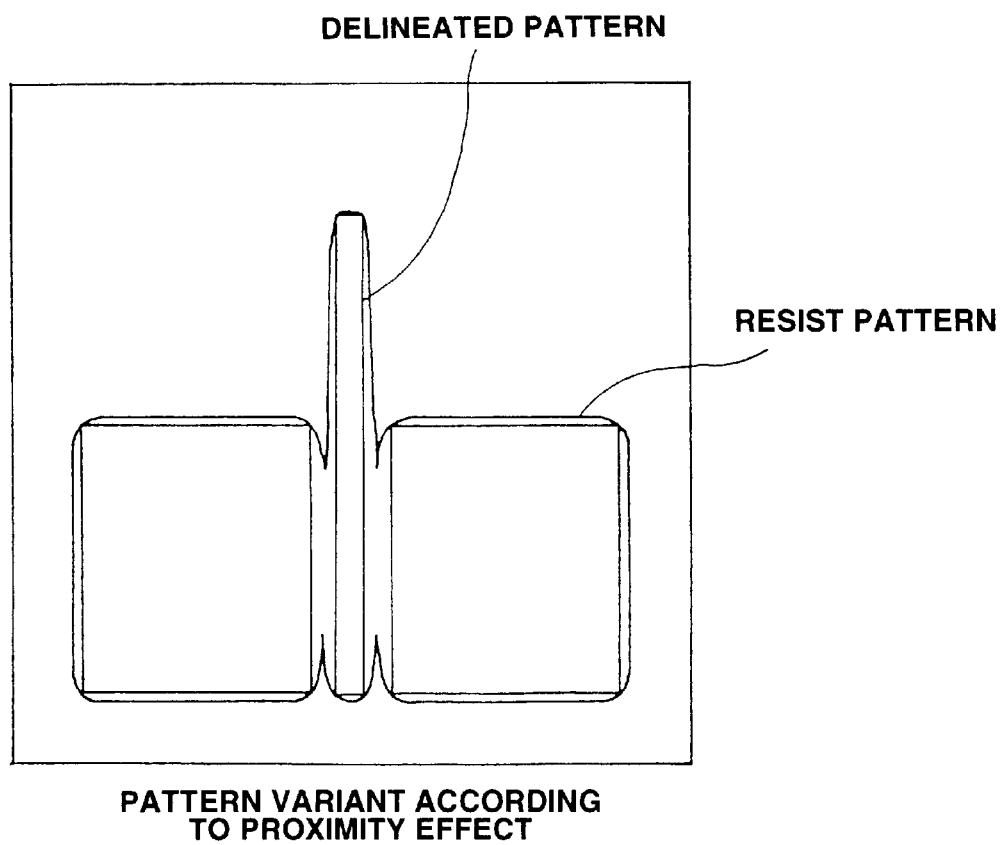
Figure 27:
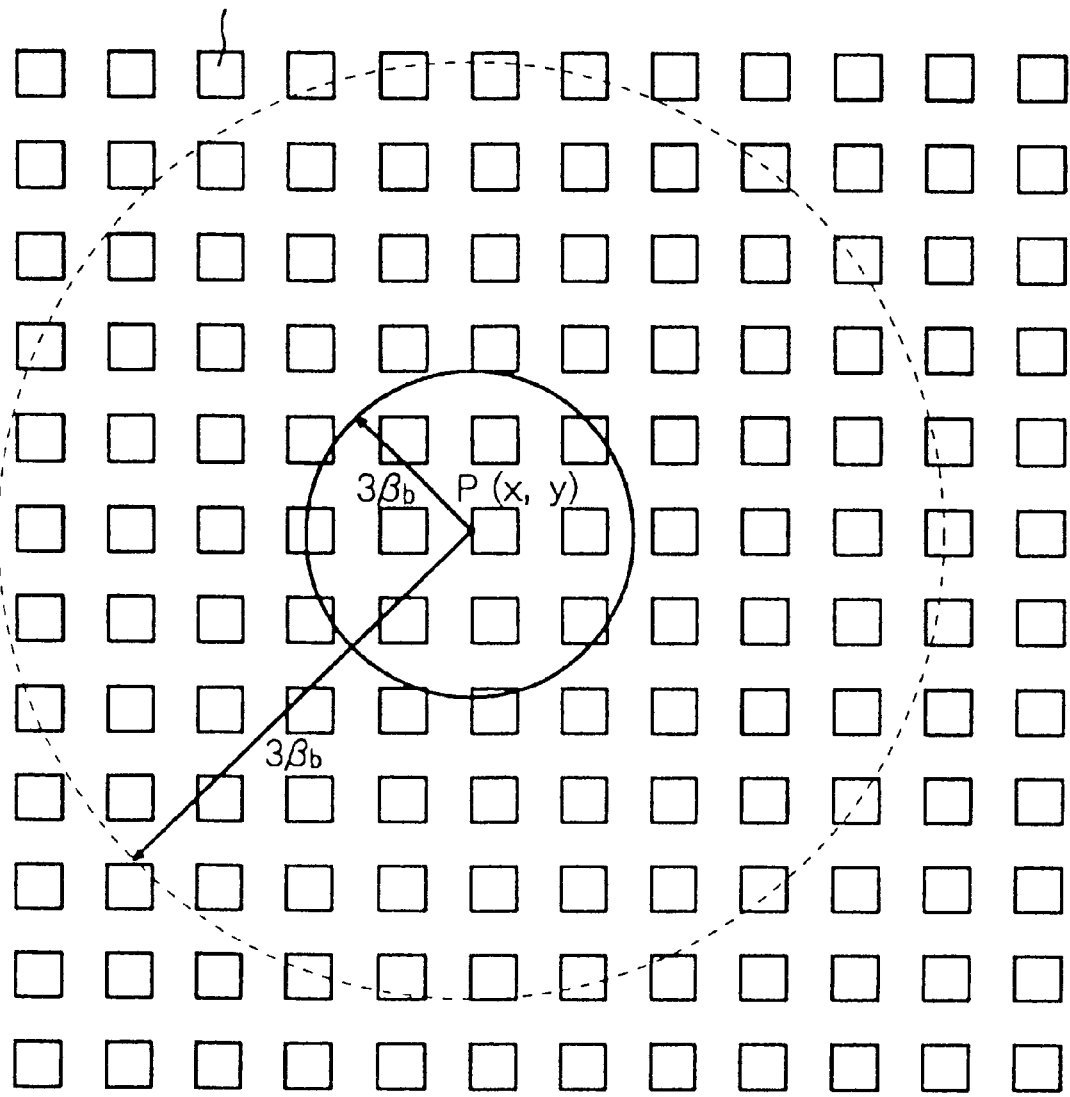
FIG. 27 schematically shows the range of delineated figures influencing a representative point n the calculations of the accumulated energy in the sequential calculation method in the conventional representative point evaluation.
Figure 28:
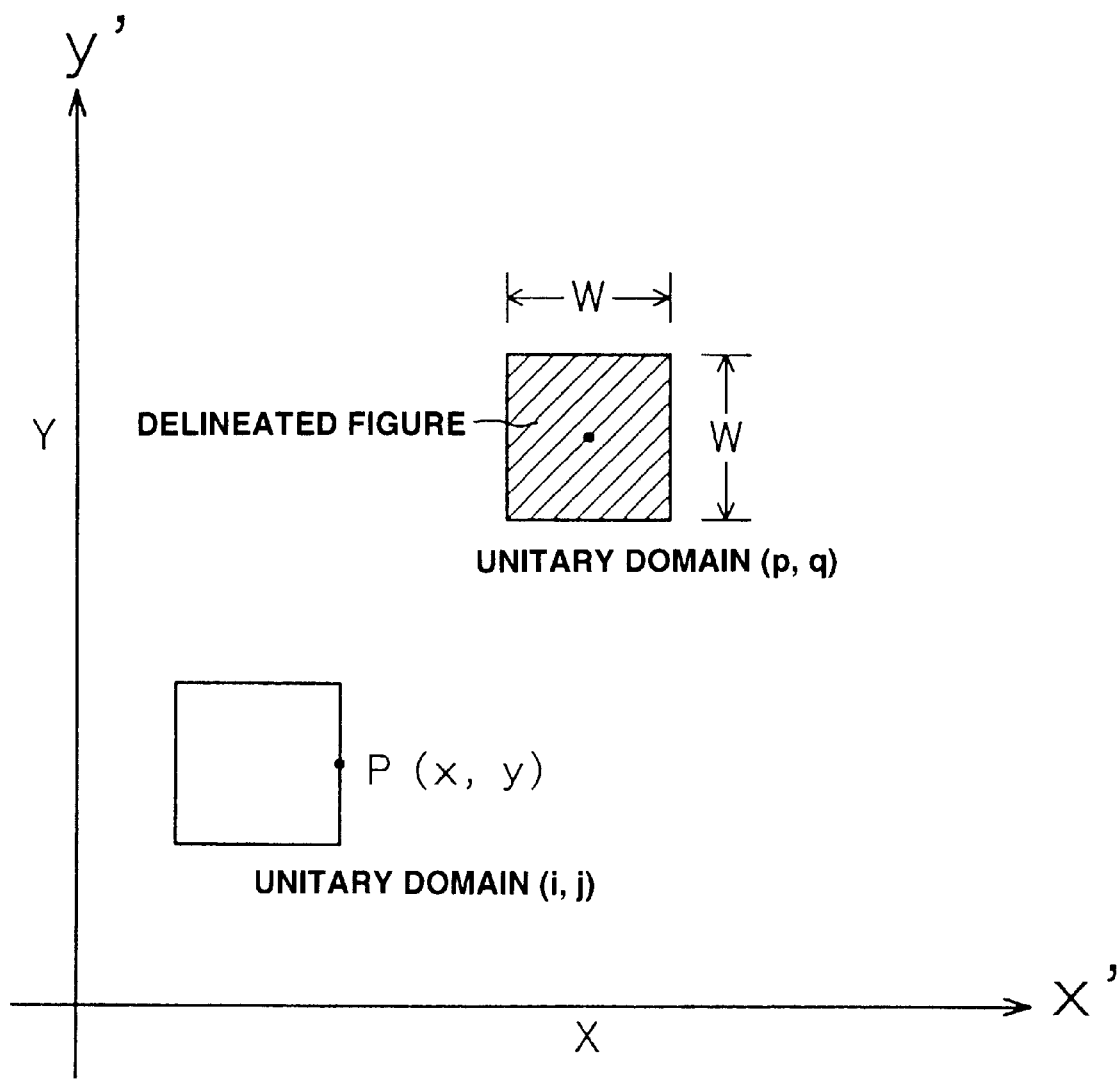
FIG. 28 schematically shows a method for calculating accumulated energy in the conventional sequential calculation method by conventional representative point evaluation.
Figure 29:
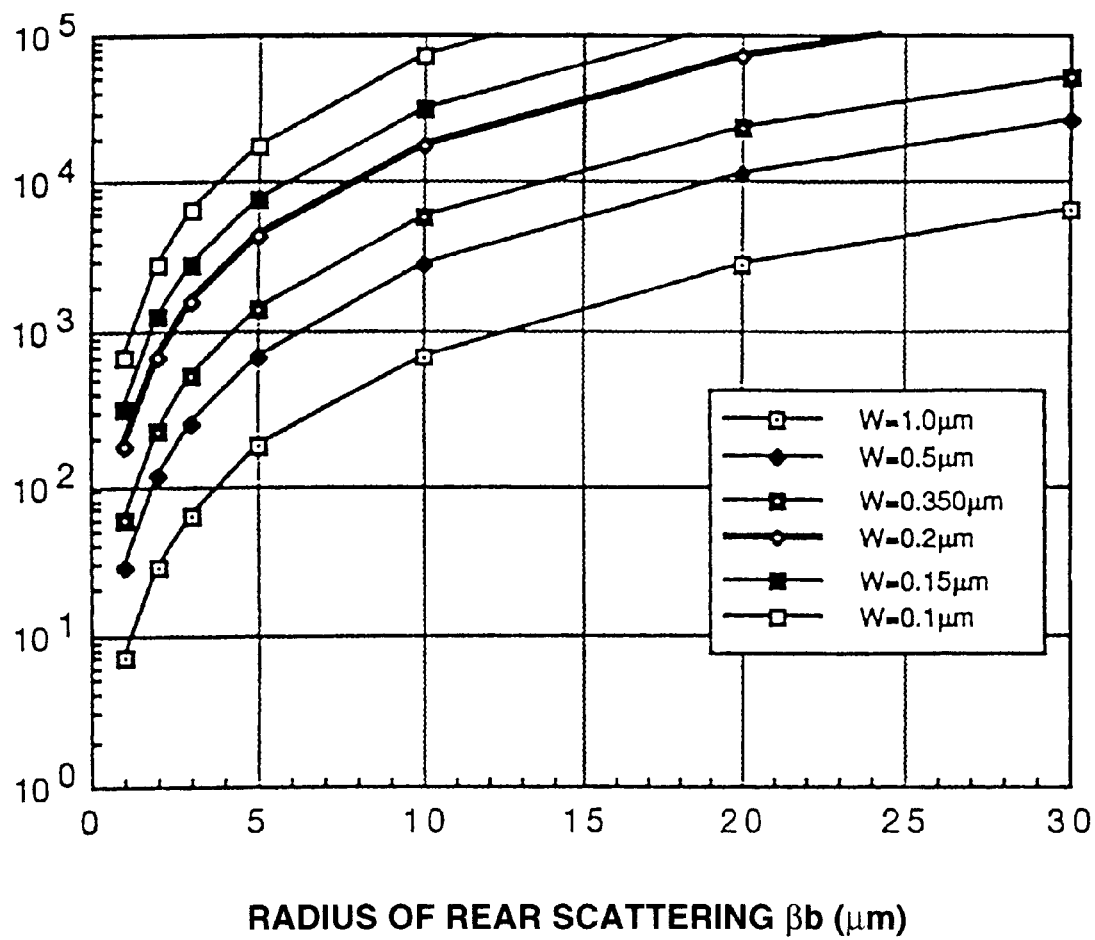
FIG. 29 is a graph showing the state in which, in the conventional sequential calculation method by conventional representative point evaluation, the volume of calculations of the accumulated energy is prohibitively increased in keeping with increased acceleration voltage and increased integration degree.
Figure 30:
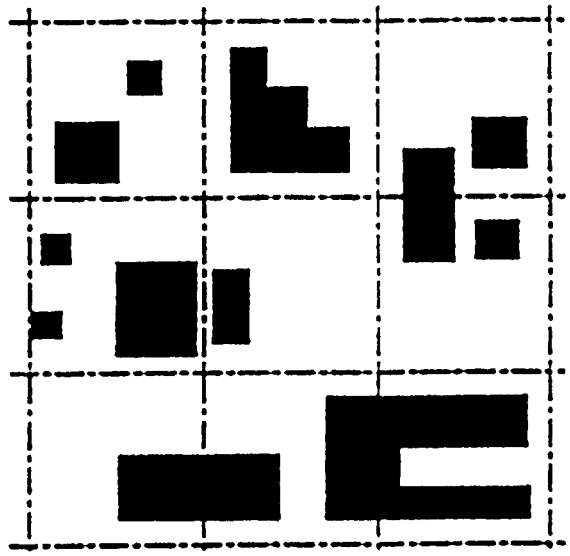
FIG. 30 illustrates a conventional representative figure method.
Figure 30:
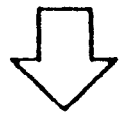
Figure 30:
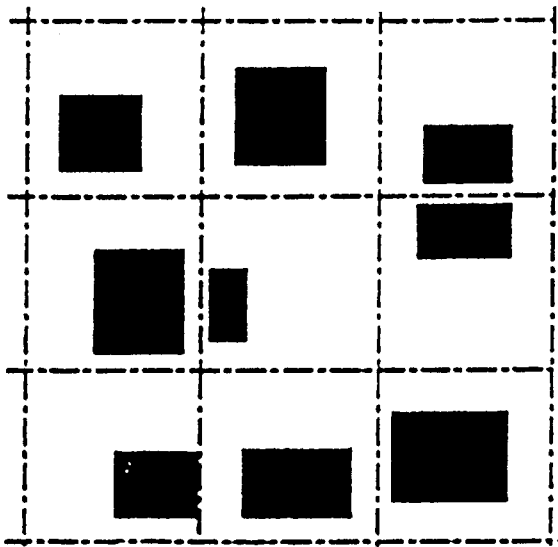
Figure 31:
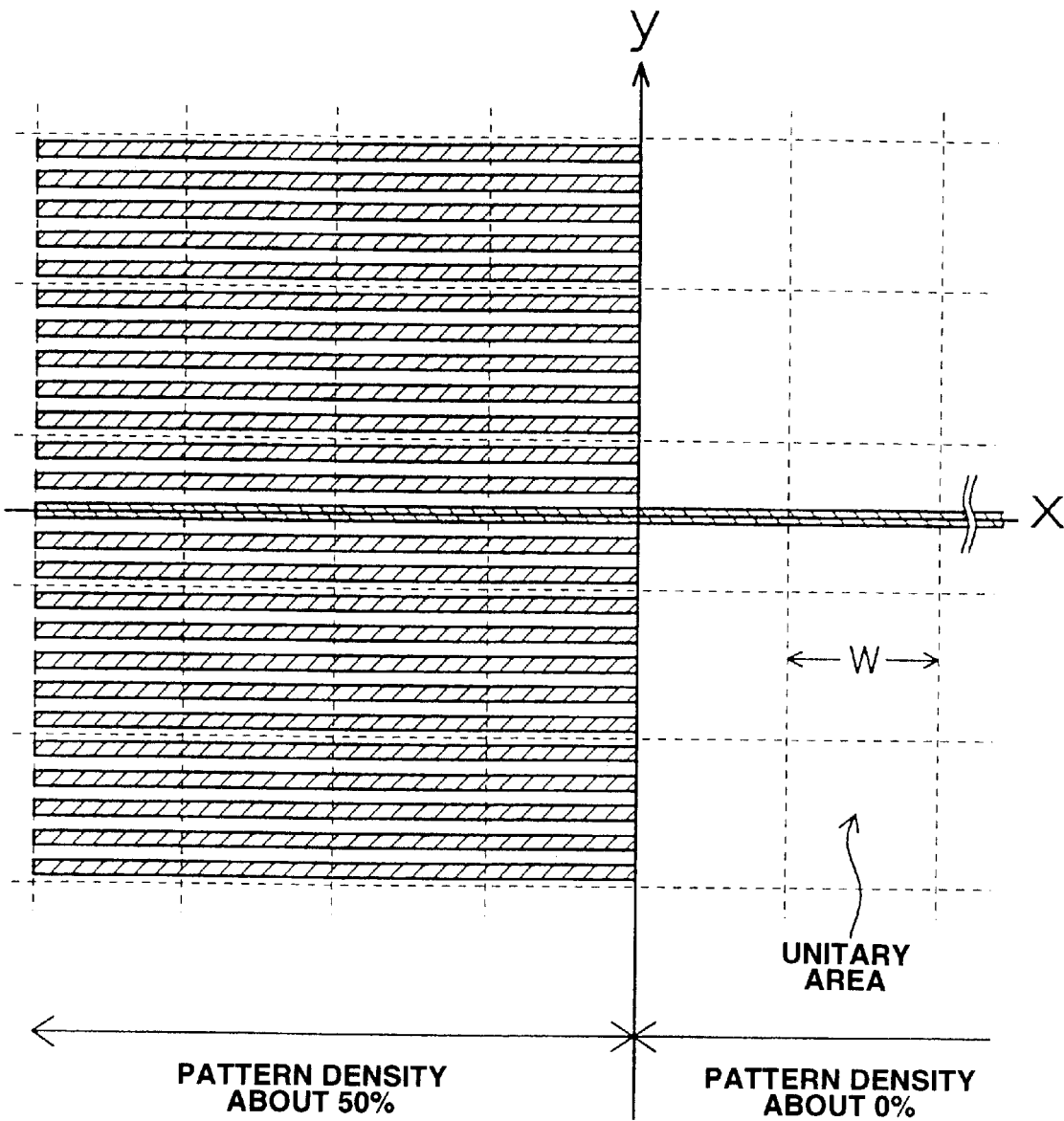
FIG. 31 shows a model pattern for illustrating the conventional areal density mapping method.
Figure 32:
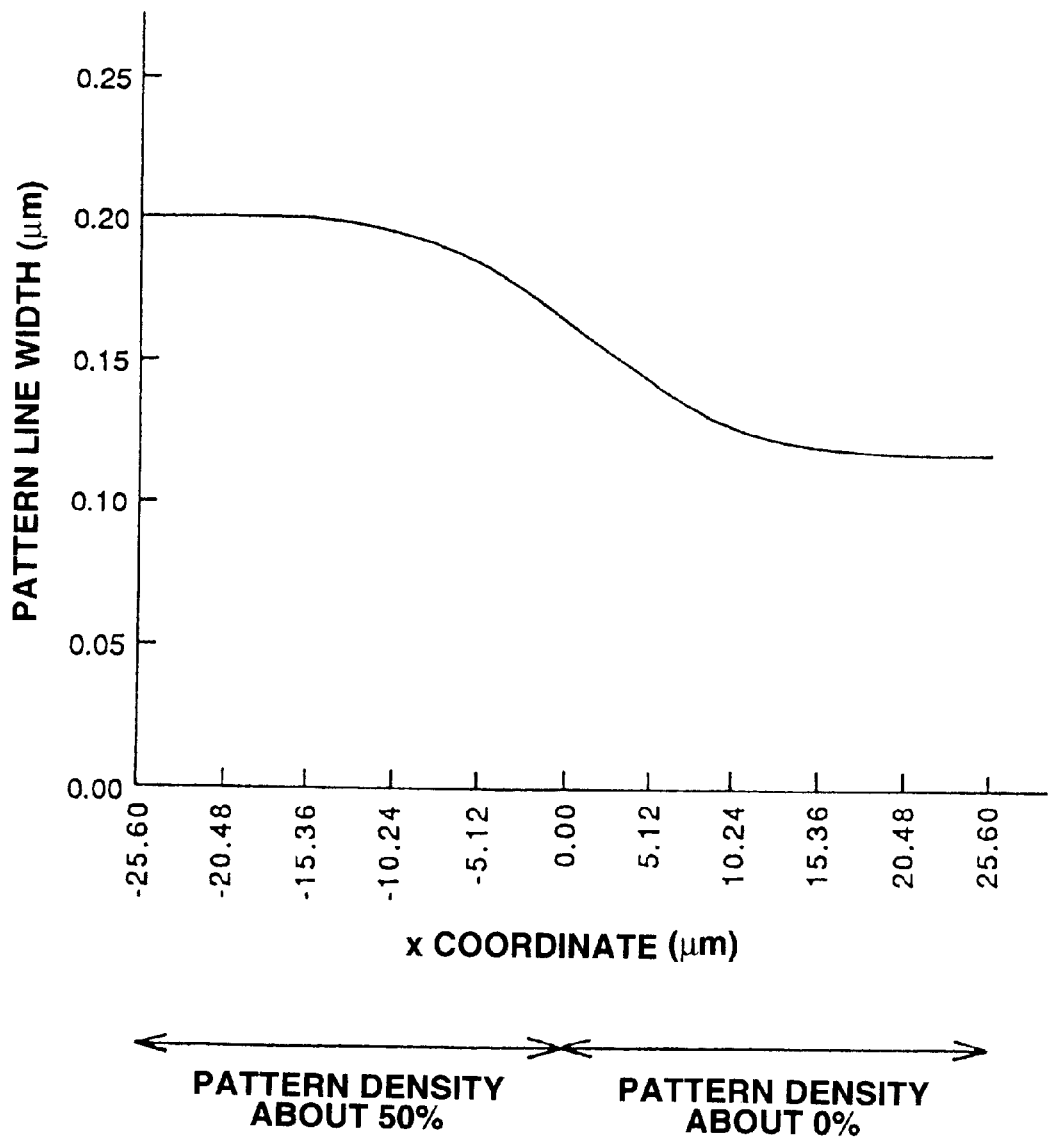
FIG. 32 shows a pattern line width transitions in a model pattern of FIG. 31 in case the proximity effect correction is not performed in the conventional areal density mapping method.
Figure 33:
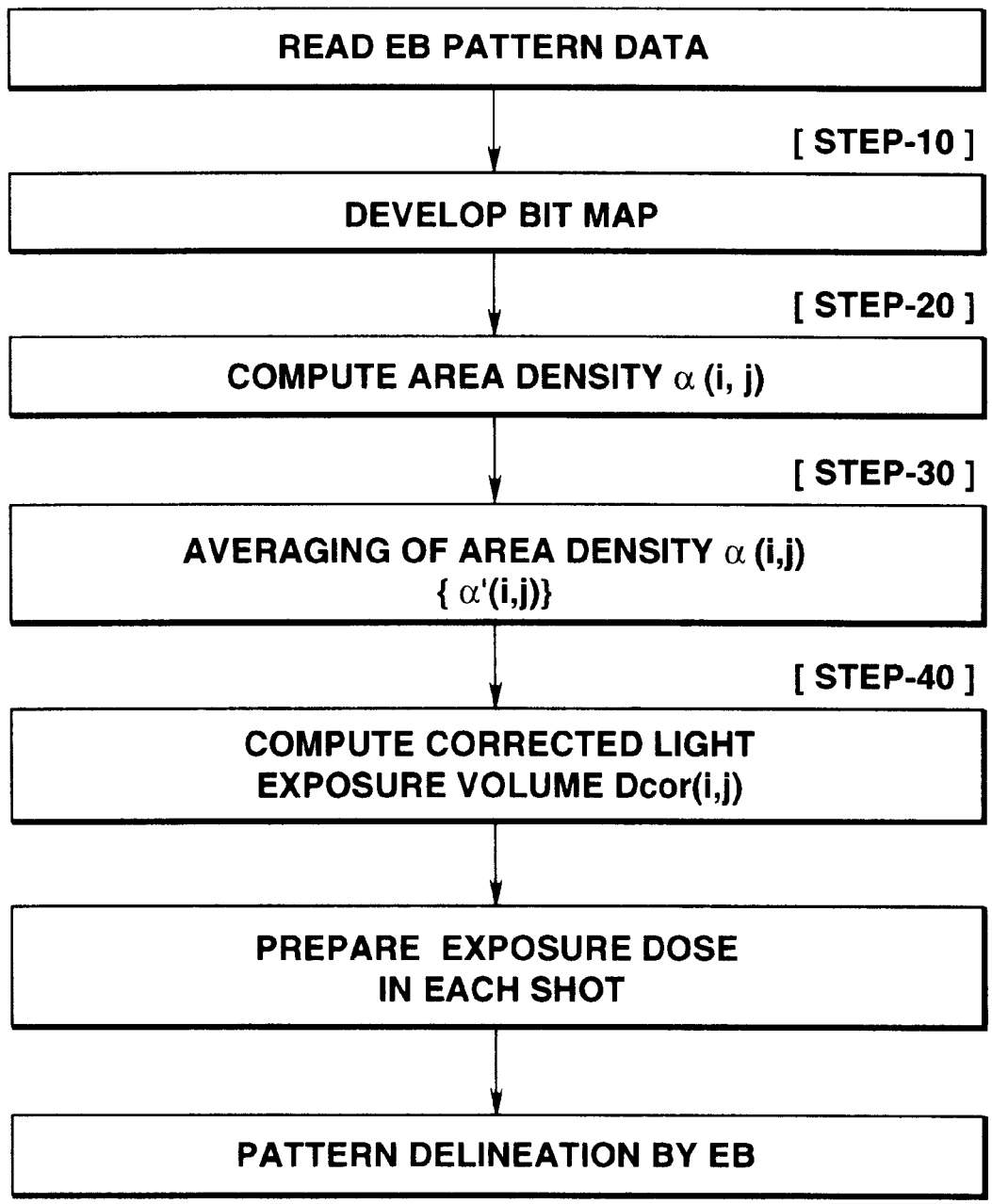
FIG. 33 shows the flow of calculations in the conventional areal density mapping method.
Figure 34:
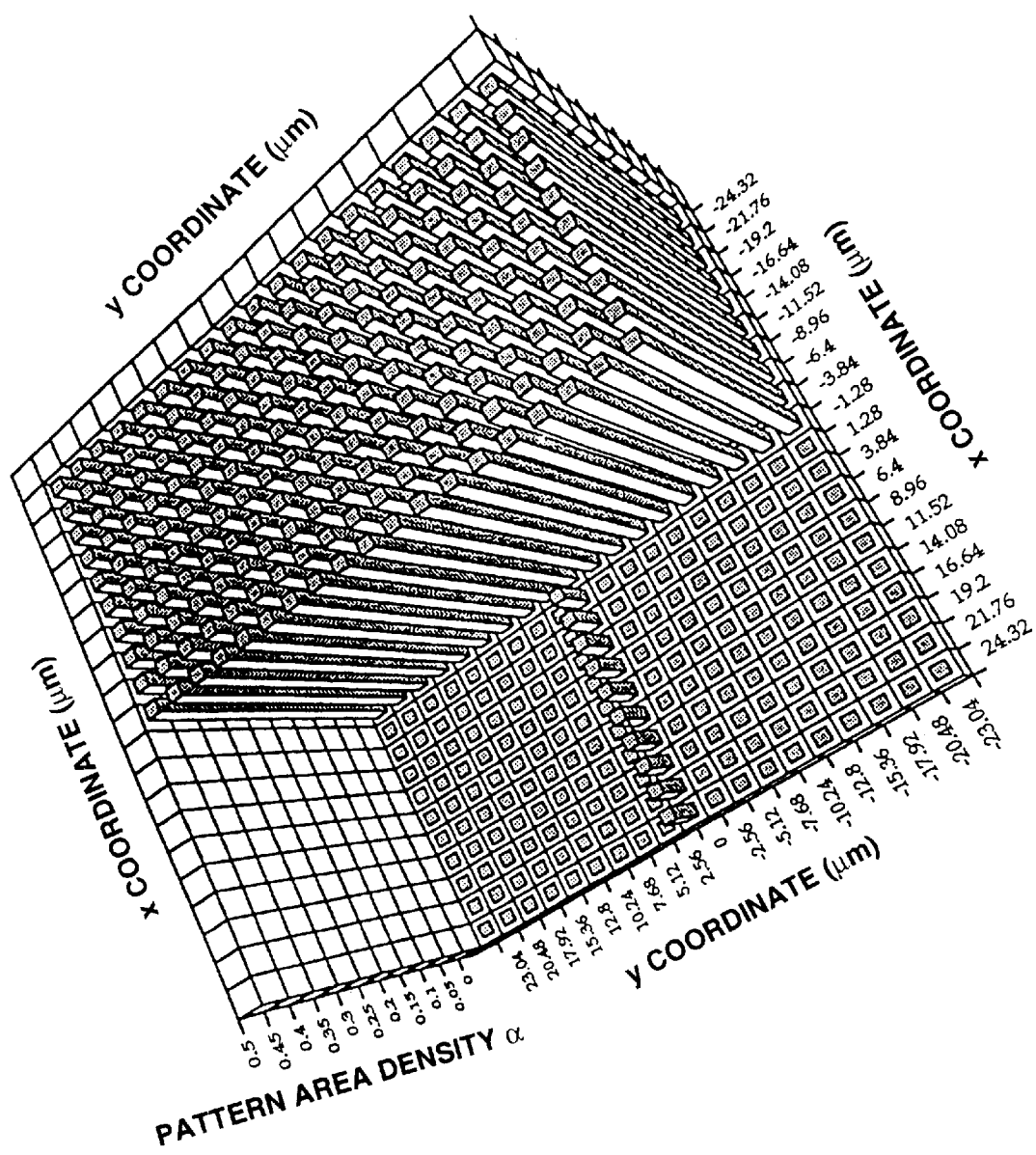
FIG. 34 shows the pattern areal density $\alpha(i, j)$ obtained with the conventional areal density mapping method.
Figure 35:
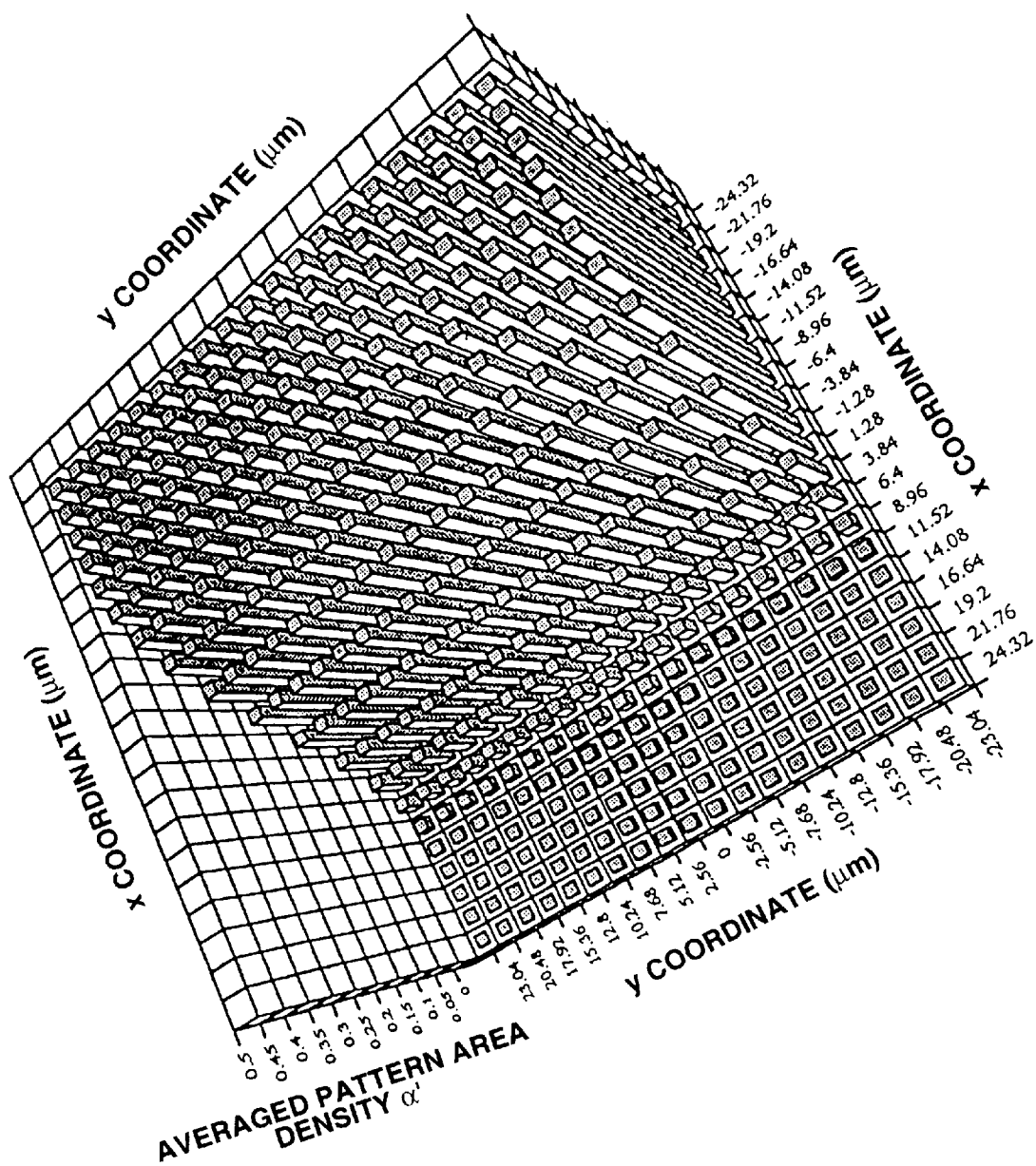
FIG. 35 shows the averaged pattern areal density $\alpha'(i, j)$ obtained with the conventional areal density mapping method.
Figure 36:
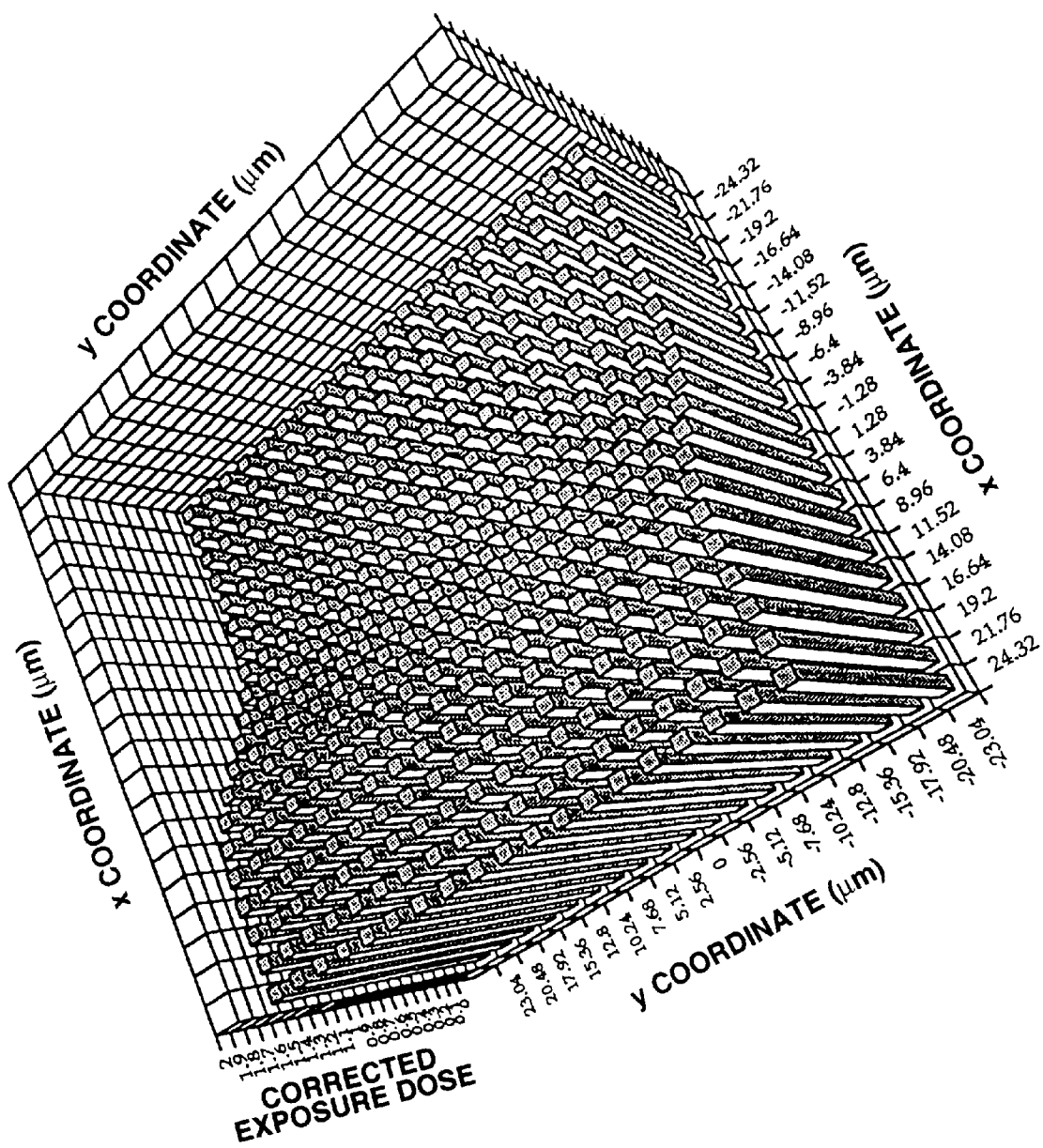
FIG. 36 shows the results of calculations of the corrected exposure dose $D_{cor}(i, j)$ in each unitary domain based on the averaged pattern areal density $\alpha'(i, j)$ in the conventional areal density mapping method.

The high-precision correction effect may be realized as a whole by performing high-precision proximity effect correction on the extracted unitary domain using a vector gradient of the averaged pattern areal density. FIG. 25 shows, in connection with the pattern shown in FIG. 2, fine line patterns in a unitary domain in the absence of the proximity effect correction, by the conventional areal density mapping method, by the high-precision correction with a unitary domain as a unit, and by the high precision correction with figure division, respectively. In FIG. 25, A, B, C and D show fine line patterns in a unitary domain in the absence of the proximity effect correction, by the conventional areal density mapping method, by the high-precision correction with a unitary domain as a unit, and by the high precision correction with figure division, respectively. As may be seen from FIG. 25, extremely high proximity effect correction is achieved by high-precision correction with figure division even in the boundary area with the pattern density 100% to pattern density 0% boundary region where utmost difficulties in proximity effect correction are encountered.

Although the present invention has been described in connection with preferred embodiments thereof, the present invention is not limited to there merely illustrative embodiments. The various conditions and figures employed in the preferred embodiments are merely illustrative and may be modified in any desired manner.

INDUSTRIAL APPLICABILITY

With the use of the proximity effect correction method according to the present invention in the delineation method employing an electron ray beam and with the use of a high acceleration voltage of 50 kV or higher, the proximity effect in the direct delineation by an electron ray on the ultra-LSI of a 1 $\mu$m rule, as a target, can be corrected speedily and with high precision. Since large-scale calculations for optimization, such as matrix calculations, are not executed, the proximity effect can be corrected with a significantly smaller processing volume, while the high precision comparable to that of the conventional sequential calculation method by the representative point evaluation can be achieved. In addition, since the area the exposure dose for which should be corrected to higher precision is automatically extracted to perform optimum pattern division, high-precision exposure dose correction can be achieved not only for the regular pattern such as that in a memory cell array, but also for a large-scale delineation pattern by a logic type device having a random pattern, such as ASIC. Therefore, the present invention enables trial production or industrial production of practically useful ultra-LSIs by direct delineation by an electron beam.

I claim:
1. In a technique of electron beam lithography including irradiating an electron sensitive resist material in a substrate with an electron beam for delineating a pattern on said resist material, said technique having a proximity effect associated therewith, a method for correcting the proximity effect by dividing the pattern into a plurality of pre-set unitary domains, each unitary domain receiving an exposure dose from said electron beam, and correcting the exposure dose of said electron beam for each unitary domain dependent on an accumulated energy ascribable to backward scattering of electrons from said electron beam, comprising:

(A) bit-map-developing each unitary domain and calculating a pattern areal density in each unitary domain;

(B) averaging the pattern areal density in each unitary domain and calculating an averaged pattern areal density;

(C) calculating, in each unitary domain, the accumulated energy ascribable to said backward scattering based on an EID function and said averaged pattern areal density;

(D) finding, for each unitary domain, a difference between the accumulated energy calculated in said step (C) and the averaged pattern areal density obtained in step (B);

(E) if a sum of squared values of the respective differences in said unitary domains, as found at step (D), is not less than a prescribed value, (E1) correcting the pattern areal density and calculating the accumulated energy based on the corrected pattern areal density;

(E2) calculating the accumulated energy ascribable to the backward scattering based on the EID function and the corrected pattern areal density;

(E3) finding, in each unitary domain, a difference between the accumulated energy calculated at the step (E2) and the accumulated energy found in step (E1);

(E4) repeating steps (E1) to (E3) if a sum of squared values of the respective differences in the unitary domain found in step (E3) is not less than said prescribed value; and (F) correcting the exposure dose of the electron beam in each unitary domain based on the corrected pattern areal density obtained by a last reception of the step (E1).

2. The proximity effect correcting method as claimed in claim 1 comprising, following step (B),
   (b1) calculating a gradient vector for each averaged pattern area density, and
   (b2) extracting a unitary domain for which the calculated gradient vector is larger in magnitude than a pre-set gradient vector value for identifying a unitary domain with large proximity effect correction error; and
   conducting steps (C) and (F) for the unitary domain with said large proximity effect correction error determined in step (b2).

3. In a technique of electron beam lithography including irradiating an electron sensitive resist material in a substrate with an electron beam for delineating a pattern on said resist material, said technique having a proximity effect associated therewith, a method for correcting the proximity effect by dividing the pattern into a plurality of pre-set unitary domains, each unitary domain receiving an exposure dose from said electron beam, and correcting the exposure dose of said electron beam for each unitary domain dependent on an accumulated energy ascribable to backward scattering of electrons from said electron beam, comprising:
   (A) bit-map-developing each unitary domain and calculating a pattern areal density in each unitary domain;
   (B) averaging the pattern areal density in each unitary domain and calculating an averaged pattern area density;
   (C) for each averaged pattern areal density, calculating a gradient vector having a magnitude and a plurality of components in respectively different directions;
   (D) extracting a unitary domain where the magnitude of the gradient vector is more than a pre-set value for identifying a unitary domain exhibiting a high proximity effect correction error;
   (E) dividing a pattern in the unitary domain extracted in step (D) along the directions of components of its gradient vector for obtaining divided patterns; and
   (F) correcting the exposure dose of the electron beam for each of said divided patterns dependent on the accumulated energy ascribable to said backward scattering of electrons.

4. The proximity effect correction method as claimed in claim 3 further comprising, following step (B);
   (a) calculating, in each unitary domain, the accumulated energy ascribable to said backward scattering based on an EID function and the averaged pattern areal density obtained in step (B);
   (b) finding, in each unitary domain a difference between the accumulated energy calculated in step (a) and the accumulated energy calculated based on the averaged pattern areal density obtained in step (B);
   (c) of a sum of squared values of the respective differences in said unitary domains found in step (b) is not less than a prescribed value,
      (c1) correcting the pattern areal density and calculating the accumulated energy based on the corrected pattern areal density;
      (c2) calculating the accumulated energy ascribable to the backward scattering based on the EID function and the corrected pattern areal density;
      (c3) finding, in each unitary domain, a difference between the accumulated energy calculated in step (c2) and the accumulated energy found in step (c1);
      (c4) repeating steps (c1) and (c3) if a sum of squared values of the respective differences in said unitary domains found in (c3) is not less than said prescribed value; and
   (d) correcting the exposure dose of the electron beam in each unitary domain based on the corrected pattern areal density obtained by a last repetition of step (c1).

5. The proximity effect correcting method as claimed in claim 4 wherein said gradient vector has directions defined by an x-axis and a y-axis and wherein the gradient vector obtained by the final repetition of the step (c1) has a magnitude along the x-axis of $|\Delta_v a_x''|$ and a magnitude along the y-axis $|\Delta_v a_y''|$, and wherein said divided pattern has a magnitude Lx along the x-axis satisfying $$Lx \geq \Delta L_{tol}(1\ \&\ \eta)/(\eta \cdot \Delta L \cdot |\Delta_v a_x''|)$$

and a magnitude Ly along the y-axis satisfying $$Ly \geq \Delta L_{tol}(1\ \&\ \eta)/(\eta \cdot \Delta L \cdot |\Delta_v a_y''|),$$

wherein $\Delta L$ is a line width variation ratio in a unitary domain, $\Delta L_{tol}$ is a tolerance for said line width variation in said unitary domain, and $\eta$ is a backward scattering coefficient for said backward scattered electrons.

6. The proximity effect correction method as claimed in claim 5 wherein the correction of the electron beam with respect to the divided pattern in step (F) is calculated based on
   (f1) an accumulated energy, ascribable to the backward scattering, at a pre-set position in the unitary domain extracted in step (D);
   (f2) a standard exposure dose affording a target dimension of a pattern for delineation at a pre-set pattern;
   (f3) a backward scattering coefficient; and
   (f4) a product of a distance from said pre-set position in the unitary domain extracted in step (D) to the pre-set position of the divided pattern and the magnitude of the gradient vector of the pattern areal density obtained based on the corrected pattern areal density obtained by the last repetition of the step (c1).

7. The proximity effect correction method as claimed in claim 6 wherein, using the center (i, j) of the unitary domain extracted in step (D) as a coordinate origin, with the pre-set position as an areal center of gravity (X_g, Y_g) and with the pre-set position of the divided pattern at said step (F) as the center of said divided pattern ($x_{div\_c}$, $y_{div\_c}$), a correction value $Ddiv\_{cor}(x_{div\_c}, y_{div\_c})$ of the exposure dose of the electron ray beam with respect to the divided pattern is calculated by $$Ddiv\_{cor}(x_{div\_c}, y_{div\_c}) = Ds[(1 + \eta) -$$
$$2\eta\{(|\Delta_v a_{x\_i,j}''| \cdot (x_{div\_c} - X_{\_g}) +$$
$$|\Delta_v a_{y\_i,j}''| \cdot (y_{div\_c} - Y_{\_g})\}] -$$
$$2(1 + \eta)Eb_{\_g}(i, j)$$

where $\eta$ is the backward scattering coefficient of said electrons;

$|\Delta_v a_{x\_i, j}''|$ is the magnitude of an x-axis component of a gradient vector of a pattern areal density obtained based on the corrected pattern areal density obtained by last repetition of the step (c1) in the unitary domain (i, j) extracted by step (D);

$|\Delta_y \alpha_{y\_i,j}"|$ is the magnitude of an y-axis component of a gradient vector of a pattern areal density obtained based on the corrected pattern areal density obtained by last repetition of the step (c1) in the unitary domain (i, j) extracted by step (D);

$D_s$ is a standard exposure dose affording a target size of a pattern for delineation in a pre-set pattern density; and Eb—g(i, j) is an accumulated energy ascribable to backward scattering at an areal center of gravity (X_g, Y_g) of a pattern in a unitary domain extracted by said step (D).

* * * * *